US012707721B2

(12) United States Patent
Li

(10) Patent No.: US 12,707,721 B2
(45) Date of Patent: Aug. 11, 2026

(54) DISPLAY PANEL AND DISPLAY DEVICE

(71) Applicant: Wuhan Tianma Microelectronics Co., Ltd., Wuhan (CN)

(72) Inventor: Fei Li, Wuhan (CN)

(73) Assignee: Wuhan Tianma Microelectronics Co., Ltd., Wuhan (CN)

( * ) Notice: Subject to any disclaimer, the term of this patent is extended or adjusted under 35 U.S.C. 154(b) by 381 days.

(21) Appl. No.: 18/420,174

(22) Filed: Jan. 23, 2024

(65) Prior Publication Data

US 2024/0204007 A1 Jun. 20, 2024

(30) Foreign Application Priority Data

Aug. 31, 2023 (CN) ......................... 202311125761.5

(51) Int. Cl.

| | |
|---|---|
| ***H10D 86/60*** | (2025.01) |
| ***G09G 3/20*** | (2006.01) |
| ***G09G 3/32*** | (2016.01) |
| ***H10D 86/40*** | (2025.01) |

(Continued)

(52) U.S. Cl.

CPC ........... *H10D 86/60* (2025.01); *H10D 86/441* (2025.01)

(58) Field of Classification Search

CPC .... H10D 86/60; H10D 86/441; H10D 86/021; H10D 86/411; H10D 86/421; H10D 86/80; H10H 20/036; H10H 20/0364; H10H 20/80; H10H 20/813; H10H 29/30; H10H 29/32; H10H 29/34; H10H 29/352; H10H 29/362; H10H 29/37; H10H 29/39; H10H 29/41; H10H 29/45; H10H 29/49; G09G 3/32; G09G 3/3233; G09G 3/2003; G09G 3/006; G09G 2300/0452; G09G 2300/0861; G09G 2300/0842; G09G 2300/0426; G09G 2300/0819; G09G 2300/0852; H10K 59/1213; H10K 59/121; H10K 59/127;

(Continued)

(56) References Cited

U.S. PATENT DOCUMENTS

| | | | | |
|---|---|---|---|---|
| 10,923,549 | B2 * | 2/2021 | Lee | G09G 3/3258 |
| 2021/0167161 | A1 * | 6/2021 | Yang | G09G 3/3275 |
| 2022/0037439 | A1 * | 2/2022 | Lee | H10K 59/1213 |

(Continued)

FOREIGN PATENT DOCUMENTS

| | | | |
|---|---|---|---|
| CN | 113196498 | A | 7/2021 |
| CN | 115377118 | A | 11/2022 |
| CN | 116322183 | A | 6/2023 |

*Primary Examiner* — Omar F Mojaddedi

(74) *Attorney, Agent, or Firm* — KDW Firm PLLC

(57) ABSTRACT

A pixel driving circuit of the display panel includes a driving transistor and a data writing transistor. Signal lines include multiple data signal lines. The data writing transistor is coupled between a data signal line and a gate of the driving transistor. The signal lines also include multiple power signal lines. A power signal line includes a body portion and a connection portion. The connecting portion connects two adjacent body portions. The display panel also includes a substrate and a light-emitting element. The light-emitting element includes a first light-emitting element. The first light-emitting element includes a first anode. In a direction perpendicular to the plane in which the substrate is located, the first anode at least partially overlaps the data signal line, and the first anode at least partially overlaps the body portion.

32 Claims, 32 Drawing Sheets

(51) Int. Cl.
*H10K 59/12* (2023.01)
*H10K 59/13* (2023.01)

(58) Field of Classification Search
CPC ...... H10K 59/00; H10K 59/131; H10K 59/65; H10K 59/126
See application file for complete search history.

(56) References Cited

U.S. PATENT DOCUMENTS

| | | | | |
|---|---|---|---|---|
| 2022/0180810 | A1* | 6/2022 | Zhang .................. | G09G 3/3241 |
| 2023/0306904 | A1* | 9/2023 | Huang ................. | H10K 59/126 |
| 2024/0046828 | A1* | 2/2024 | Oh ....................... | G09G 3/2003 |

* cited by examiner

M4

M4

DISPLAY PANEL AND DISPLAY DEVICE

CROSS-REFERENCE TO RELATED APPLICATION

This application claims priority to Chinese Patent Application No. 202311125761.5, filed on Aug. 31, 2023, the disclosure of which is incorporated herein by reference in its entirety.

TECHNICAL FIELD

The present application relates to the field of display technology, in particular, a display panel and a display device.

BACKGROUND

With the continuous development of display technology, display panels have been widely used in people's production and life. However, the display panels in the related art still have some technical problems that need to be solved. For example, signals in some signal lines interfere with the electrodes of the light-emitting elements due to the small distance to the electrodes of the light-emitting elements, thus affecting the display effect of the display panels.

SUMMARY

Embodiments of the present application provide a display panel and a display device. In the display panel, a first anode and a data signal line at least partially overlap, and the first anode and a body portion of a power signal line at least partially overlap so that the power signal line can prevent signal interference from the anode and the data signal line from affecting the display effect of the display panel.

In a first aspect, a display panel provided by an embodiment of the present application includes a plurality of pixel driving circuits and a plurality of signal lines.

The pixel driving circuit of the plurality of pixel driving circuits includes a driving transistor and a data writing transistor. The plurality of signal lines include multiple data signal lines extending in a first direction and arranged in a second direction. The data writing transistor is coupled between a data signal line and a gate of the driving transistor. The first direction and the second direction intersect.

The plurality of signal lines also include multiple power signal lines. A power signal line includes a body portion and a connection portion. The connection portion connects two adjacent body portions. In an arrangement direction of the multiple power signal lines, the width of the body portion is greater than the width of the connection portion.

The display panel also includes a substrate and a plurality of light-emitting elements. A light-emitting element the plurality of light-emitting elements includes a first light-emitting element. The first light-emitting element includes a first anode. In a direction perpendicular to the plane in which the substrate is located, the first anode at least partially overlaps the data signal line, and the first anode at least partially overlaps the body portion.

In a second aspect, a display device provided by an embodiment of the present application includes the display panel described in the first aspect.

BRIEF DESCRIPTION OF DRAWINGS

To illustrate technical solutions in embodiments of the present application more clearly, drawings used in the description of the embodiments are briefly described below. Apparently, the drawings described below illustrate some embodiments of the present application, and those of ordinary skill in the art may acquire other drawings based on the drawings described below on the premise that no creative work is done.

DETAILED DESCRIPTION

The solutions in embodiments of the present application are described clearly and completely in conjunction with drawings in the embodiments of the present application from which the solutions are better understood by those skilled in the art. Apparently, the embodiments described below are part, not all, of the embodiments of the present application. Based on the embodiments described herein, all other embodiments acquired by those skilled in the art on the premise that no creative work is done are within the scope of the present application.

It is to be noted that terms such as “first” and “second” in the description, claims, and drawings of the present application are used to distinguish between similar objects and are not necessarily used to describe a particular order or sequence. It should be understood that the data used in this manner are interchangeable where appropriate so that the embodiments of the present application described herein may also be implemented in a sequence not illustrated or described herein. In addition, terms “include”, “have”, and any other variations thereof are intended to encompass a non-exclusive inclusion. For example, a system, product, or device that includes a series of units not only includes the expressly listed steps or units, but may also include other steps that are not expressly listed or are inherent to such a product or device.

Figure 1:
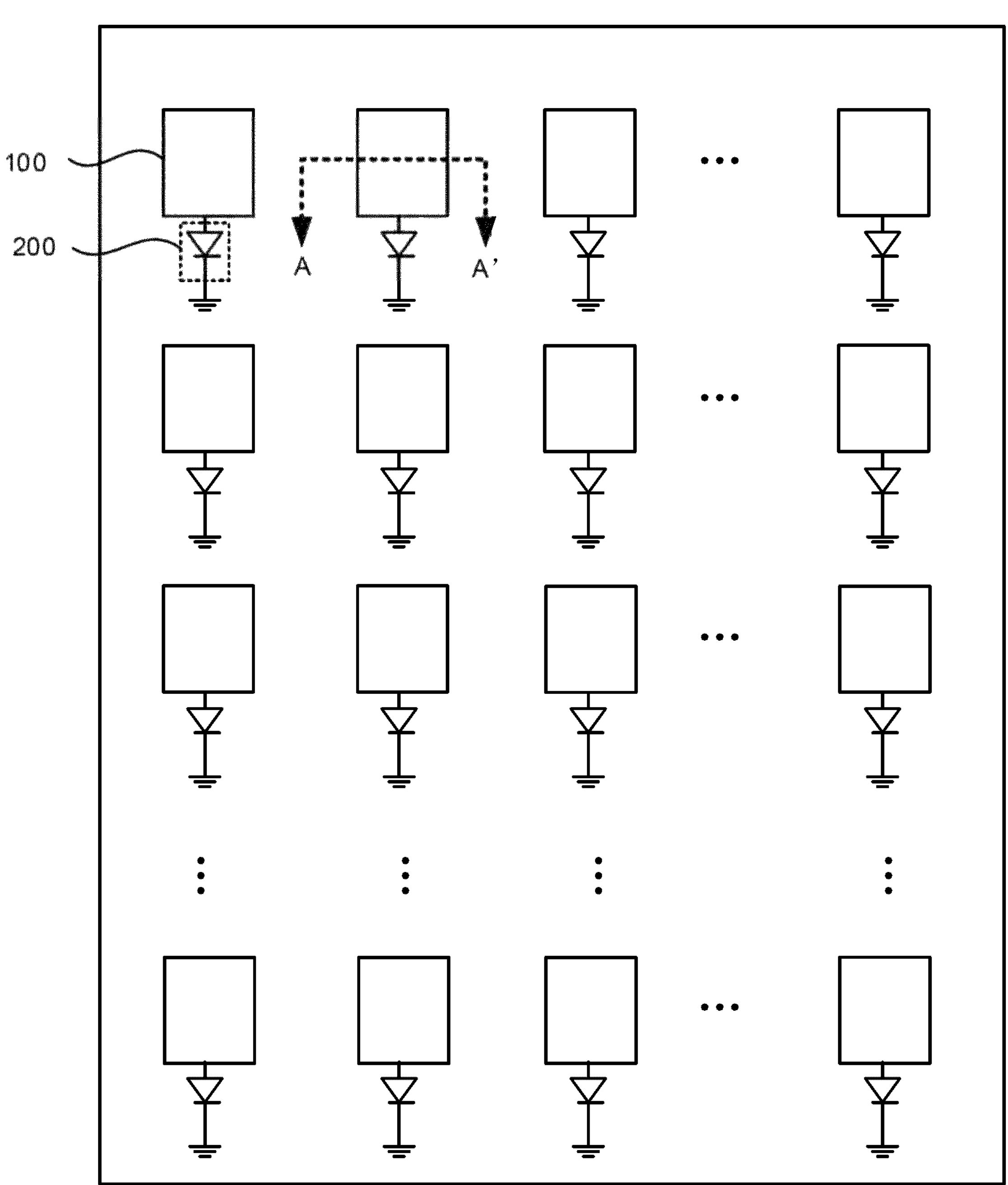
FIG. 1 is a diagram illustrating the structure of a display panel according to an embodiment of the present application.
Figure 2:
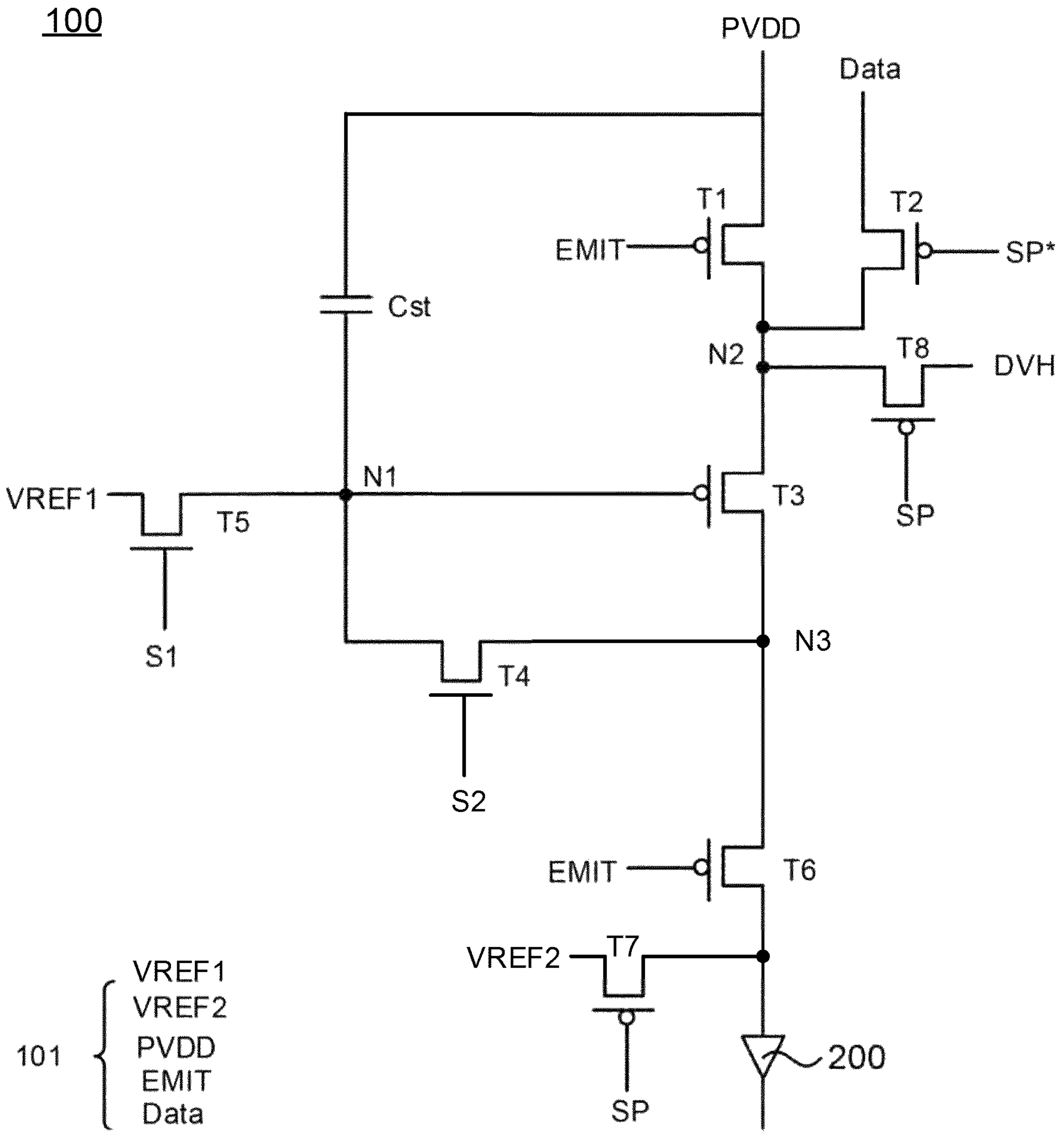
FIG. 2 is a schematic diagram of circuit elements of a pixel driving circuit according to an embodiment of the present application.
Figure 3:
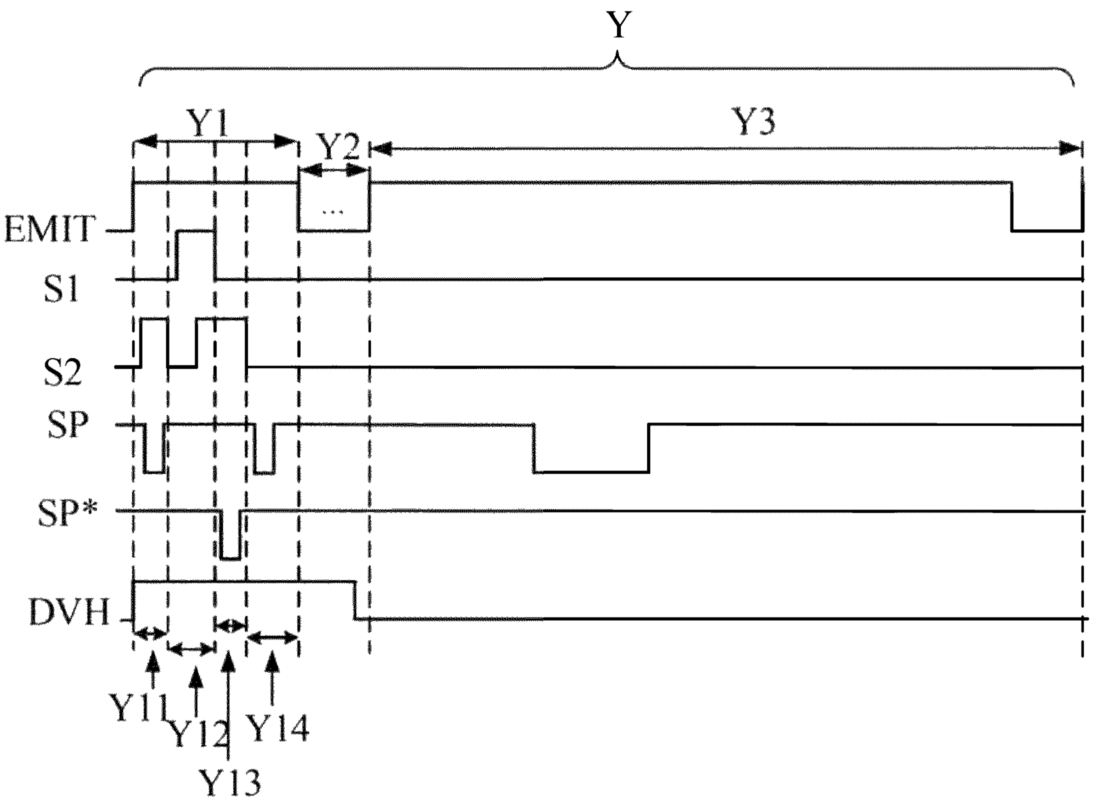
FIG. 3 is a timing diagram of an implementation of signals provided to the pixel driving circuit shown in FIG. 2 within one driving cycle according to an embodiment of the present application.
Figure 4:
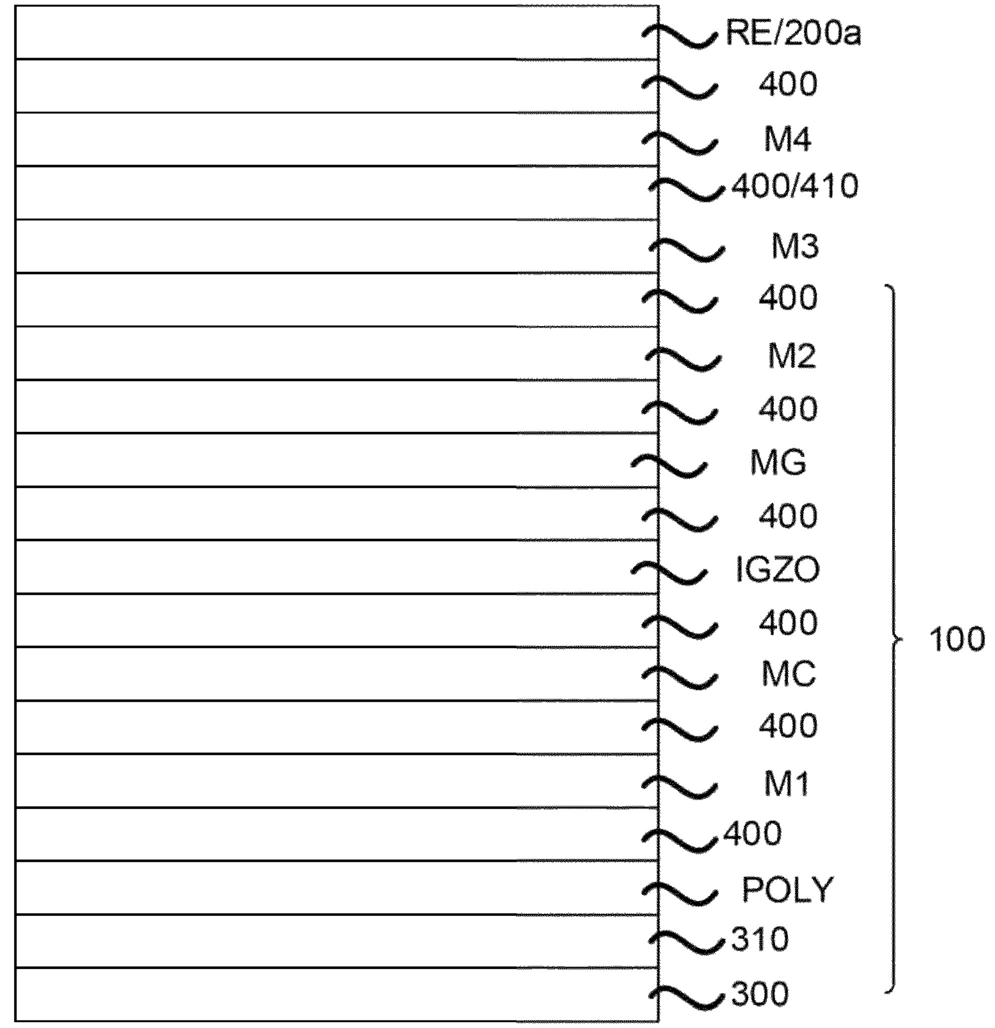
FIG. 4 is a sectional view taken along section line A-A' in FIG. 1.
Figure 5:
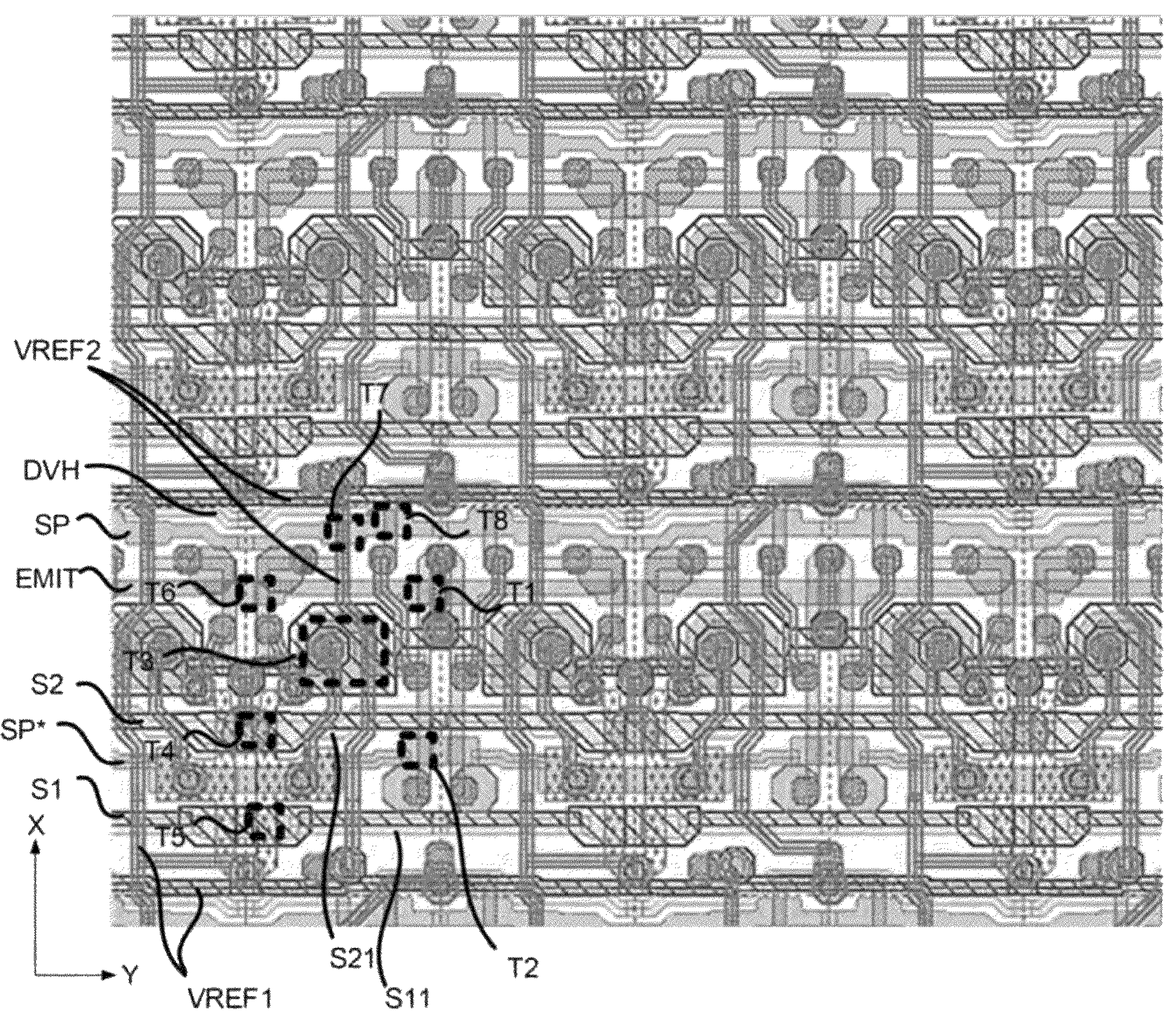
FIG. 5 is a diagram illustrating the structure of another display panel according to an embodiment of the present application.
Figure 6:
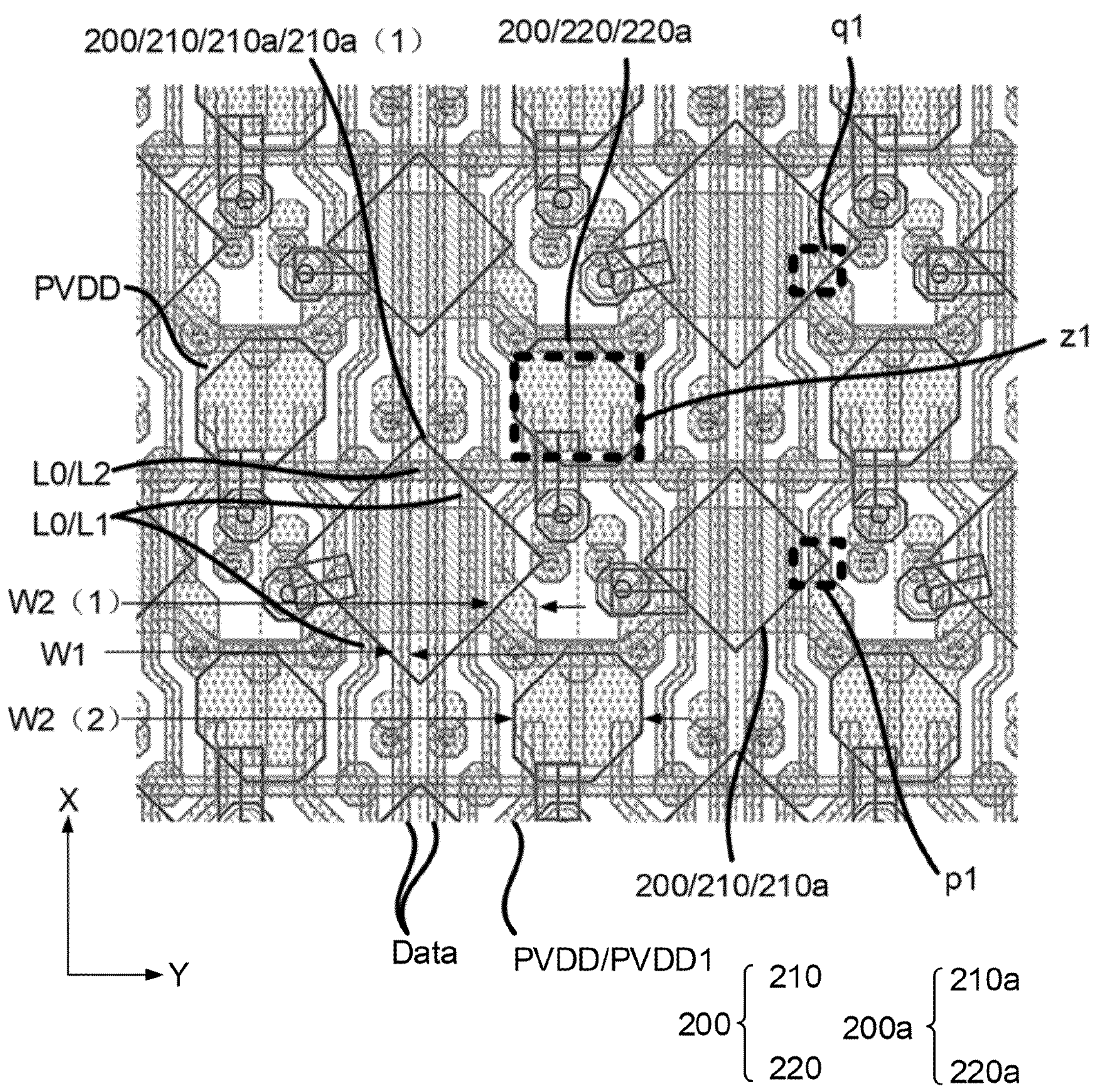
FIG. 6 is a diagram illustrating the structure of another display panel according to an embodiment of the present application.
Figure 7:
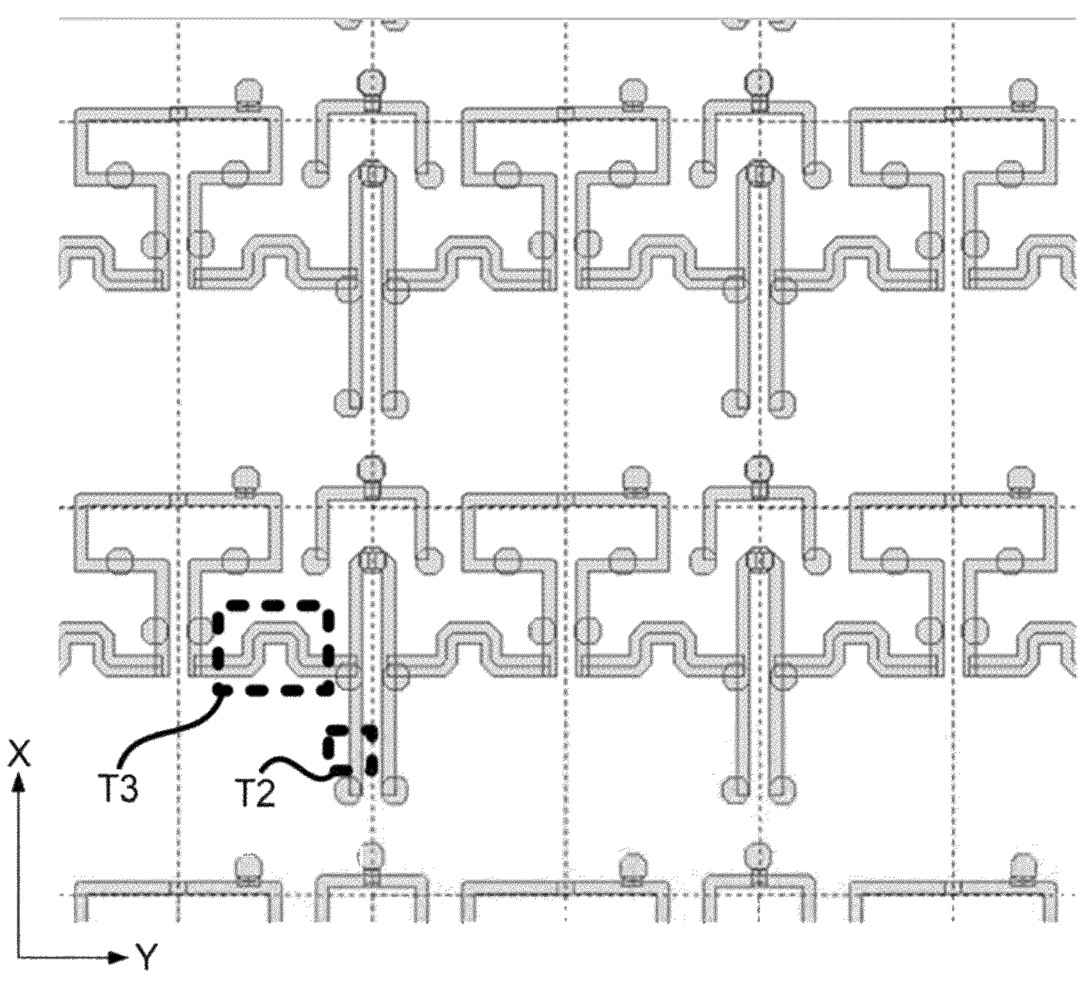
FIG. 7 is a schematic diagram illustrating a part of the structure of the display panel according to FIG. 5.
Figure 8:
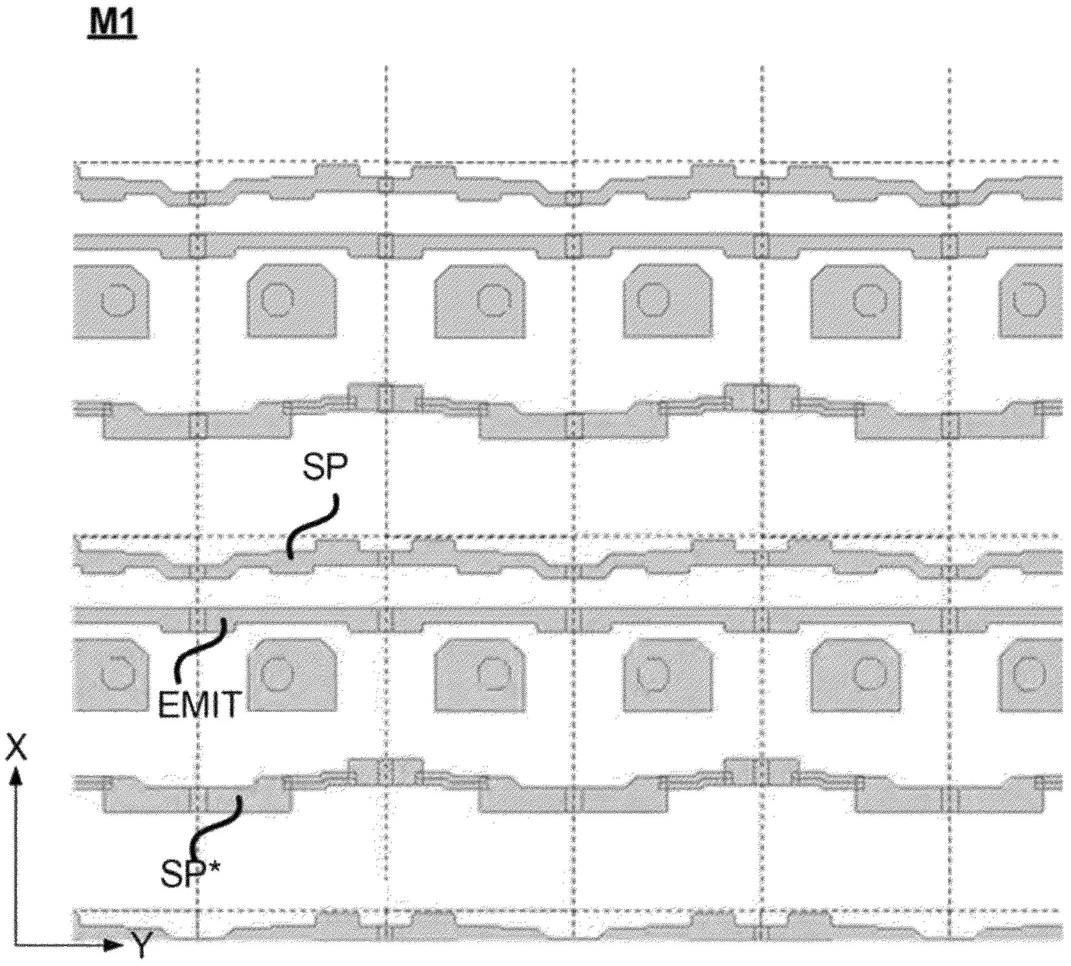
FIG. 8 is a schematic diagram illustrating a part of the structure of the another display panel according to FIG. 5.
Figure 9:
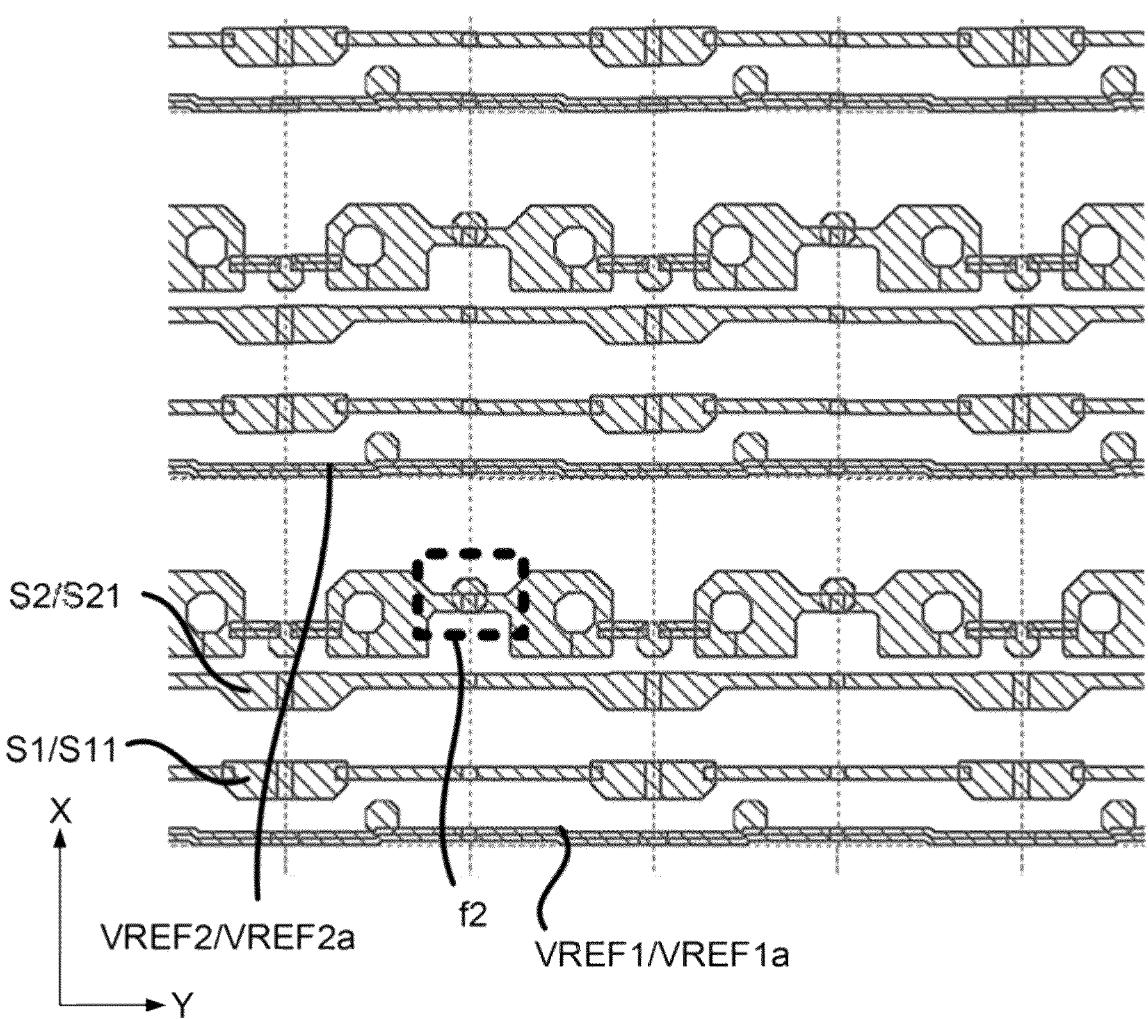
FIG. 9 is a schematic diagram illustrating a part of the structure of the another display panel according to FIG. 5.
Figure 10:
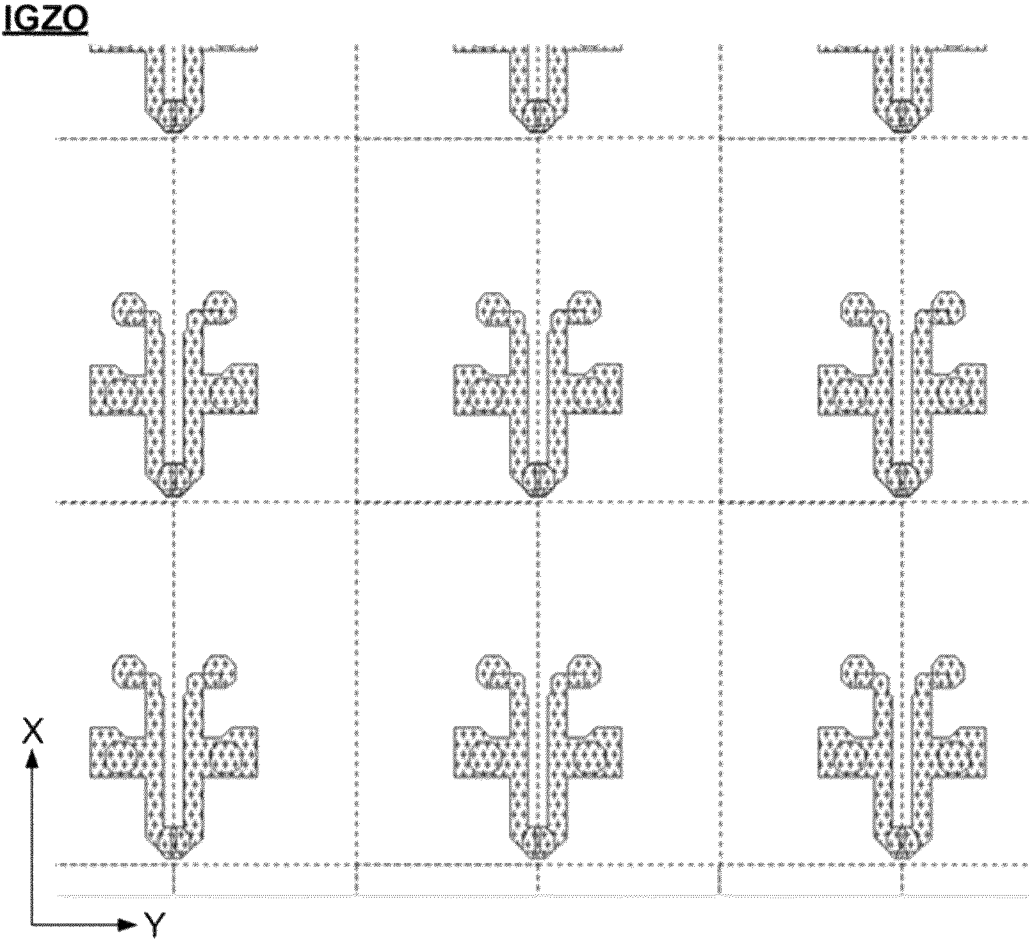
FIG. 10 is a schematic diagram illustrating a part of the structure of the another display panel according to FIG. 5.
Figure 11:
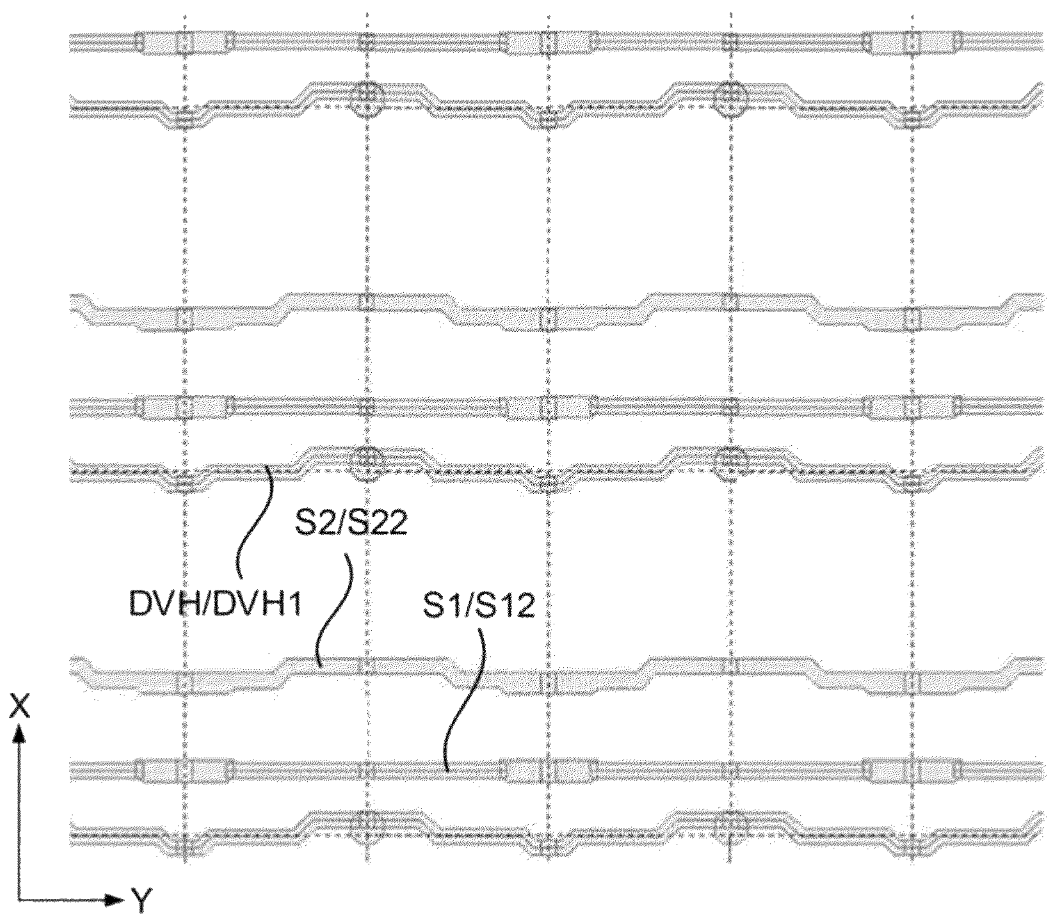
FIG. 11 is a schematic diagram illustrating a part of the structure of the another display panel according to FIG. 5.
Figure 12:
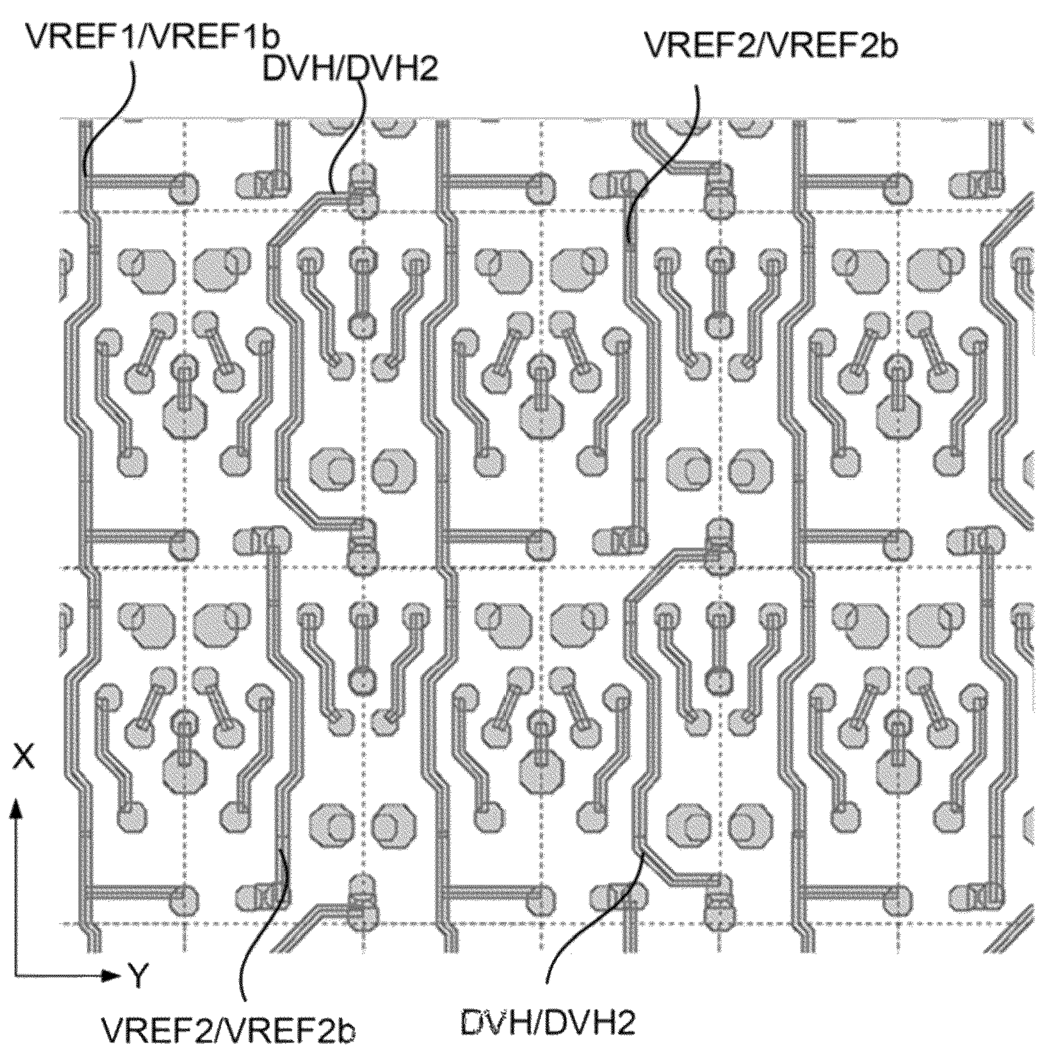
FIG. 12 is a schematic diagram illustrating a part of the structure of the another display panel according to FIG. 5.
Figure 13:
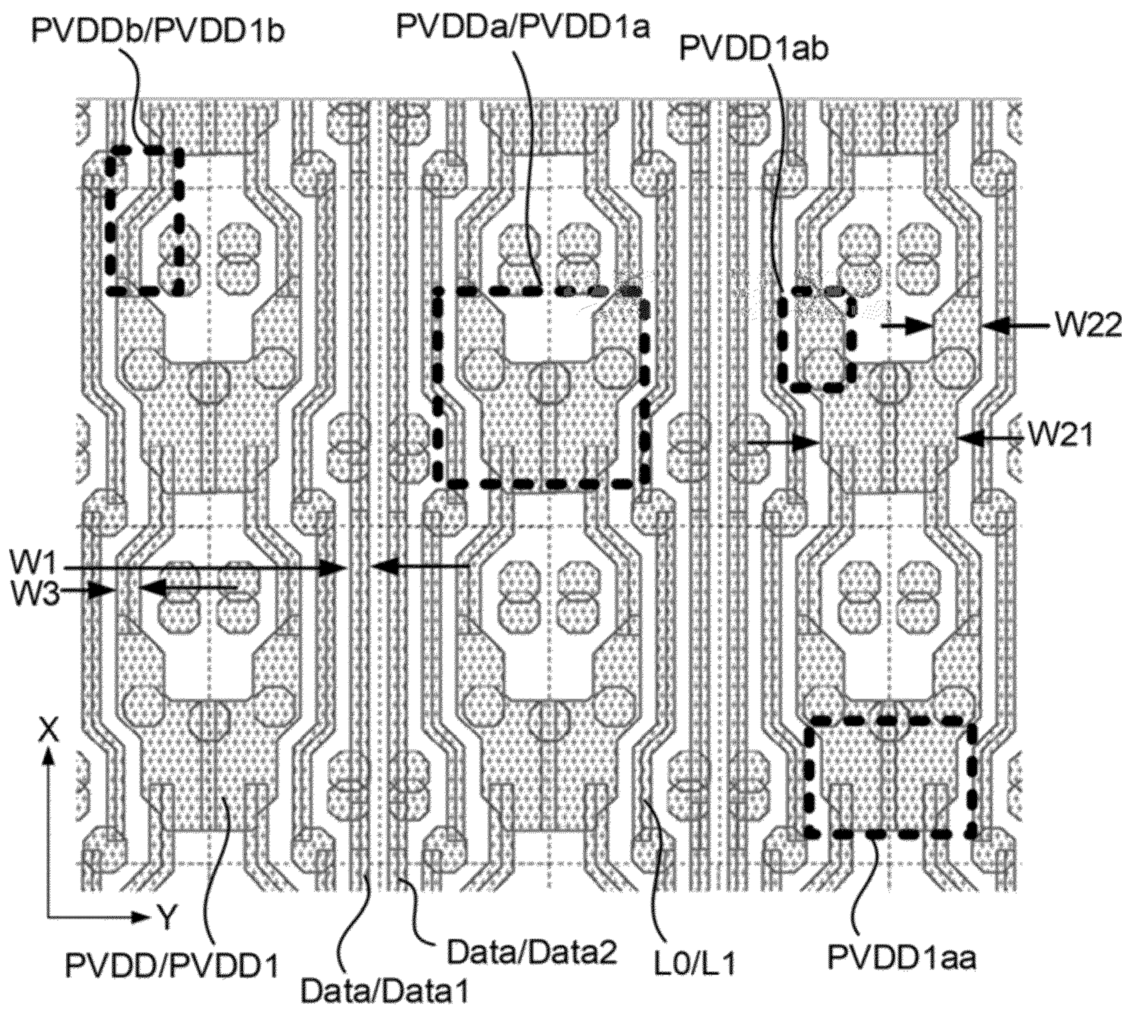
FIG. 13 is a schematic diagram illustrating a part of the structure of the display panel according to FIG. 6.
Figure 14:
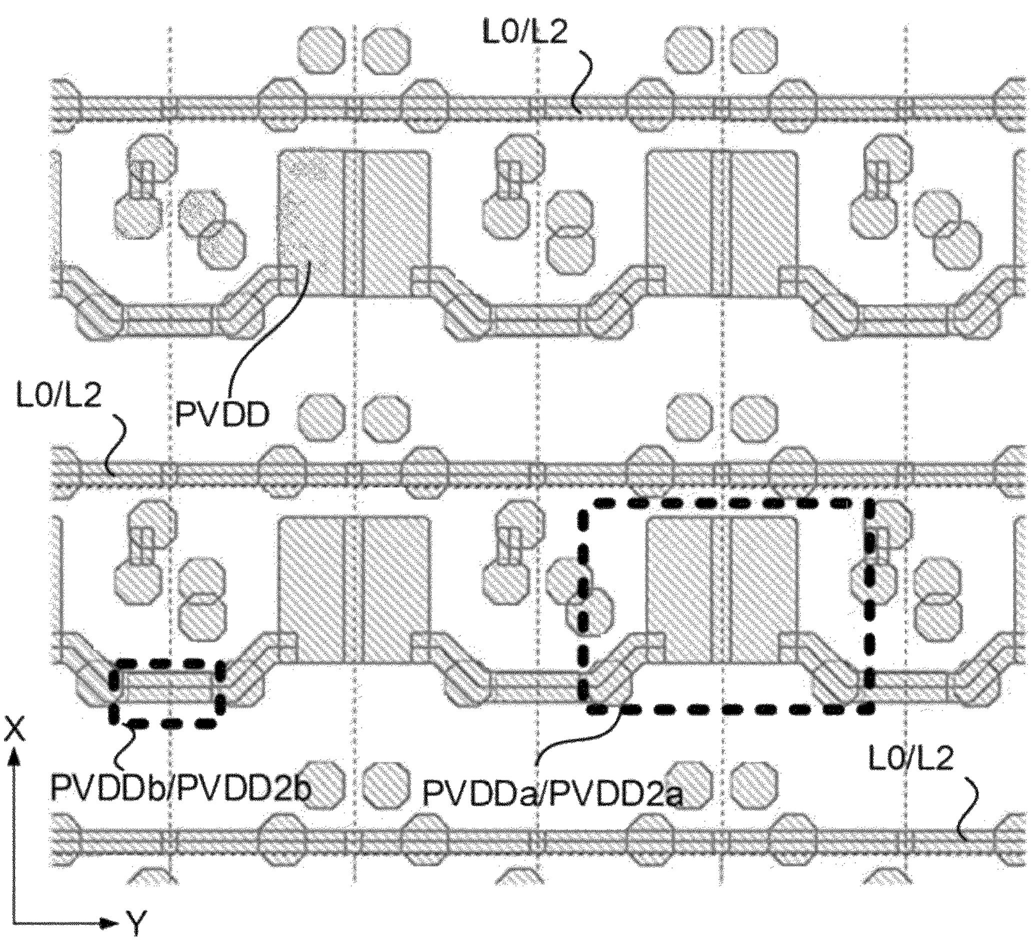
FIG. 14 is a schematic diagram illustrating a part of the structure of the another display panel according to FIG. 6.
Figure 15:
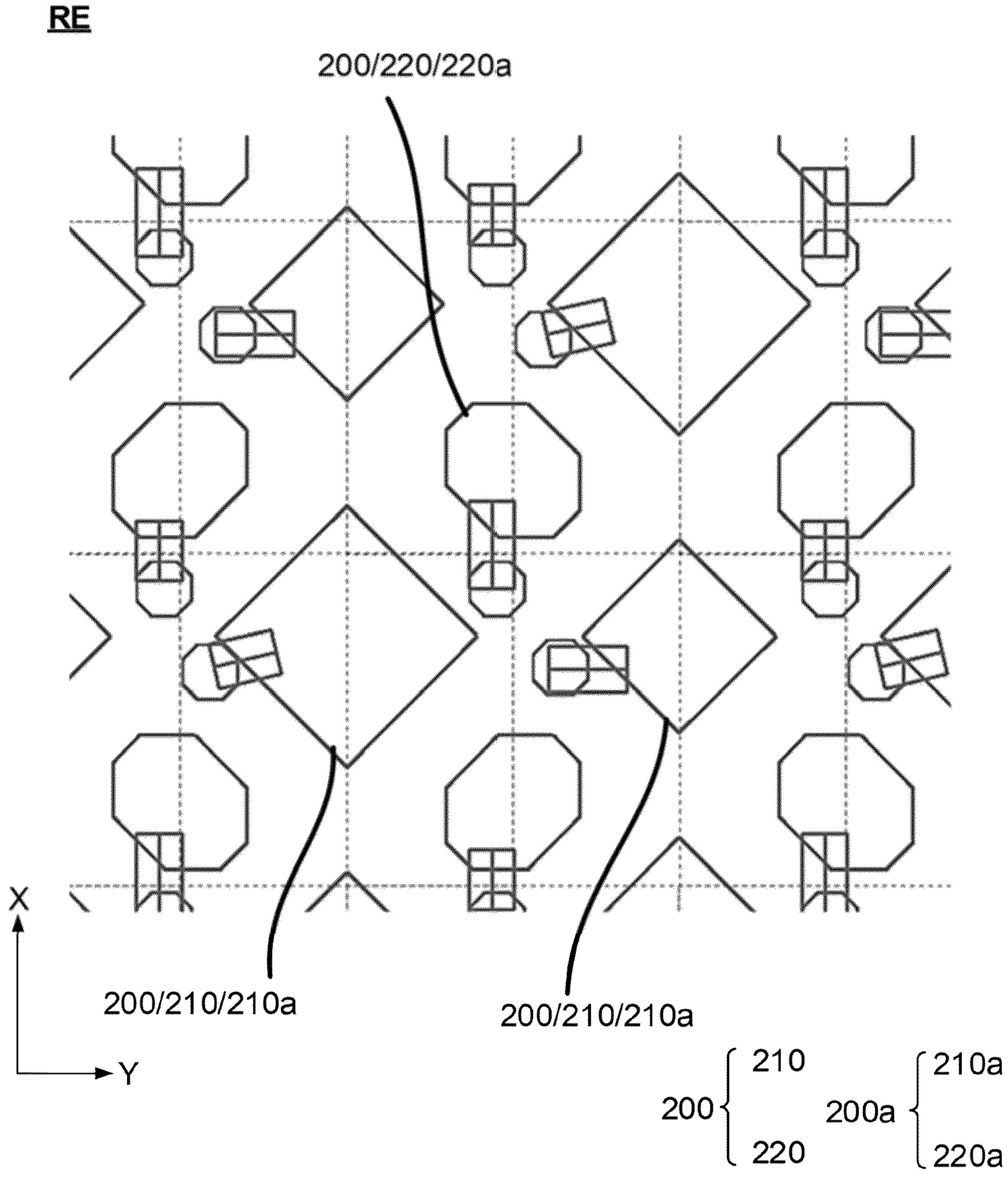
FIG. 15 is a schematic diagram illustrating a part of the structure of the another display panel according to FIG. 6.
Figure 16:
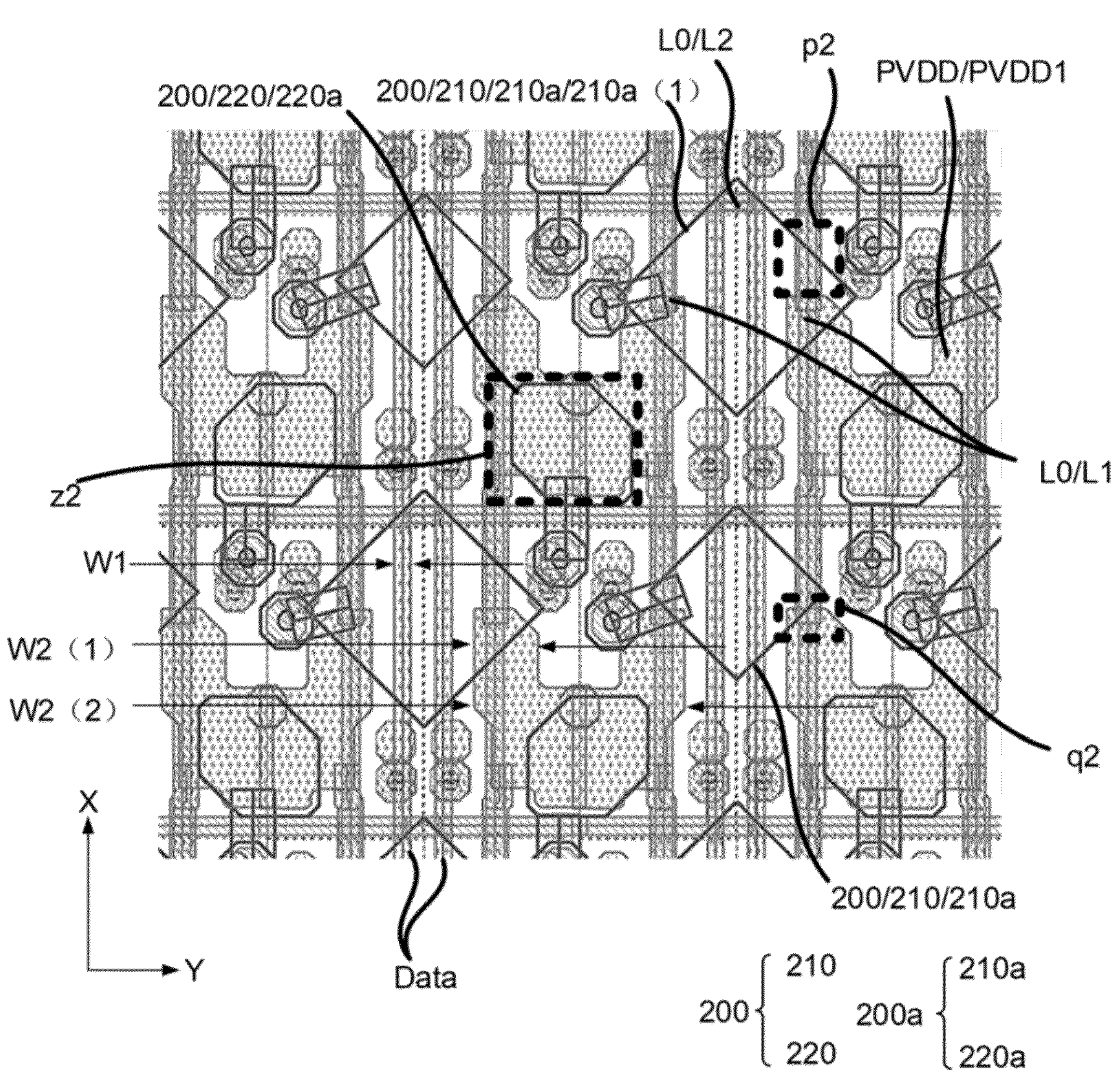
FIG. 16 is a diagram illustrating the structure of another display panel according to an embodiment of the present application.
Figure 17:
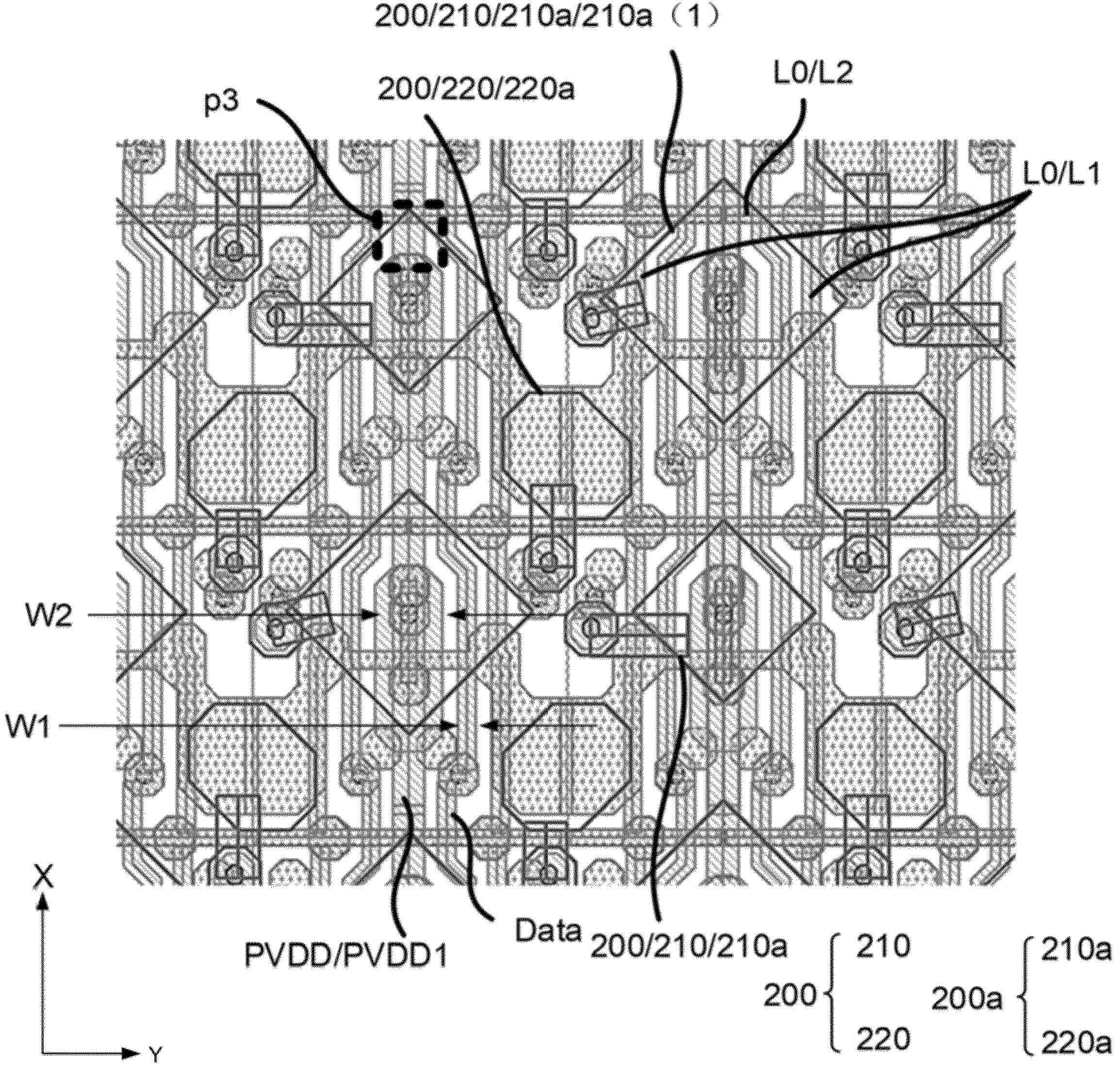
FIG. 17 is a diagram illustrating the structure of another display panel according to an embodiment of the present application.

FIG. 1 is a diagram illustrating the structure of a display panel according to an embodiment of the present application. FIG. 2 is a schematic diagram of circuit elements of a pixel driving circuit according to an embodiment of the present application. FIG. 3 is a timing diagram of an implementation of signals provided to the pixel driving circuit shown in FIG. 2 within one driving cycle according to an embodiment of the present application. FIG. 4 is a sectional view taken along section line A-A' in FIG. 1. FIG. 5 is a diagram illustrating the structure of another display panel according to an embodiment of the present application. FIG. 6 is a diagram illustrating the structure of another display panel according to an embodiment of the present application. FIG. 7 is a schematic diagram illustrating a part of the structure of the display panel according to FIG. 5. FIG. 8 is a schematic diagram illustrating a part of the structure of the another display panel according to FIG. 5. FIG. 9 is a schematic diagram illustrating a part of the structure of the another display panel according to FIG. 5. FIG. 10 is a schematic diagram illustrating a part of the structure of the another display panel according to FIG. 5. FIG. 11 is a schematic diagram illustrating a part of the structure of the another display panel according to FIG. 5. FIG. 12 is a schematic diagram illustrating a part of the structure of the another display panel according to FIG. 5. FIG. 13 is a schematic diagram illustrating a part of the structure of the display panel according to FIG. 6. FIG. 14 is a schematic diagram illustrating a part of the structure of the another display panel according to FIG. 6. FIG. 15 is a schematic diagram illustrating a part of the structure of the another display panel according to FIG. 6. FIG. 16 is a diagram illustrating the structure of another display panel according to an embodiment of the present application. FIG. 17 is a diagram illustrating the structure of another display panel according to an embodiment of the present application. With reference to FIG. 1 to FIG. 17, an embodiment of the present application provides a display panel 10; the display panel 10 includes a plurality of pixel driving circuits 100 and a plurality of signal lines 101; a pixel driving circuit 100 includes a driving transistor T3 and a data writing transistor T2; the signal lines 101 include multiple data signal lines Data extending in a first direction X and arranged in a second direction Y; the data writing transistor T2 is coupled between a data signal line Data and the gate of the driving transistor T3; the first direction X and the second direction Y intersect.

Still with reference to FIG. 1 to FIG. 17, the signal lines 101 also include multiple power signal lines PVDD; a power signal line PVDD includes a body portion PVDDa and a connection portion PVDDb; the connection portion PVDDb connects two adjacent body portions PVDDa; in an arrangement direction of the multiple power signal lines PVDD, the width of the body portion PVDDa is greater than the width of the connection portion PVDDb.

Moreover, the display panel 10 also includes a substrate 300 and light-emitting elements 200; a light-emitting element 200 includes a first light-emitting element 210; the first light-emitting element 210 includes a first anode **210*a*; in a direction perpendicular to the plane in which the substrate 300 is located, the first anode 210*a* at least partially overlaps the data signal line Data, and the first anode 210*a*** at least partially overlaps the body portion PVDDa.

With reference to FIG. 1, the display panel 10 includes a pixel driving circuit 100 electrically connected to a light-emitting element 200 of the display panel 10 to drive the light-emitting element 200 and ensure the light-emitting display of the light-emitting element 200. For example, the signal lines 101 included in the display panel 10 is configured to provide voltage signals and/or current signals to the pixel driving circuit 100, thereby ensuring the overall display effect of the display panel 10.

In an embodiment, the arrangement of the pixel driving circuit 100 is diverse. With reference to FIG. 2, the pixel driving circuit 100 is described by using an example of “8T1C”, where “T” denotes a transistor, and “C” denotes a storage capacitor. Based on the arrangement of the pixel driving circuit 100, those skilled in the art may make adaptive adjustments as required.

Illustratively, with reference to FIG. 2, the pixel driving circuit 100 may include a first light emission control transistor T1, a data writing transistor T2, a driving transistor T3, a threshold compensation transistor T4, an initialization transistor T5, a second light emission control transistor T6, a reset transistor T7, and a storage capacitor Cst. In an embodiment, the pixel driving circuit 100 in FIG. 2 also includes a bias transistor T8. For example, the working process of the pixel driving circuit 100 is described by using examples with reference to FIG. 2. A scan signal line S1 and a scan signal line S11 may control the turn-off or turn-off of the initialization transistor T5 of the pixel driving circuit 100, and when the initialization transistor T5 is turned on, S1 and S11 reset the gate potential of the driving transistor T3, that is, the initialization signal of an initialization signal line VREF1 is transmitted to the initialization transistor T5, and the connection node (first node N1) of the driving transistor T3, the initialization transistor T5, the threshold compensation transistor T4, and the storage capacitor Cst is reset. A scan signal line SP* controls the turn-on and turn-off of the data writing transistor T2 of the pixel driving circuit 100, and when the data writing transistor T2 is turned on, SP* writes the data signal on the data signal line Data to the gate of the driving transistor T3. A scan signal line S2 and a scan signal line S21 may control the turn-on and turn-off of the threshold compensation transistor T4, and when the threshold compensation transistor T4 is turned on, S2 and S21 compensate the threshold voltage of the driving transistor T3. Meanwhile, a scan signal line SP controls the turn-on and turn-off of the reset transistor T7, and when the reset transistor T7 is turned on, the scan signal line SP resets the anode of the light-emitting element 200 connected to the pixel driving circuit 100, that is, the reset signal of a reset signal line VREF2 is transmitted to the anode of the light-emitting element 200. A light emission control signal line EMIT controls the turn-on and turn-off of the first light emission control transistor T1 and the second light emission control transistor T6, and when the first light emission control transistor T1 and the second light emission control transistor T6 are controlled to be turned on, the power signal transmitted by the power signal line PVDD is transmitted to the light-emitting element 200. Thus, the display and light emission of the light-emitting element 200 are achieved. In an embodiment, as shown in FIG. 2, the pixel driving circuit 100 also includes one bias transistor T8. The scan signal line SP controls the turn-on or turn-off of the bias transistor T8, and when the bias transistor T8 is turned on, bias adjustment is performed on the driving transistor T3, that is, the bias signal of a bias voltage signal line DVH is transmitted to the bias transistor T8, and bias adjustment is performed on the connection node (second node N2) of the driving transistor T3, the first light emission control transistor T1, and the data writing transistor T2 to ensure the working stability of the driving transistor T3. It can be understood that bias transistor T8 may also be electrically connected a third node N3 (the connection node of the driving transistor T3, the second light emission control transistor T6, and the threshold compensation transistor T4); alternatively, the bias transistor T8 is electrically connected to the second node N2 and the third node N3 simultaneously. The bias signal of the bias voltage signal line DVH includes an enable level and a non-enable level. The enable level may turn on the bias transistor T8; the non-enable level may turn off (or cut off) the bias transistor T8. By the configuration of the bias transistor T8, the brightness of the first frame during picture display can be improved, the brightness of the first frame is prevented from being too low, and it is ensured that the consistency of picture display effect is better. Additionally, in the case of low-frequency driving, leakage of electricity is more obvious. The bias transistor T8 is controlled to be turned on and is used for writing the bias voltage to the source and/or the drain of the driving transistor T3 so that the bias state of the driving transistor T3 can be maintained consistent with the bias state at the time of writing the data voltage. In this manner, the stability of the working state of the driving transistor T3 is improved, low-frequency flickering is reduced, and the picture display effect of the display panel 10 is enhanced.

Illustratively, with reference to FIG. 3, an example is used where the initialization transistor T5 and the threshold compensation transistor T4 in the pixel driving circuit 100 are N-type transistors, and the remaining transistors are P-type transistors. The enable level may turn on a transistor. The non-enable level may turn off (or cut off) a transistor. The non-enable level of the light emission control signal EMIT is high level, and the enable level of EMIT is low level. The enable level of the signals transmitted by the scan signal lines S1 and S2 is high level, and the non-enable level of the signals transmitted by S1 and S2 is low level. The enable level of the signals transmitted by the scan signal lines SP and SP* is low level, and the non-enable level of the signals transmitted by SP and SP* is high level. For example, in one driving cycle Y of the pixel driving circuit 100, the gate signal transmitted by the light emission control signal line EMIT includes multiple non-enable level stages and multiple enable level stages, and the multiple non-enable level stages and multiple enable level stages are alternately arranged. When the light emission control signal line EMIT is at the non-enable level, the first light emission control transistor T1 and the second light emission control transistor T6 are turned off. When the light emission control signal line EMIT is at the enable level, the first light emission control transistor T1 and the second light emission control transistor T6 are turned on.

In an embodiment, one driving cycle Y of the pixel driving circuit 100 includes a data writing stage Y1, a light emission stage Y2, and a light emission maintaining stage Y3. The data writing stage Y1 includes a non-enable level stage of the light emission control signal EMIT. The light emission stage Y2 includes an enable level stage of the light emission control signal EMIT. In the light emission maintaining stage Y3, the light emission control signal EMIT includes multiple non-enable level stages and at least one enable level stage (in FIG. 3, one enable level stage is used as an example for description). Meanwhile, the level of the bias voltage signal line DVH in the data writing stage Y1 and the light emission stage Y2 and the level of the bias voltage signal line DVH in the light emission maintaining stage Y3 may be the same or different (illustrated in FIG. 3).

In an embodiment, the data writing stage Y1 includes a first offset adjustment stage Y11. In the first offset adjustment stage Y11, a signal transmitted by the scan signal line SP includes at least one low level period, and during this period, a signal transmitted by the scan signal line S2 includes at least one high level period. In other words, in the first bias adjustment stage Y11, at least the bias transistor T8 and the threshold compensation transistor T4 are turned on, and the bias signal of the bias voltage signal line DVH is transmitted to the driving transistor T3 through the bias transistor T8 and then transmitted to the gate of the driving transistor T3 through the threshold compensation transistor T4. That is, in the first bias adjustment stage Y11, the bias signal may perform bias adjustment on the first node N1, the second node N2, and the third node N3.

The data writing stage Y1 also includes an initialization and second bias adjustment stage Y12. In the initialization and second bias adjustment stage Y12, the signal transmitted by the scan signal line S2 includes at least one high level period; meanwhile, the signal transmitted by the scan signal line S2 may include at least one high level period. In other words, in the initialization and the second bias adjustment stage Y12, the initialization transistor T5 is turned on, and the later threshold compensation transistor T4 is also turned on. The initialization signal line VREF1 may adjust the gate of the driving transistor T3 through the initialization transistor T5. The initialization signal line VREF1 may also adjust the third node N3 through the initialization transistor T5 and the threshold compensation transistor T4.

The data writing stage Y1 also includes a data signal writing stage Y13. In the data signal writing stage Y13, the signal transmitted by the scan signal line S2 includes a high level period, and meanwhile, the signal transmitted by the scan signal line SP* includes at least one low level period. In other words, in the data signal writing stage Y13, the data writing transistor T2 and the threshold compensation transistor T4 are turned on, and the data signal Data may be transmitted to the gate of the driving transistor T3 through the data writing transistor T2 and the threshold compensation transistor T4.

The data writing stage Y1 also includes a third bias adjustment stage Y14. In the third bias adjustment stage Y14, the signal transmitted by the scan signal line SP includes at least one low level period, and in this period, bias adjustment may be performed on the second stage N2 through the bias transistor T8.

In an embodiment, if one driving cycle Y of the pixel driving circuit 100 is a low-frequency cycle, the driving cycle Y includes a data writing stage Y1, a light emission stage Y2, and a light emission maintaining stage Y3. If one driving cycle Y of the pixel driving circuit 100 is a high-frequency cycle, the driving cycle Y includes a data writing stage Y1 and a light emission stage Y2. In an embodiment, as shown in FIG. 2, the types of transistors in the pixel driving circuit 100 are diverse, and an indium gallium zinc oxide (IGZO) transistor and a low temperature poly-silicon (LTPS) transistor may coexist. The indium gallium zinc oxide transistor has advantages such as a small leakage current. The low temperature poly-silicon transistor has advantages such as a high switching speed, high carrier mobility, and low power. A display panel technology of LTPO (low temperature polycrystalline oxide) combines LTPO with IGZO. The display panel 10 not only has advantages such as high resolution, high response speed, high brightness, and high aperture ratio of LTPS display panels but also has the advantage of a small leakage current of IGZO. Illustratively, the first light emission control transistor T1, the data writing transistor T2, the driving transistor T3, the second light emission control transistor T6, and the reset transistor T7 may be PMOS transistors; at least one of the threshold compensation transistor T4 or the initialization transistor T5 may be a PMOS transistor, or at least one may be an NMOS transistor. This embodiment of the present application only uses an example where both the threshold compensation transistor T4 and the initialization transistor T5 are NMOS transistors for description. The specific type of the display panel 10 is not limited by this embodiment of the present application and may be adaptively adjusted according to actual production requirements.

Additionally, the threshold compensation transistor T4 and the initialization transistor T5 may be single-gate transistors or double-gate transistors. When a double-gate transistor is used, leakage current of the transistor is reduced, and the display effect of the display panel is improved. The present application only uses examples where the threshold compensation transistor T4 and the initialization transistor T5 are both (top and bottom) double-gate transistors for illustration.

For example, with reference to FIG. 2, the pixel driving circuit 100 includes a driving transistor T3 and a data writing transistor T2, and the signal lines 101 include multiple data signal lines Data. The data writing transistor T2 is coupled between the data signal line Data and the gate of the driving transistor T3. When the data writing transistor T2 is turned on, the data signal transmitted by the data signal line Data is transmitted to the driving transistor T3 through the data writing transistor T2 so that the driving transistor T3 completes the writing process of the data signal in the data writing stage.

In an embodiment, with reference to FIG. 4 to FIG. 15, FIG. 5 and FIG. 6 show diagrams illustrating the overall structure of the display panel 10. It should be noted that to facilitate a clear view of the entire layer structure of the display panel 10 in this embodiment of the present application, the layer structure is divided into FIGS. 5 and 6 for illustration. The display panel 10 is composed of multiple overlapping layers. To clearly understand the specific locations of the layers, reference is made to FIG. 4 and FIG. 7 to FIG. 15, where different layers in the display panel 10 are illustrated one by one from bottom to top. The display panel sequentially includes a first active layer POLY, a first metal layer M1, a second metal layer MC, a second active layer IGZO, a first gate layer MG, a third metal layer M2, a fourth metal layer M3, a fifth metal layer M4, and a layer RE in which the anode 200*a* of the light-emitting element 200 is located. It should be noted that the display panel 10 also includes a substrate 300 and a buffer layer 310, the preceding layers are all disposed on a side of the buffer layer 310 away from the substrate 300, and an insulation layer 400 exists between metal layers. The specific layer configuration of the display panel 10 may be adaptively adjusted according to actual production requirements, such as adding or subtracting some layers, which is not specifically limited in the embodiments of the present application. In an embodiment, with reference to FIG. 13, multiple data signal lines Data may exist in the display panel 10, the data signal line Data may be configured to extend in the first direction X, and multiple data signal lines Data are arranged in the second direction Y.

In an embodiment, with reference to FIG. 6, FIG. 13, and FIG. 14, the signal line 101 of the display panel 10 also includes multiple power signal lines PVDD. The power signal provided by a power signal line PVDD may be transmitted to the light-emitting element 200 through the driving transistor T3 so that the light-emitting element 200 emits light. In an embodiment, with reference to FIG. 13 and FIG. 14, the power signal line PVDD includes a body portion PVDDa and a connection portion PVDDb. It can be learned from the figures that the width of the body portion PVDDa is greater than the width of the connection portion PVDDb. Illustratively, as shown in FIG. 13, when the power signal line PVDD extends in the first direction X, and multiple power signal lines PVDD are arranged in the second direction Y, the width of the body portion PVDDa in the second direction Y is greater than the width of the connection portion PVDDb in the second direction Y. With reference to FIG. 14, when the power signal line PVDD extends in the second direction Y, and multiple power signal lines PVDD are arranged in the first direction X, the width of the body portion PVDDa in the first direction X is greater than the width of the connection portion PVDDb in the first direction X. In an embodiment, with reference to FIG. 6, FIG. 16, and FIG. 17, the display panel 10 includes a power signal line PVDD extending in the first direction X, and the power signal line PVDD extending in the first direction X is disposed in the same layer as the data signal line Data.

In an embodiment, with reference to FIG. 2, FIG. 5, and FIG. 15, the light-emitting element 200 includes an anode 200*a* electrically connected to the pixel driving circuit 100. In an embodiment, the light-emitting element 200 includes a first light-emitting element 210, and the first light-emitting element 210 includes a first anode 210*a*. Illustratively, the first light-emitting element 210 may be a red light-emitting element or a blue light-emitting element. The specific color of the first light-emitting element 210 may be adaptively adjusted according to different pixel arrangements of the display panel 10. In an embodiment, with reference to FIG. 5, FIG. 6, FIG. 13, and FIG. 15, in the direction perpendicular to the plane in which the substrate 300 is located, that is, in the direction of the thickness of the display panel 10, the first anode 210*a* at least partially overlaps the data signal line Data. In the case where the first anode 210*a* and the data signal line Data overlap in the display panel 10, the data signal line Data generates a signal coupling with the first anode 210*a*, which affects the display effect of the first light-emitting element 210. In other words, when the data signal line Data jumps, since the data signal line Data generates a signal coupling with the first anode 210*a*, the potential of the first anode 210*a* changes (for example, pulled high or pulled low), causing some of the light-emitting elements 200 in the display panel 10 to appear too bright or dim and thus affecting the display effect of the display panel 10. This embodiment of the present application can ensure the display effect of the display panel 10 by the adjustment of the configuration position of the power signal line PVDD. For example, with reference to FIG. 6, FIG. 13, and FIG. 15, in the direction perpendicular to the plane in which the base substrate 300 is located, the first anode 210*a* at least partially overlaps the body portion PVDDa. The first anode 210*a* forms a capacitor with the overlapping body portion PVDDa so that the signal of the first anode 210*a* is stabilized, and the signal interference from the data signal line Data or another wire to the first anode 210*a* is reduced. In an embodiment, the body portion PVDDa is adjusted to overlap the first anode 210*a* so that the flat design of the first anode 210*a* is ensured. Moreover, it is ensured that the light emitted from the first light-emitting element 210 has a balanced optical path, deviations in brightness or chromaticity are avoided, and the display effect of the display panel 10 is ensured. In conclusion, this embodiment of the present application provides a display panel. The power signal line of the display panel includes a body portion and a connection portion. In the direction perpendicular to the plane in which the substrate is located, the first anode at least partially overlaps the data signal line, and meanwhile, the first anode at least partially overlaps the body portion. By the adjustment of the overlap between the body portion and the first anode, signal interference from the first anode and the data signal line can be avoided or mitigated, thereby ensuring the display effect of the display panel.

With continued reference to FIG. 6, FIG. 16, and FIG. 17, the width of the data signal line Data is W1 in the second direction Y; in the arrangement direction of the multiple power signal lines PVDD, the width of the body portion PVDDa is W2; $W2 \geq 1.5*W1$.

For example, with reference to FIG. 6, FIG. 16, and FIG. 17, an example is used where the power signal line PVDD extends in the first direction X for illustration; in the arrangement direction of the power signal line PVDD, that is, in the second direction Y, the width of the body portion PVDDa is greater than the width of the data signal line Data.

For example, as shown in FIG. 17, the width of the body portion PVDDa in the second direction Y is W2, the width of the data signal line Data in the second direction Y is W1, and $W2 \geq 1.5*W1$.

In an embodiment, with reference to FIG. 6 and FIG. 16, for the body portion PVDDa marked in the figures, the width of the body portion PVDDa in the second direction Y may be different in different locations because of a cross-layer requirement of another layer, for example, W2 (1) and W2 (2) in FIG. 6 and FIG. 16. In the figures, W2 (1)<W2 (2). For example, in the second direction Y, the width of the body portion PVDDa is W2 (which may be W2 (1) or W2 (2)), and in the second direction Y, the width of data signal line Data is W1; $W2 \geq 1.5*W1$. Generally, by the limitation of the widths of the body portion PVDDa and the data signal line Data, it is effectively ensured that the capacitance formed by the first anode 210*a* and the overlapping body portion PVDDa is relatively large, and the signal of the first anode 210*a* is effectively stabilized. Meanwhile, the signal interference from the data signal line Data or another wire to the first anode 210*a* is reduced.

Figure 18:
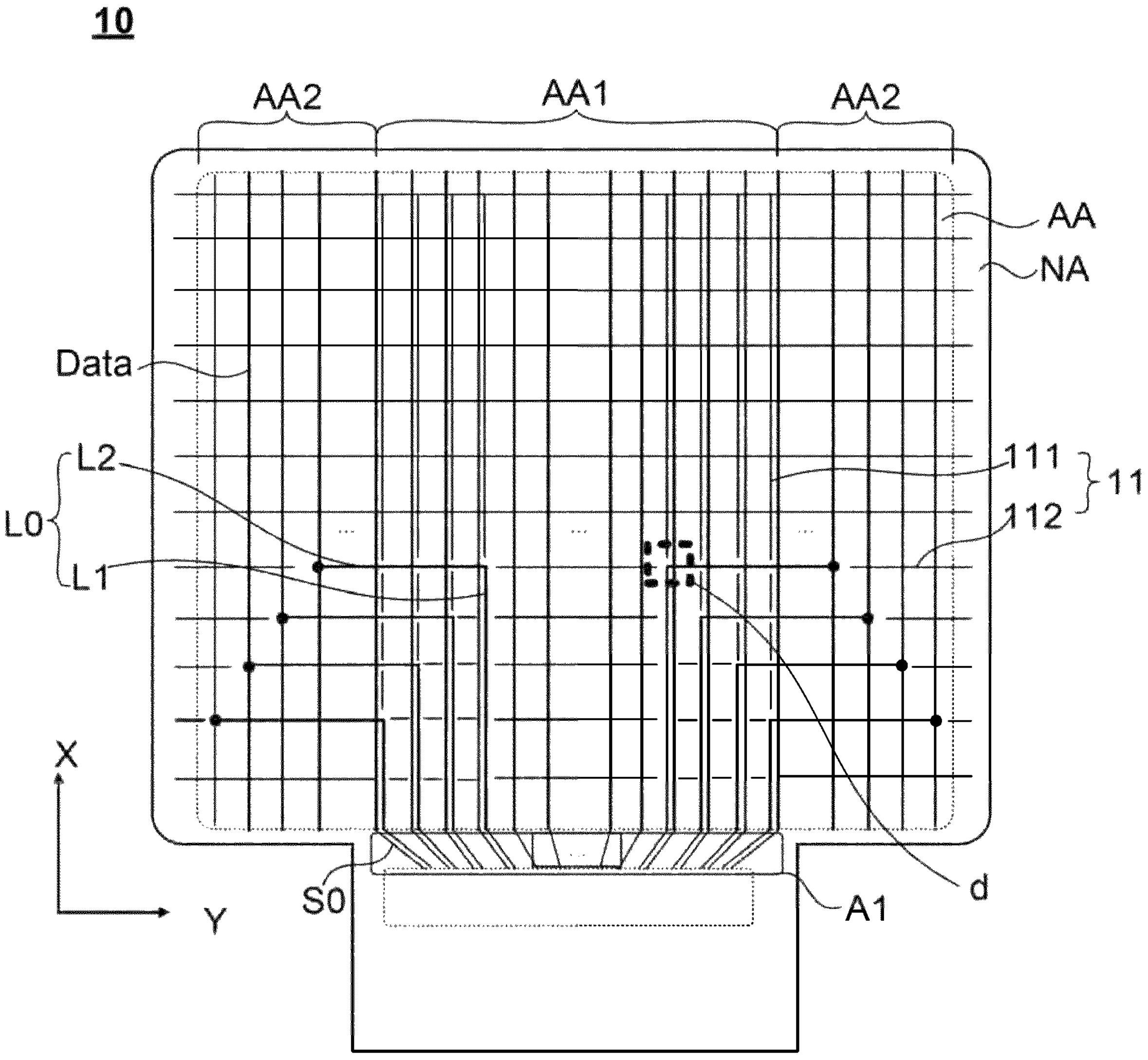
FIG. 18 is a diagram illustrating the structure of another display panel according to an embodiment of the present application.
Figure 19:
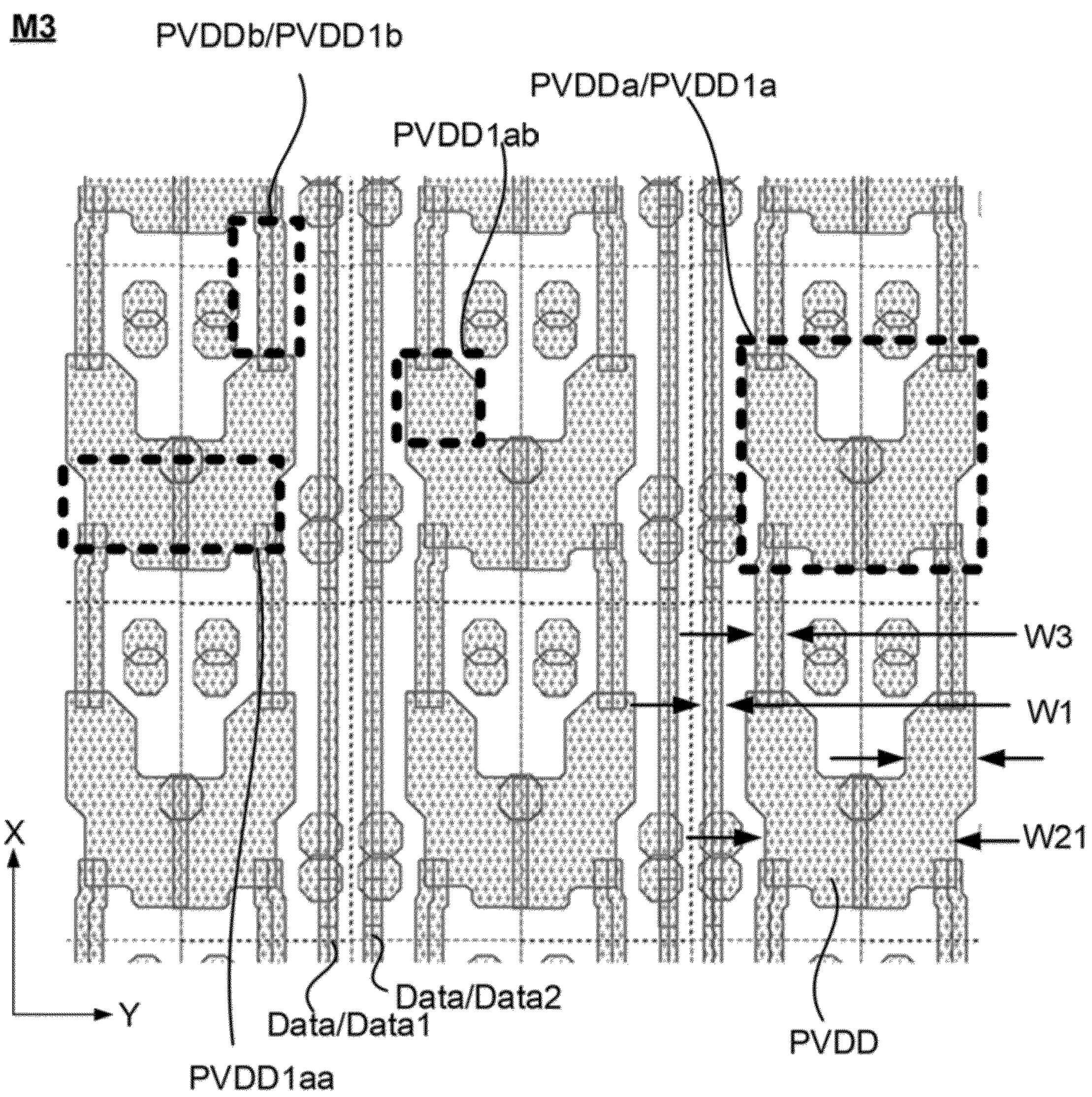
FIG. 19 is a schematic diagram illustrating a part of the structure of the display panel according to FIG. 16.
Figure 20:
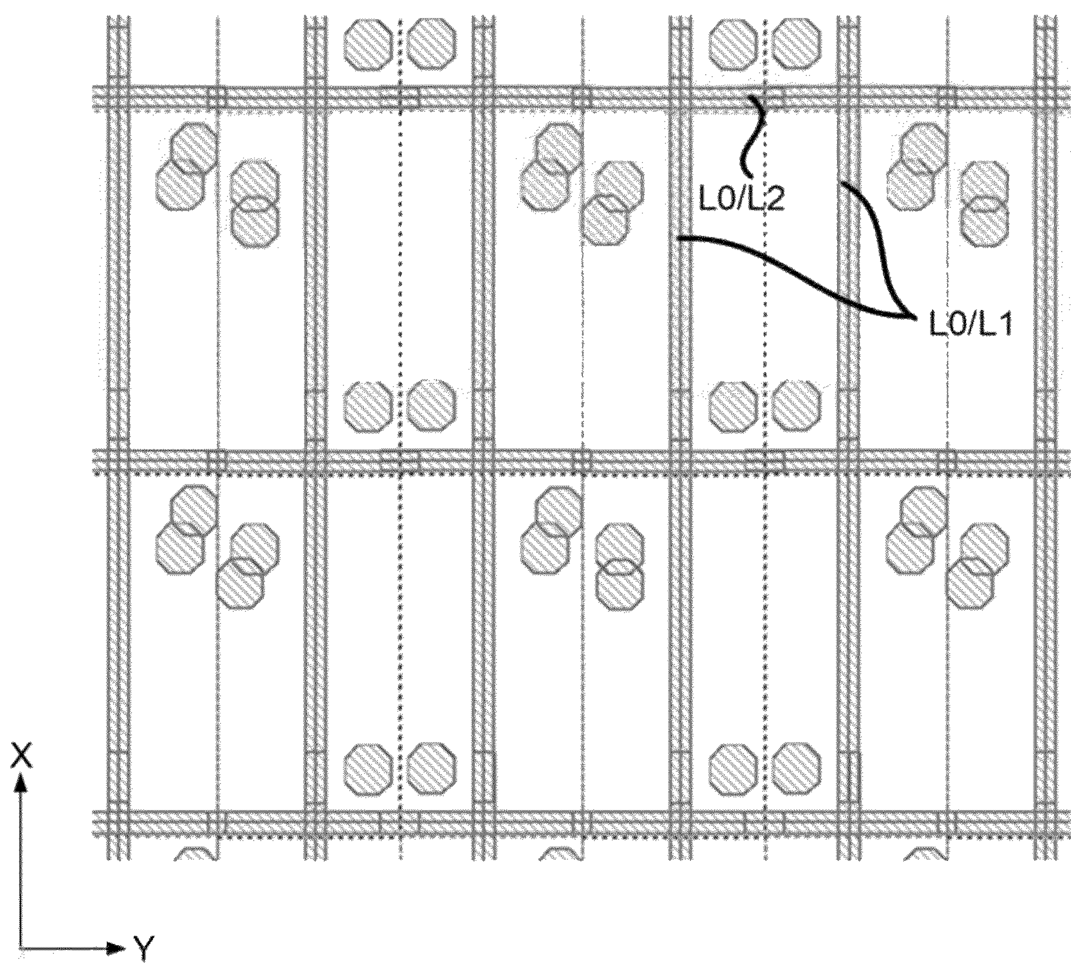
FIG. 20 is a schematic diagram illustrating a part of the structure of the another display panel according to FIG. 16.

FIG. 18 is a diagram illustrating the structure of another display panel according to an embodiment of the present application. FIG. 19 is a schematic diagram illustrating a part of the structure of the display panel according to FIG. 16. FIG. 20 is a schematic diagram illustrating a part of the structure of the another display panel according to FIG. 16. With reference to FIG. 6 and FIG. 16 to FIG. 20, the display panel 10 includes a display region AA and a non-display region NA at least partially surrounding the display region AA; the non-display region NA includes a fan-out region A1 on a side of the display region AA in the first direction X, the display region AA includes a first display region AA1 and a second display region AA2, and the second display region AA2 is disposed on at least one side of the first display region AA1 in the second direction Y; the fan-out region A1 includes multiple fan-out wires S0, and both the first display region AA1 and the second display region AA2 include multiple data signal lines Data; the data signal line Data is connected to a fan-out wire S0; the data signal line Data of the second display region AA2 is connected to the fan-out wire S0 by a connection wires L0; the connection wires L0 is disposed in the display region AA and includes a first connection line segment L1 extending in the first direction X and a second connection line segment L2 extending in the second direction Y; in the direction perpendicular to the plane in which the substrate 300 is located, at least one first anode 210*a* overlaps at least one connection wires L0.

For example, the display panel 10 includes a display region AA and a non-display region NA; the display region AA includes a light-emitting element (not specifically shown in the figures), a data signal line Data connected to the light-emitting element, and other components, so as to achieve the display function of the display panel 10. The non-display region NA includes a display controller connected to the data signal line Data, for example, a driver chip (not specifically shown in the figures). A display signal is provided to the data signal line Data through the display controller to drive the display panel 10 to achieve the display function. The non-display region NA surrounds at least part of the display region AA. The specific positions of the display region AA and the non-display region NA are not specifically limited by this embodiment of the present application.

In an embodiment, as shown in FIG. 18, the non-display region NA also includes a fan-out region A1, the fan-out region A1 includes multiple fan-out wires S0, and a fan-out wire S0 is configured to be electrically connected to multiple data signal lines Data to ensure stable transmission of the data signal.

For example, the display region AA includes a first display region AA1 and second display regions AA2; in the second direction Y, the second display regions AA2 are disposed on two sides of the first display region AA1, and the second display regions AA2 are closer to the boundary of the display region AA than the first display region AA1. The data signal line Data in the first display region AA1 may be directly electrically connected to the fan-out line S0. The data signal line Data in the second display region AA2 may be electrically connected to the fan-out wire S0 through a connection line L0.

In this manner, the space occupied by the fan-out wire S0 can be reduced, the configured area of the fan-out region A1 can be reduced, and the proportion of the non-display region NA is effectively reduced. Moreover, the proportion of the display region AA of the display panel 10 is increased, the display area of the display panel 10 is increased, and user experience is improved.

For example, the connection wire L0 includes a first connection line segment L1 and a second connection line segment L2. The first connection line segment L1 extends in the first direction X. The second connection line segment L2 extends in the second direction Y. The first connection line segment L1 is separately electrically connected to the second connection line segment L2 and the data signal line Data in the second display region AA2. That is, it is ensured that the data signal line Data in the second display region AA2 is electrically connected to the fan-out wire S0 through the connection wire L0.

In an embodiment, the extension directions of the first connection line segment L1 and the second connection line segment L2 are different. The first connection line segment L1 and the second connection line segment L2 may be arranged on different layers and be electrically connected through a via. For example, the second connection line segment L2 may be disposed on a side of the first connection line segment L1 away from the substrate 300. Illustratively, with reference to FIG. 6, FIG. 13, and FIG. 14, the first connection line segment L1 may be disposed in the fourth metal layer M3, and the second connection line segment L2 may be disposed in the fifth metal layer M4. With reference to FIG. 17, the first connection line segment L1 may be disposed in the fifth metal layer M4, and the second connection line segment L2 may be disposed in the fourth metal layer M3. In an embodiment, with reference to FIG. 6, FIG. 16, and FIG. 17, in the direction perpendicular to the plane in which the substrate 300 is located, that is, in the direction of the thickness of the display panel 10, the first anode 210*a* overlaps the connection wire L0. The overlapping arrangement of the connection wire L0 and the first anode 210*a* is ensured so that a flat design of the first anode 210*a* can be ensured, which helps ensure that light emitted from the first light-emitting element 210 has a balanced optical path and ensures the display effect of the display panel 10. In an embodiment, it is ensured that the connection wire L0 overlaps the first anode 210*a*, which means that the light-emitting element 200 can cover part of the connection wire L0. Thus, the metal connection wire L0 is prevented from changing the transmission direction of the light, and the display effect of the display panel 10 can be ensured. It should be noted that in FIG. 16, the first connection line segment L1 and the power signal line PVDD overlap so that the locations of the connection line L0 and the power signal line PVDD can be clearly seen. Reference may be made to FIG. 19 and FIG. 20. Illustratively, as shown in FIG. 16, FIG. 19, and FIG. 20, the data signal line Data and power signal line PVDD are disposed in the fourth metal layer M3, and the first connection line segment L1 and the second connection line segment L2 are disposed in the fifth metal layer M4.

In an embodiment, in a direction perpendicular to the plane in which the substrate 300 is located, overlapping arrangements of the first anode 210*a* and the connection wire L0 are diverse as follows:

With continued reference to FIG. 6, FIG. 16, and FIG. 17, in the direction perpendicular to the plane in which substrate 300 is located, at least one first anode 210*a* overlaps both the first connection line segment L1 and the second connection line segment L2 that are of the same connection wire L0.

For example, in the direction of the thickness of the display panel 10, at least one first anode 210*a* may overlap the first connection wire L1 and also overlap the second connection wire L2. Illustratively, reference is made to the first anode 210*a* (1) in FIG. 6, FIG. 16, and FIG. 17.

With continued reference to FIG. 6, FIG. 16, and FIG. 17, in the direction perpendicular to the plane in which substrate 300 is located, at least one first anode 210*a* overlaps two first connection line segments L1.

For example, in the direction of the thickness of the display panel 10, at least one first anode 210*a* may overlap two first connection wires L1. Illustratively, reference is made to the first anode 210*a* (1) in FIG. 6, FIG. 16, and FIG. 17.

In conclusion, by the proper configuration of the overlapping manner of the first anode 210*a* and the connection wire L0, it is ensured that the areas of the connection wire L0 covered by the first anode 210*a* at different locations are the same or similar or that the ratios of the areas of different first anodes 210*a* to the areas of the connection wires L0 covered by the first anodes 210*a* are the same or similar. Thus, it is ensured that the influence of the configuration of the connection wire L0 on different first anodes 210*a* is the same or similar. The influence can be understood as the influence of the connection wire L0 on the flatness of the first anode 210*a* or as the influence of the signal transmitted in the connection wire L0 on the first anode 210*a* signal. In this manner, it is ensured that the influence of different first light-emitting elements 210 caused by the configuration of the connection wire L0 is the same or similar, and the uniformity of the display is ensured.

With continued reference to FIG. 18, the display panel 10 also includes an auxiliary connection wire 11; the auxiliary connection wire 11 includes at least one of a first auxiliary connection wire 111 extending in the first direction X or a second auxiliary connection wire 222 extending in the second direction Y; the first auxiliary connection wire 111 is disposed in the same layer as the first connection line segment L1 and is insulated from the first connection line segment L1 and the second connection line segment L2; the second auxiliary connection wire 112 is disposed in the same layer as the second connection line segment L2 and is insulated from the first connection line segment L1 and the second connection line segment L2.

In an embodiment, the display region AA also includes an auxiliary connection wire 11. The auxiliary connection wire 11 includes a first auxiliary connection wire 111 and a second auxiliary connection wire 112. With reference to FIG. 18, both the first auxiliary connection wire 111 and the second auxiliary connection wire 112 are insulated from the connection wire L0. The configuration of the auxiliary connection wire 11 may compensate for the length of the connection wire L0. For example, the first auxiliary connection wire 111 may be configured to compensate for the first connection line segment L1, and the second auxiliary connection wire 112 is configured to supplement the second connection line segment L2. That is, the auxiliary connection wire 11 is configured so that the overall wiring balance in the configured region of the connection wire L0 is achieved, and it is ensured that the density of the wiring configurations in different regions is balanced. In this manner, the light reflectivity in different regions of the display panel 10 caused by unbalanced wiring arrangements is prevented from being different, and the uneven display effect of the display panel 10 is avoided.

In an embodiment, the auxiliary connection wire 11 may be electrically connected to a fixed potential terminal. On the one hand, interference to the display caused by floating potential coupling of the auxiliary connection wire 11 to other signals can be avoided; on the other hand, connection in parallel with the fixed potential terminal can reduce the resistance of a fixed signal terminal or of a fixed potential signal line, which ensures that the loss of the fixed potential signal in the transmission process is relatively small.

Figure 21:
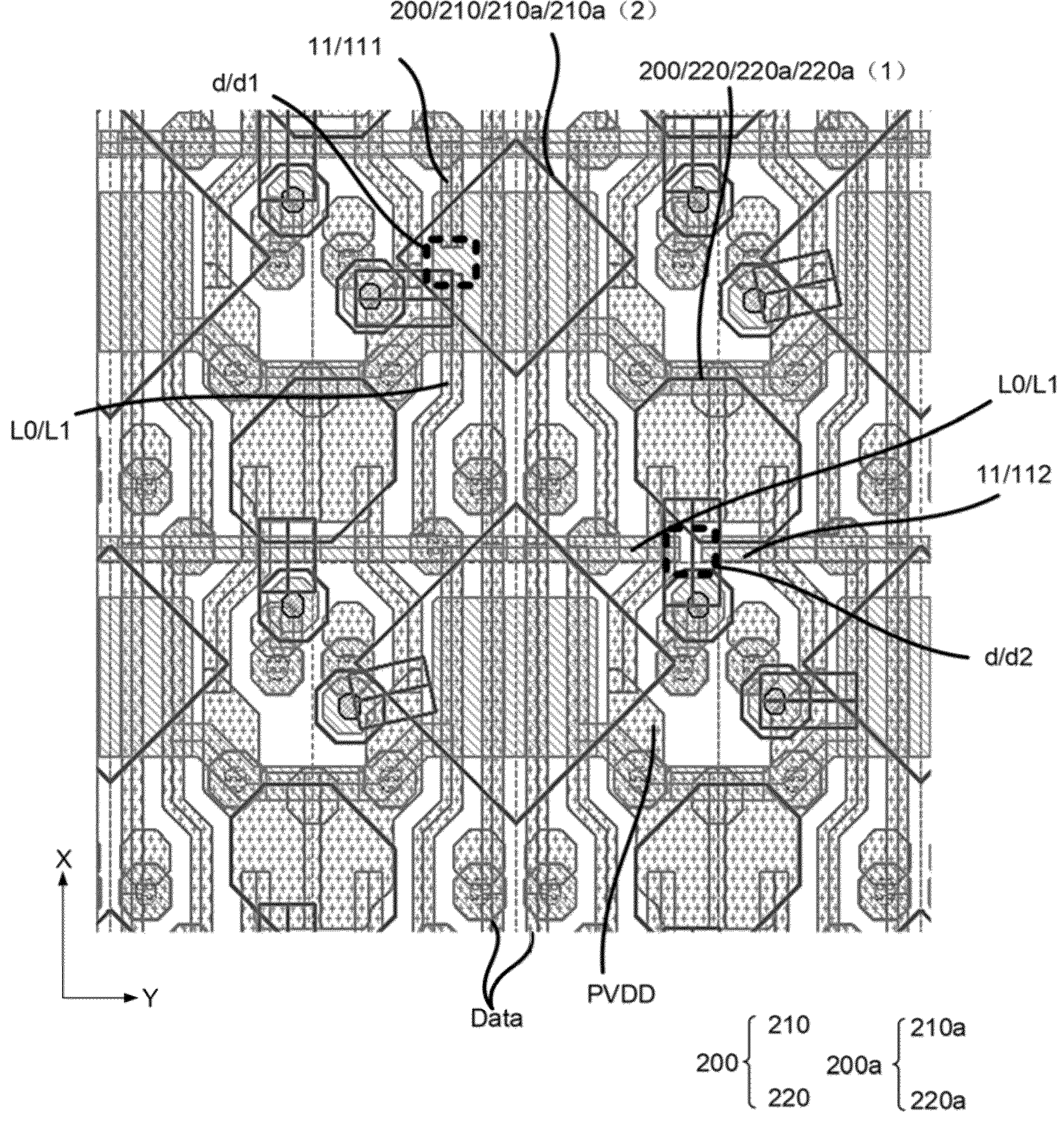
FIG. 21 is a diagram illustrating the structure of another display panel according to an embodiment of the present application.
Figure 22:
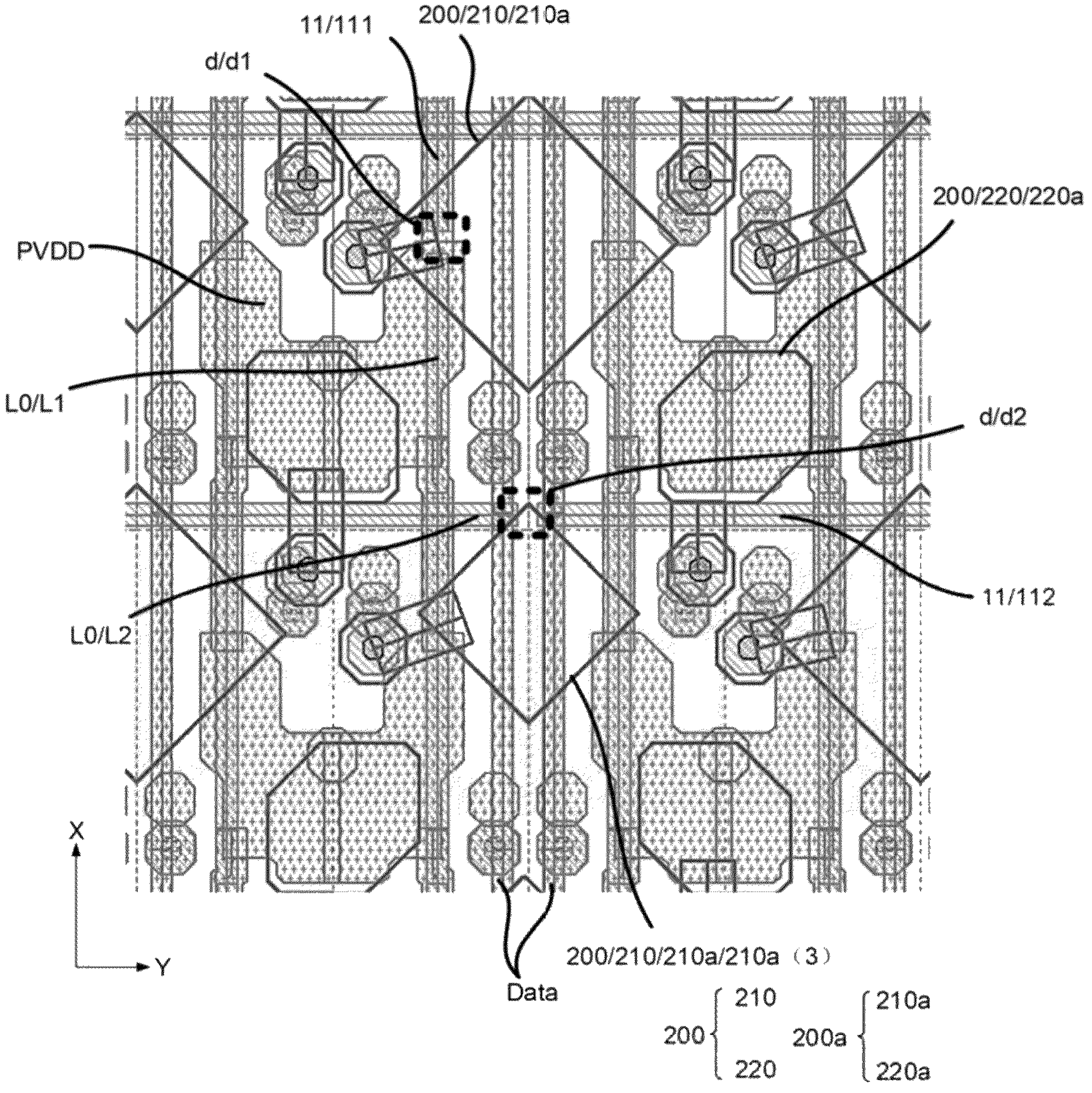
FIG. 22 is a diagram illustrating the structure of another display panel according to an embodiment of the present application.
Figure 23:
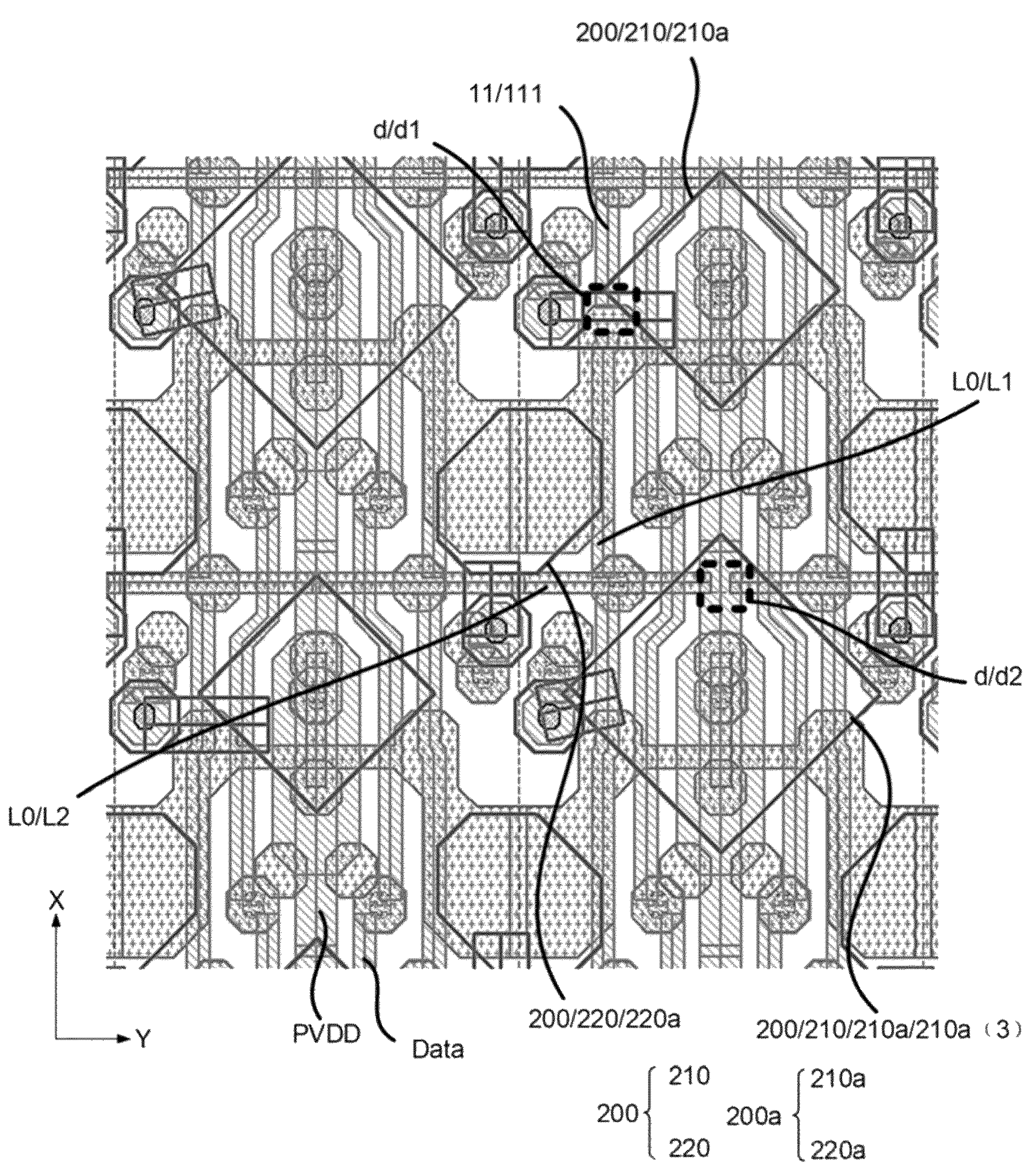
FIG. 23 is a diagram illustrating the structure of another display panel according to an embodiment of the present application.

FIG. 21 is a diagram illustrating the structure of another display panel according to an embodiment of the present application. The arrangement of data lines and power signal lines in FIG. 21 is the same as the arrangement of data lines and power signal lines in FIG. 6. FIG. 22 is a diagram illustrating the structure of another display panel according to an embodiment of the present application. The arrangement of data lines and power signal lines in FIG. 22 is the same as the arrangement of data lines and power signal lines in FIG. 16. FIG. 23 is a diagram illustrating the structure of another display panel according to an embodiment of the present application. The arrangement of data lines and power signal lines in FIG. 23 is the same as the arrangement of data lines and power signal lines in FIG. 17. With reference to FIG. 18 and FIG. 21 to FIG. 23, a gap d exists between the first auxiliary connection wire 111 and the first connection line segment L1, and a gap d exists between the second auxiliary connection wire 112 and the second connection line segment L2; in the direction perpendicular to the plane in which substrate 300 is located, at least one first anode 210*a* overlaps the gap d.

For example, as shown in a region d in FIG. 18, due to the insulation arrangement of the auxiliary connection wire 11 and the connection wire L0, a gap d exists between the first auxiliary connection wire 111 and the first connection line segment L1, and a gap d also exists between the second connection line segment L2 and the second auxiliary connection wire 112.

In an embodiment, as shown in the regions d in FIG. 21 to FIG. 23, the orthographic projection of at least part of the gap on the plane where the substrate 300 is located overlaps the orthographic projection of the light-emitting element 200 on the plane where the substrate 300 is located. It can be understood that the projection of at least one first anode 210*a* of the display panel 10 on the substrate 300 may cover the projection of the gap d on the substrate 300. Thus, it can be ensured that the configured gap d is blocked. Moreover, it is ensured that the density of the wiring configurations in different regions is balanced, the light reflectivity in different regions of the display panel 10 caused by unbalanced wiring arrangements is prevented from being different, and the uneven display effect of the display panel 10 is avoided.

With continued reference to FIG. 21 to FIG. 23, a first gap d1 exists between the first auxiliary connection wire 111 and the first connection line segment L1, and a second gap d2 exists between the second auxiliary connection wire 112 and the second connection line segment L2; in the direction perpendicular to the plane in which substrate 300 is located, at least one first anode 210*a* overlaps the first gap d1.

For example, in the first direction X, a gap d between the first auxiliary connection wire 111 and the first connection line segment L1 is a first gap d1. The first gap d1 ensures the insulation configuration of the first auxiliary connection wire 111 and the first connection line segment L1. In the second direction Y, a gap d between the second auxiliary connection wire 112 and the second connection line segment L2 is a second gap d2. The second gap d2 ensures the insulation configuration of the second auxiliary connection wire 112 and the second connection line segment L2.

In an embodiment, in the direction perpendicular to the plane in which substrate 300 is located, at least one first anode 210*a* in the display panel 10 overlaps the first gap d1. In other words, at least one first anode 210*a* may cover the first gap d1 so that it is ensured that the configured first gap d1 is blocked. Moreover, it is ensured that the density of the wiring configurations in different regions is balanced and that the light reflectivity of different regions in the display panel 10 is the same. The manners of blocking the first gap d1 are diverse. It can be understood that according to different layer arrangements in the display panel 10, the first gap d1 may be covered by the anode 200*a* at different locations. Illustratively, as shown in FIG. 21, FIG. 22, and FIG. 23, the first anode 210*a* (2) in the figures overlaps the first gap d1 in the direction of the thickness of display panel 10.

Figure 24:
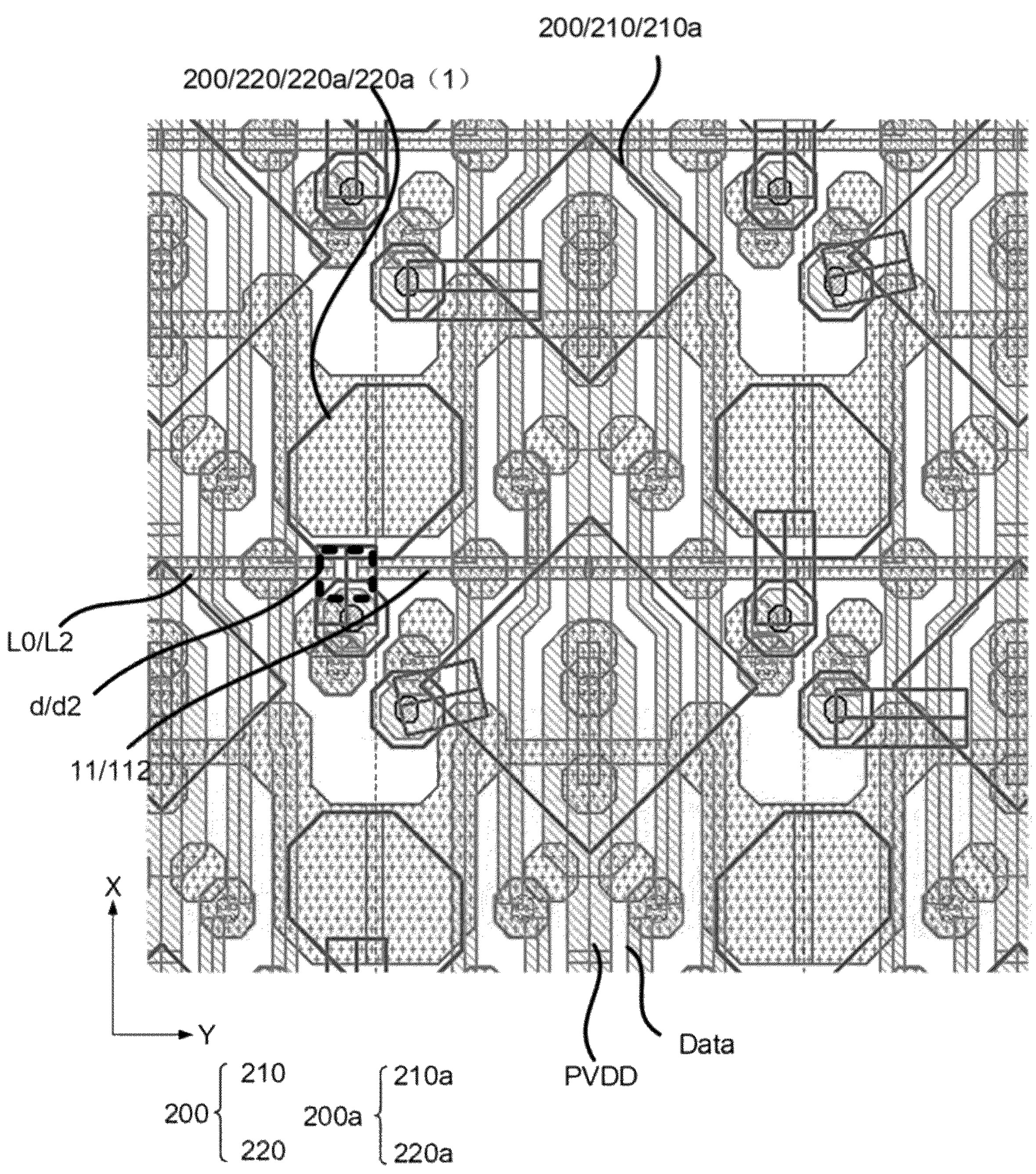
FIG. 24 is a diagram illustrating the structure of another display panel according to an embodiment of the present application.

FIG. 24 is a diagram illustrating the structure of another display panel according to an embodiment of the present application. With reference to FIG. 21 to FIG. 24, the arrangement of data lines and power signal lines in FIG. 24 is the same as the arrangement of data lines and power signal lines in FIG. 17; a first gap d1 exists between the first auxiliary connection wire 111 and the first connection line segment L1, and a second gap d2 exists between the second auxiliary connection wire 112 and the second connection line segment L2; the display panel 10 also includes a second light-emitting element 220, the color of light emitted by the second light-emitting element 220 is different from the color of light emitted by the first light-emitting element 210, and the second light-emitting element 220 includes a second anode 220*a*; in the direction perpendicular to the plane in which substrate 300 is located, at least one first anode 210*a* overlaps the second gap d2, and/or at least one second anode 220*a* overlaps the second gap d2.

For example, for the second gap d2 between the second auxiliary wire 112 and the second connection line segment L2, a 200*a* exists in the display panel 10 to cover the second gap d2 to ensure that the configured second gap d2 is blocked. Moreover, it is ensured that the density of the wiring configurations in different regions is balanced and that the light reflectivity of different regions in the display panel 10 is the same.

The manners of blocking the second gap d2 are diverse. It can be understood that according to different layer arrangements in the display panel 10, the second gap d2 may be covered by the anodes 200*a* of different light-emitting elements 200.

Illustratively, as shown in FIG. 22 and FIG. 23, at least one first anode 210*a* (first anode 210*a* (3) in the figures) covers the second gap d2 to ensure that the configured second gap d2 is blocked.

In an embodiment, the light-emitting element 200 of the display panel 10 also includes a second light-emitting element 220, and a difference exists between the light-emitting element 200 corresponding to the first light-emitting element 210 and the light-emitting element 200 corresponding to the second light-emitting element 220. Illustratively, the first light-emitting element 210 may be a red light-emitting element or a blue light-emitting element, while the second light-emitting element 220 may be a green light-emitting element. The specific colors of the first light-emitting element 210 and the second light-emitting element 220 may be adaptively adjusted according to different pixel arrangements of the display panel 10. In an embodiment, with reference to FIG. 21 to FIG. 24, the anode 200*a* included in the second light-emitting element 220 is the second anode 220*a*.

Illustratively, as shown in FIG. 21 and FIG. 24, at least one second anode 220*a* (second anode 220*a* (1) in the figures) covers the second gap d2 to ensure that the configured second gap d2 is blocked. It should be noted that FIG. 23 and FIG. 24 actually show a display panel 10 in one layer arrangement. It can be understood that in the display panel 10 in this layer arrangement, the second gap d2 may be blocked by the first anode 210*a* and/or the second anode 220*a*. The specific blocking manner may be adaptively adjusted according to the actual display panel 10 in this embodiment of the present application.

In conclusion, with reference to FIG. 21, the first auxiliary connection wire 111 is disposed in the fourth metal layer M3, and the second auxiliary connection wire 112 is disposed in the fifth metal layer M4. In an embodiment, in the direction of the thickness of the display panel 10, the first anode 210*a* overlaps at least part of the first auxiliary connection wire 111 and the second auxiliary connection wire 112, and one first anode 210*a* may overlap one first auxiliary connection wire 111 or two first auxiliary connection wires 111. With reference to FIG. 23 and FIG. 24, the first auxiliary connection wire 111 may be disposed in the same layer where the fifth metal layer M4 is located, and the second auxiliary connection wire 112 is disposed in the third metal layer M2. In an embodiment, in the direction of the thickness of the display panel 10, the first anode 210*a* overlaps at least part of the first auxiliary connection wire 111 and the second auxiliary connection wire 112, and one first anode 210*a* may overlap one first auxiliary connection wire 111 or two first auxiliary connection wires 111. With reference to FIG. 22, the data signal line Data and the power signal line PVDD are disposed in the fourth metal layer M3, and the first auxiliary connection wire 111 and the second auxiliary connection wire 112 are disposed in the fifth metal layer M4. In an embodiment, in the direction of the thickness of the display panel 10, the first anode 210*a* overlaps at least part of the first auxiliary connection wire 111 and the second auxiliary connection wire 112, and one first anode 210*a* may overlap one first auxiliary connection wire 111 or two first auxiliary connection wires 111.

In conclusion, by the proper configuration of the overlapping manner of the first anode 210*a* and the auxiliary connection wire 11, it is ensured that the total areas of the auxiliary connection wires 11 and the connection wires L0 covered by the first anodes 210*a* at different positions are the same or similar or that the ratios of the areas of different first anodes 210*a* to the areas of the connection wires L0 and the auxiliary connection wires 11 covered by the first anodes 210*a* are the same or similar. Thus, it is ensured that the influence of the configuration of the connection wire L0 and auxiliary connection wire 11 on different first anodes 210*a* is the same or similar. The influence can be understood as the influence of the connection wire L0 and auxiliary connection wire 11 on the flatness of the first anode 210*a* or as the influence of the signal transmitted in the connection wire L0 on the first anode 210*a* signal.

With continued reference to FIG. 18, the non-display region NA also includes a power bus; the auxiliary connection wire 11 is electrically connected to the power bus.

For example, the non-display region NA includes a power bus (not specifically shown in the figure), and the power bus of the non-display region NA is electrically connected to the power signal line PVDD of the display region AA. In other words, the power signal transmitted in the power signal line PVDD is provided by the power bus.

In an embodiment, the electrical connection between the auxiliary connection wire 11 and the power bus may be that the auxiliary connection wire 11 is electrically connected to the power bus through the power signal line PVDD located in the display region. The auxiliary connection wire 11 is electrically connected to the power bus so that the resistance of the power signal line PVDD can be reduced, and the transmission effect of the power signal can be ensured. Additionally, it can be ensured that the auxiliary connection wire 11 does not sense or couple another potential signal so that the auxiliary connection wire 11 is prevented from affecting the potential stability of other wires, and then the stable transmission of signals in the display panel 10 and the display effect of the display panel 10 are ensured.

Figure 25:
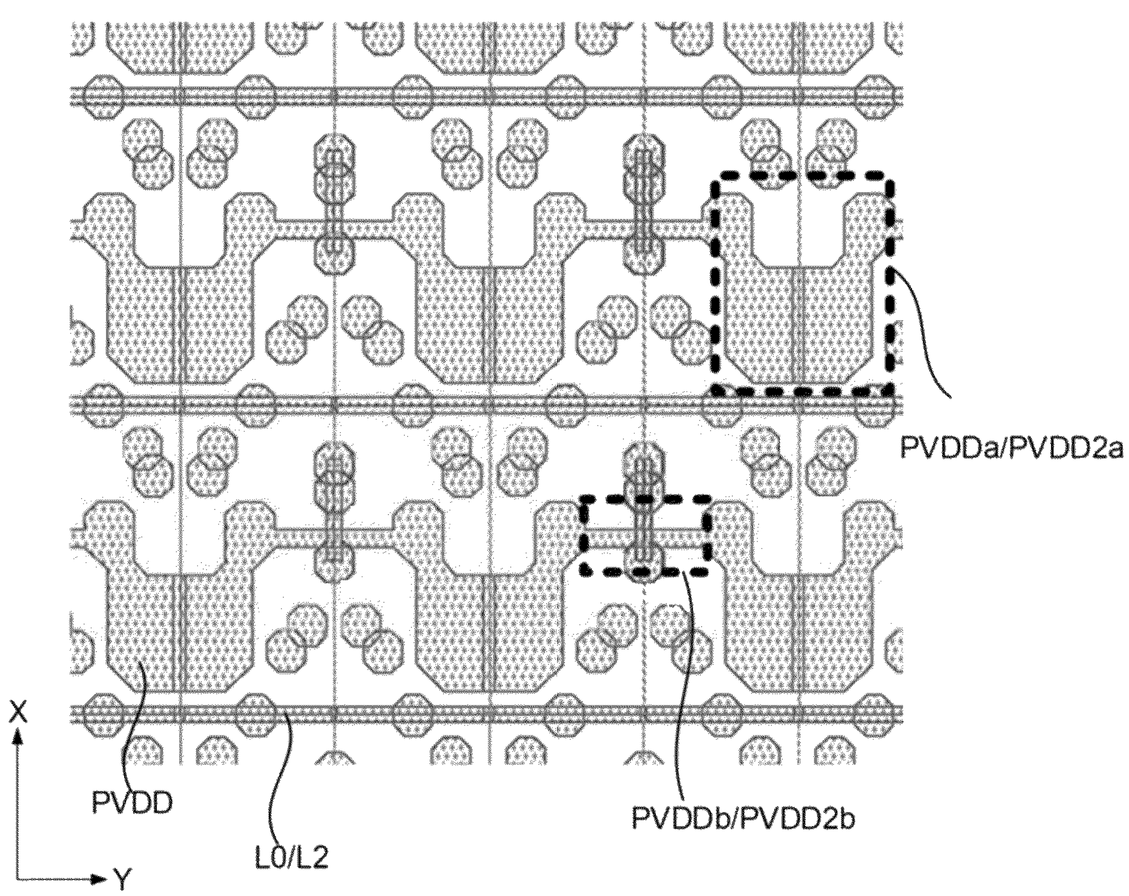
FIG. 25 is a schematic diagram illustrating a part of the structure of the display panel according to FIG. 17.
Figure 26:
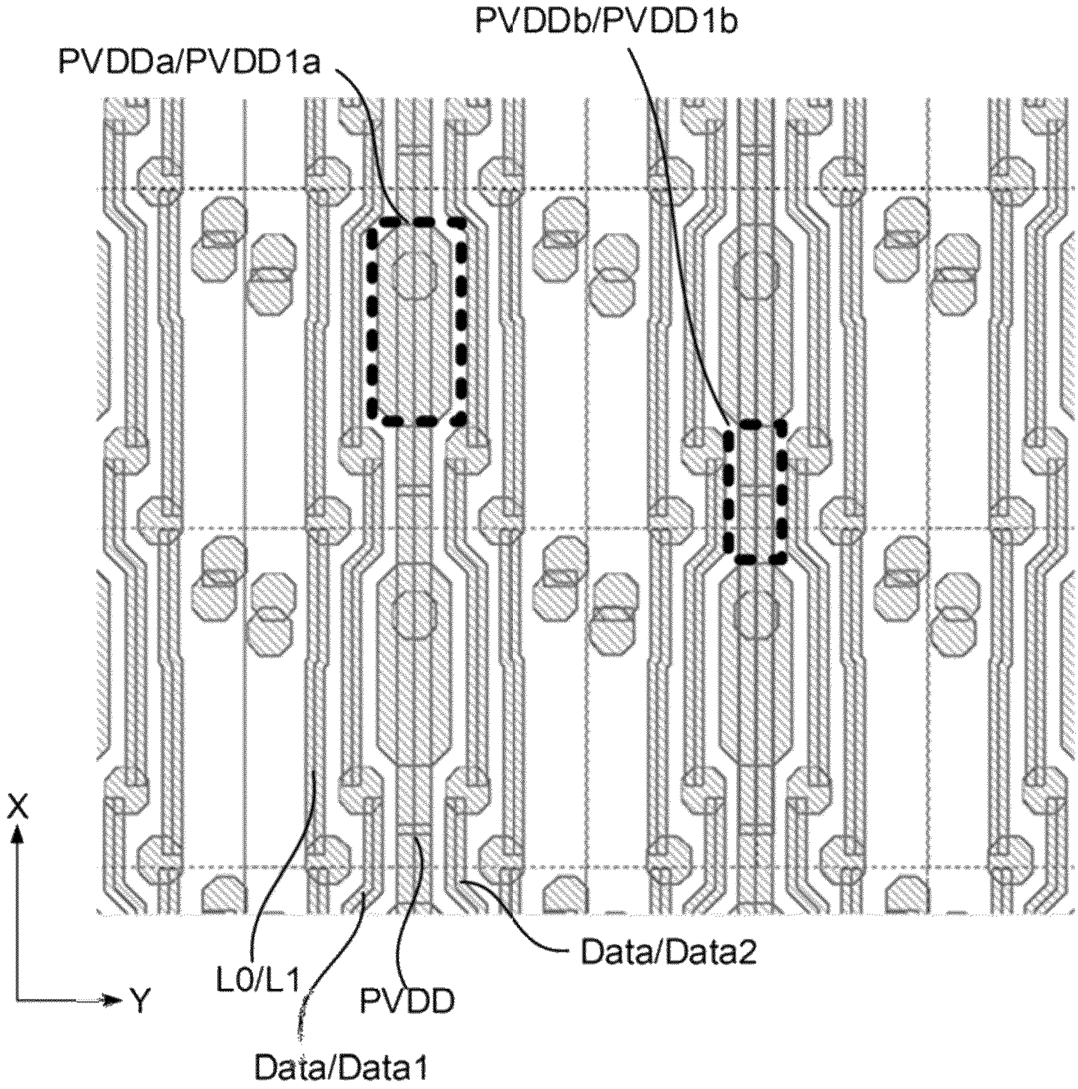
FIG. 26 is a schematic diagram illustrating a part of the structure of the another display panel according to FIG. 17.

FIG. 25 is a schematic diagram illustrating a part of the structure of the display panel according to FIG. 17. FIG. 26 is a schematic diagram illustrating a part of the structure of the another display panel according to FIG. 17. With reference to FIG. 6, FIG. 13, FIG. 14, FIG. 16, FIG. 17, FIG. 19, FIG. 20, FIG. 25, and FIG. 26, in the direction perpendicular to the plane in which substrate 300 is located, the first connection line segment L1 and the data signal line Data are disposed in the same layer, or the first connection line segment L1 is disposed on a side of the data signal line Data away from the substrate 300; the second connection line segment L2 and the first connection line segment L1 are disposed in the same layer or in two adjacent metal layers.

For example, the configuration locations of the first connection line segment L1 and the second connection line segment L2 of the connection wire L0 are flexible. The layer locations where the first connection line segment L1 and the second connection line segment L2 are located may be adjusted according to different layer arrangements of the display panel 10.

Illustratively, FIG. 6, FIG. 13, and FIG. 14 show one layer arrangement of the display panel 10; in the display panel 10, the first connection line segment L1 and the data signal line Data are disposed in the same layer. In an embodiment, in the display panel 10, the second connection line segment L2 and the first connection line segment L1 are disposed in two adjacent metal layers. With reference to FIG. 4, two adjacent metal layers are adjacent layers made of metal in the direction of the thickness of the display panel 10, such as the fourth metal layer M3 and the fifth metal layer M4, and an insulation layer 400 exists between adjacent metal layers. For example, the first connection line segment L1 may be disposed in the fourth metal layer M3, and the second connection line segment L2 may be disposed in the fifth metal layer M4. That is, the first connection line segment L1 is disposed on a side of the second connection line segment L2 closer to the substrate 300.

Illustratively, FIG. 17, FIG. 25, and FIG. 26 show one layer arrangement of the display panel 10; in the display panel 10, the first connection line segment L1 and the data signal line Data are also disposed in the same layer. In an embodiment, in the display panel 10, the second connection line segment L2 and the first connection line segment L1 are disposed in two adjacent metal layers. With reference to FIG. 4, two adjacent metal layers are adjacent layers made of metal in the direction of the thickness of the display panel 10, such as the fourth metal layer M3 and the fifth metal layer M4, and an insulation layer 400 exists between adjacent metal layers. In an embodiment, in the display panel 10, the first connection line segment L1 may be disposed in the fifth metal layer M4, and the second connection line segment L2 may be disposed in the fourth metal layer M3. That is, the first connection line segment L1 is disposed on a side of the second connection line segment L2 farther from the substrate 300.

Illustratively, FIG. 16, FIG. 19, and FIG. 20 show one layer arrangement of the display panel 10; in the display panel 10, the first connection line segment L1 and the data signal line Data are disposed in different layers; meanwhile, the second connection line segment L2 and the data signal line Data are also disposed in different layers. The first connection line segment L1 is disposed on a side of the data signal line Data close to the substrate 300. In an embodiment, in the display panel 10, the first connection line segment L1 and the second connection line segment L2 may be disposed in the same layer. For example, the connection wire L0 is disposed in the fifth metal layer M4.

With continued reference to FIG. 4, FIG. 6, FIG. 16, and FIG. 17, the display panel 10 also includes an organic insulation layer 410, a fourth metal layer M3, and a fifth metal layer M4 that are disposed between a layer in which the pixel driving circuit 100 is located and a layer in which the light-emitting element 200 is located; the fourth metal layer M3 is disposed on a side of the organic insulation layer 410 away from the pixel driving circuit 100; the fifth metal layer M4 is disposed on a side of the fourth metal layer M3 away from the pixel driving circuit 100; The data signal line Data is disposed in the fourth metal layer M3 or the fifth metal layer M4; the power signal line PVDD is disposed in the fourth metal layer M3 or the fifth metal layer M4.

For example, with reference to FIG. 4, the display panel 10 also includes an organic insulation layer 410, a fourth metal layer M3, and a fifth metal layer M4 that are disposed between the pixel driving circuit 100 and the light-emitting element 200. The organic insulation layer 410 is disposed between the fourth metal layer M3 and the fifth metal layer M4 to avoid a short circuit between the fourth metal layer M3 and the fifth metal layer M4.

In an embodiment, wires such as the data signal line Data and the power signal line PVDD may be disposed in the fourth metal layer M3 and/or the fifth metal layer M4. Illustratively, as shown in FIG. 6, FIG. 13, and FIG. 14, the data signal line Data and power signal line PVDD extending in the first direction X are disposed in the fourth metal layer M3, and the first connection line segment L1 is disposed in the fifth metal layer M3. In the figures, the power signal line PVDD extending in the second direction Y and the second connection line segment L2 are placed in the fifth metal layer M4. It can be understood that in this embodiment, the wires for transmitting the power signal are arranged in a layer between the pixel driving circuit 100 and the light-emitting element 200.

Illustratively, as shown in FIG. 16, FIG. 19, and FIG. 20, the data signal line Data and the power signal line PVDD extending in the first direction X are disposed in the fourth metal layer M3, and the first connection line segment L1 and the second connection line segment L2 are disposed in the fifth metal layer M4. In this embodiment, the wires of the power signal transmitted in the second direction Y may be disposed in the pixel driving circuit 100 and may be disposed in the second metal layer MC in the pixel driving circuit 100.

Illustratively, as shown in FIG. 17, FIG. 25, and FIG. 26, the data signal line Data and power signal line PVDD extending in the first direction X in the figures are disposed in the fourth metal layer M4, and the first connection line segment L1 is disposed in the fifth metal layer M4. In the figures, the power signal line PVDD extending in the second direction Y and the second connection line segment L2 are placed in the fourth metal layer M3. It can be understood that in this embodiment, the wires for transmitting the power signal are arranged in a layer between the pixel driving circuit 100 and the light-emitting element 200.

With continued reference to FIG. 6, FIG. 13, FIG. 16, FIG. 17, FIG. 19, and FIG. 26, the power signal line PVDD includes a first power signal line PVDD1 extending in the first direction X, and multiple first power signal lines PVDD1 are arranged in the second direction X; the first power signal line PVDD1 includes a first body portion PVDD1a and a first connection portion PVDD1b that are arranged in the first direction X, and the width of the first body portion PVDD1a in the second direction Y is greater than the width of the first connection portion PVDD1b in the second direction Y; in the direction perpendicular to the plane in which substrate 300 is located, the first anode **210*a*** at least partially overlaps the first body portion PVDD1a.

For example, with reference to FIG. 6, FIG. 16, and FIG. 17, the power signal line PVDD includes multiple first power signal lines PVDD1 extending in the first direction X, and the multiple first power signal lines PVDD1 are arranged in the second direction Y. It can be understood that in FIG. 6, FIG. 16, and FIG. 17, the first power signal line PVDD1 is a longitudinal power signal line PVDD in the figures.

In an embodiment, the power signal line PVDD includes a body portion PVDDa and a connection portion PVDDb. Correspondingly, the first power signal line PVDD1 includes a first body portion PVDD1a and a first connection portion PVDD1b. With continued reference to FIG. 13, FIG. 19, and FIG. 26, in the second direction Y, the width of the first body portion PVDD1a of the first power signal line PVDD1 is greater than the width of the first connection portion PVDD1b.

In an embodiment, with reference to FIG. 6 in contrast to FIG. 13, with reference to FIG. 16 in contrast to FIG. 19, and with reference to FIG. 17 in contrast to FIG. 25, it can be learned that the first anode **210*a* overlaps part of the wider first body portion PVDD1a, which can ensure the overlapping area of the first power signal line PVDD1 and the first anode 210*a* in the direction of the thickness of the display panel 10. In this manner, a flat design of the first anode 210*a* is better ensured; it is better ensured that the light emitted from the first light-emitting element 210 has a balanced optical path, and then the display effect of the display panel 10 is ensured. In an embodiment, it is ensured that the capacitance formed by the first anode 210*a* and the first body portion PVDD1a is more stable, thereby stabilizing the signal of the first anode 210***a*. Moreover, the signal interference from the data signal line Data or another wire to the first anode 210*a* is reduced.

With continued reference to FIG. 6, FIG. 13, FIG. 16, FIG. 17, FIG. 19, and FIG. 26, in the direction perpendicular to the plane in which substrate 300 is located, the first anode 210*a* at least partially overlaps the first connection portion PVDD1 b.

For example, in the first direction X, two ends of the first connection portion PVDD1b may be connected to two first body portions PVDD1a, and two ends of the first body portion PVDD1a may be connected to two first connection portions PVDD1b.

In an embodiment, with reference to FIG. 6 in contrast to FIG. 13, with reference to FIG. 16 in contrast to FIG. 19, and with reference to FIG. 17 in contrast to FIG. 25, it can be learned that the first anode 210*a* and part of the first connection portion PVDD1b also overlap. For example, reference is made to a region p1 in FIG. 6, a region p2 in FIG. 16, and a region p3 in FIG. 17. In other words, the first body portion PVDD1a and the first connection portion PVDD1b of the first power signal line PVDD1 overlap the first anode 210*a* in the direction of the thickness of the display panel 10 so that the adjustment of the flatness of the first anode 210*a* by the first power signal line PVDD1 is ensured. Moreover, it is ensured that the first power signal line PVDD1 effectively reduces the signal interference of the data signal line Data or another wire to the first anode 210*a*.

With continued reference to FIG. 6, FIG. 13, FIG. 16, and FIG. 19, the first body portion PVDD1a includes a main body portion PVDD1aa and a body transition portion PVDD1ab, the body transition portion PVDD1ab connects the main body portion PVDD1aa and the first connection portion PVDD1b, and in the second direction Y, the width of the body transition portion PVDD1ab is less than the width of the main body portion PVDD1aa and greater than the width of the first connection portion PVDD1b; in the direction perpendicular to the plane in which substrate 300 is located, the first anode 210*a* overlaps the body transition portion PVDD1ab.

For example, with reference to FIG. 13 and FIG. 19, the first body portion PVDD1a may include a main body portion PVDD1aa and a body transition portion PVDD1ab, and in the second direction Y, the width of the main body portion PVDD1aa is greater than the width of the body transition portion PVDD1ab. The body transition portion PVDD1ab, equivalent to a transition region in the first body portion PVDD1a, is configured to electrically connect PVDD1aa with a larger width in the second direction Y and the first connection portion PVDD1b to ensure the continuity of the first power signal line PVDD1.

In an embodiment, with reference to FIG. 6 in contrast to FIG. 13 and with reference to FIG. 16 in contrast to FIG. 19, it can be learned that the first anode 210*a* and part of the body transition portion PVDD1ab also overlap. For example, reference may be made to a region q1 in FIG. 6 and a region q2 in FIG. 16. In this manner, the overlapping area of the first power signal line PVDD1 and the first anode 210*a* in the direction of the thickness of the display panel 10 can be ensured so that a flat design of the first anode 210*a* can be ensured, which helps ensure that light emitted from the first light-emitting element 210 has a balanced optical path and ensure the display effect of the display panel 10. In an embodiment, the facing area of the first anode 210*a* and the first body portion PVDD1a is ensured, and the capacitance formed by the two is more stable, thereby stabilizing the signal of the first anode 210*a*. Moreover, the signal interference from the data signal line Data or another wire to the first anode 210*a* is reduced.

With continued reference to FIG. 6, FIG. 13, FIG. 16, and FIG. 19, in the second direction Y, the width of the data signal line Data is W1, the width of the main body portion PVDD1aa is W21, the width of the body transition portion PVDD1ab is W22, and the width of the first connection portion PVDD1b is W3, where $W21 \geq 4*W1$, $W22 \geq 1.5*W1$, and $W3 < 1.5W1$.

For example, with reference to FIG. 6 and FIG. 13 and with reference to FIG. 16 and FIG. 19, for the first power signal line PVDD1, in the arrangement direction of PVDD1, that is, in the second direction Y, the width of the main body portion PVDD1aa is greater than the width of the body transition portion PVDD1ab, the width of the body transition portion PVDD1ab is greater than the width of the first connection portion PVDD1b, and the width of the first connection portion PVDD1b is greater than the width of the data signal line Data.

For example, with reference to FIG. 13 and FIG. 19, in the second direction Y, the width of the data signal line Data is W1, the width of the main body portion PVDD1aa is W21, the width of the body transition portion PVDD1ab is W22, and the width of the first connection portion PVDD1b is W3; the width relationship satisfies the following: $W21 \geq 4*W1$, $W22 \geq 1.5*W1$, and $W3 < 1.5W1$.

In an embodiment, with reference to FIG. 13 and FIG. 19, for the first power signal line PVDD1, the width of the first power signal line PVDD1 in the second direction Y may be different in different locations because of a cross-layer requirement of another layer. Generally, by the limitation of the widths of the main body portion PVDD1aa and the body transition portion PVDD1ab of the first body portion PVDD1a and the width of the data signal line Data and by the limitation of the widths of the first connection portion PVDD1b and the data signal line Data, it is effectively ensured that the capacitance formed by the first anode 210*a* and the overlapping first power signal line PVDD1 is relatively large, and the signal of the first anode 210*a* is effectively stabilized. Meanwhile, the signal interference from the data signal line Data or another wire to the first anode 210*a* is reduced.

With continued reference to FIG. 6, FIG. 13, FIG. 16, and FIG. 19, the light-emitting element 200 also includes a second light-emitting element 220, and the color of light emitted by the second light-emitting element 220 is different from the color of light emitted by the first light-emitting element 210; the second light-emitting element 220 includes a second anode 220*a*, and in the direction perpendicular to the plane in which substrate 300 is located, the second anode 220*a* overlaps the main body portion PVDD1aa.

For example, the light-emitting element 200 includes a first light-emitting element 210 and a second light-emitting element 220, and the color of light emitted by the second light-emitting element 220 is different from the color of light emitted by the first light-emitting element 210. Illustratively, the first light-emitting element 210 may emit red light and blue light, and the second light-emitting element 220 may emit green light.

In an embodiment, the first light-emitting element 210 includes a first anode 210*a*, and the second light-emitting element 220 includes a second anode 220*a*. In the direction perpendicular to the plane in which the substrate 300 is located, the second anode 220*a* overlaps the main body portion PVDD1aa. In this manner, the overlapping area of the first power signal line PVDD1 and the second anode

220*a* in the direction of the thickness of the display panel 10 can be ensured so that a flat design of the second anode 220*a* can be ensured, which helps ensure that light emitted from the second light-emitting element 220 has a balanced optical path and ensure the display effect of the display panel 10. In an embodiment, it is ensured that the capacitance formed by the second anode 220*a* and the main body portion PVDD1aa is more stable, thereby stabilizing the signal of the second anode 220*a*. Moreover, the signal interference from the data signal line Data or another wire to the second anode 220*a* is reduced.

Illustratively, as shown in FIG. 6, FIG. 13, and FIG. 15, in the direction of the thickness of the display panel 10, the first anode 210*a* at least partially overlaps the first body portion PVDD1a (reference may be made to the region q1 in FIG. 6), and the second anode 220*a* at least partially overlaps the main body portion PVDD1aa (reference may be made to a region z1 in FIG. 6). With reference to FIG. 16 and FIG. 19, in the direction of the thickness of the display panel 10, the first anode 210*a* at least partially overlaps the first body portion PVDD1a (reference may be made to the region q2 in FIG. 16), and the second anode 220*a* at least partially overlaps the main body portion PVDD1aa (reference may be made to a region z2 in FIG. 16).

In conclusion, by the adjustment of the configuration location of the first power signal line PVDD1, it can be ensured that in the direction of the thickness of the display panel 10, both the first anode 210*a* and the second anode 220*a* have a certain overlapping region with the first power signal line PVDD1 so that a planarization design of the first light-emitting element 210 and the second light-emitting element 220 is ensured. Additionally, the influence of another wire on the light emission effect of the first light-emitting element 210 and the second light-emitting element 220 is avoided, and the overall display effect of the display panel 10 is ensured.

Figure 27:
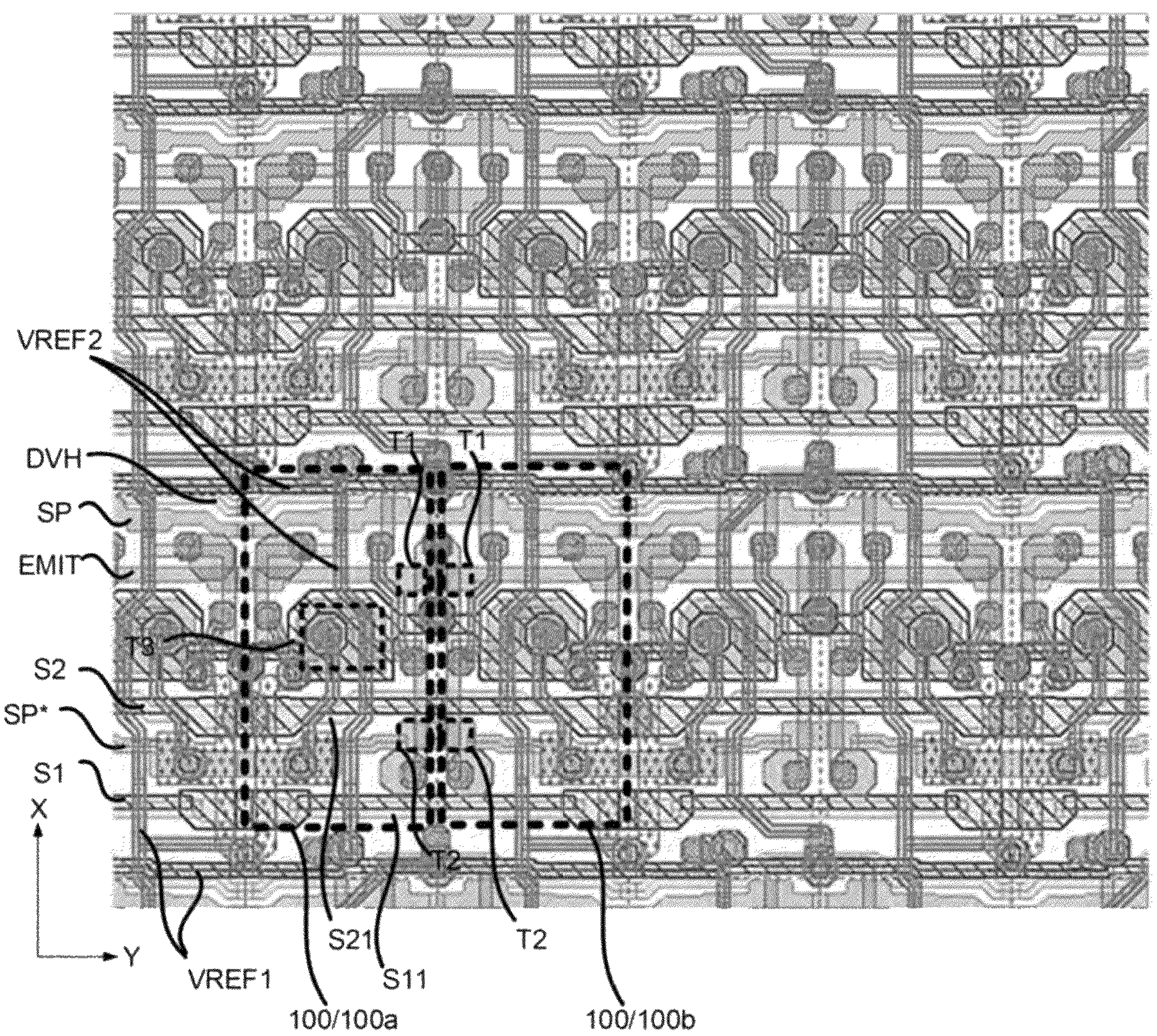
FIG. 27 is a diagram illustrating the structure of another display panel according to an embodiment of the present application.
Figure 28:
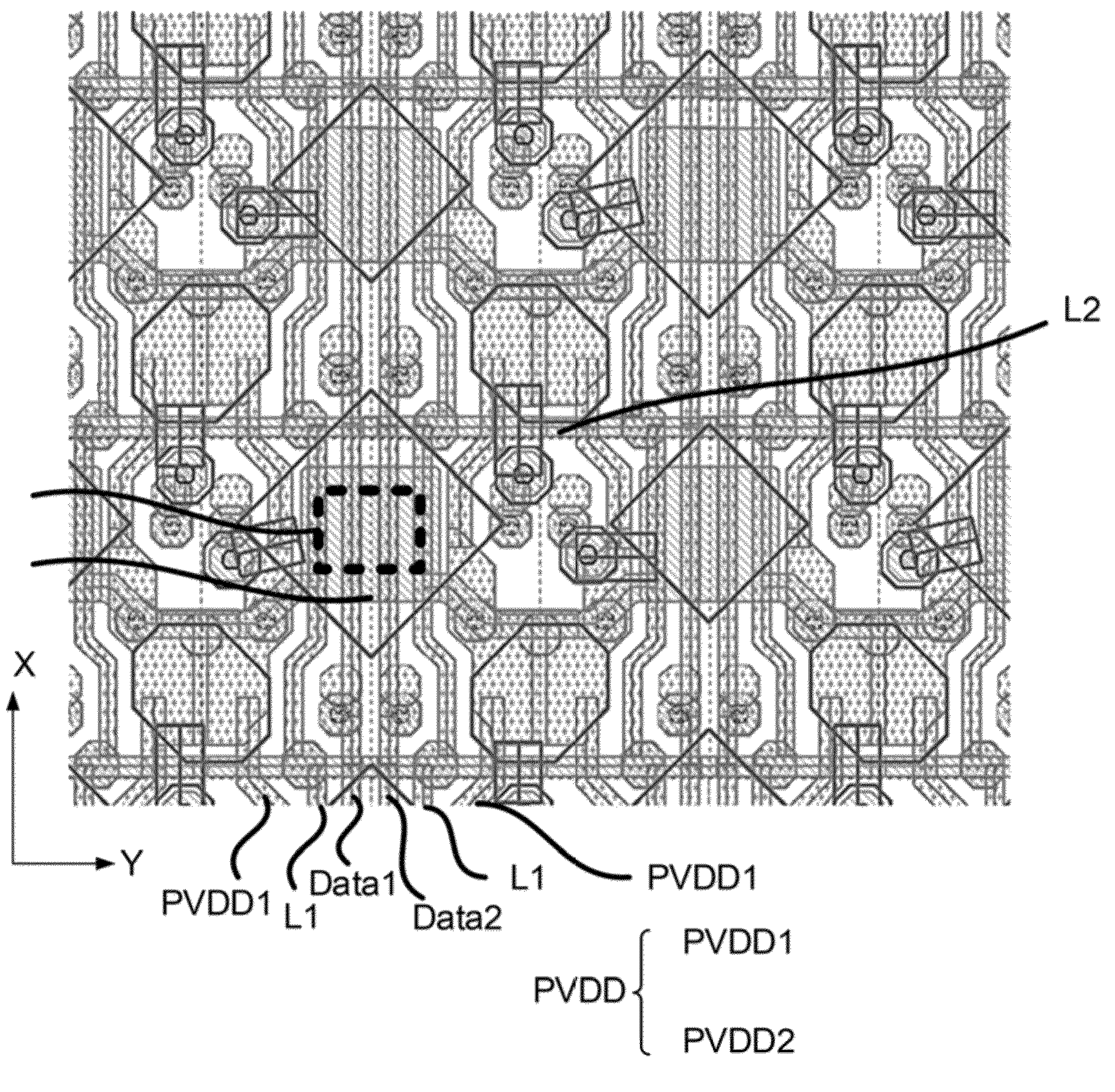
FIG. 28 is a diagram illustrating the structure of another display panel according to an embodiment of the present application.
Figure 29:
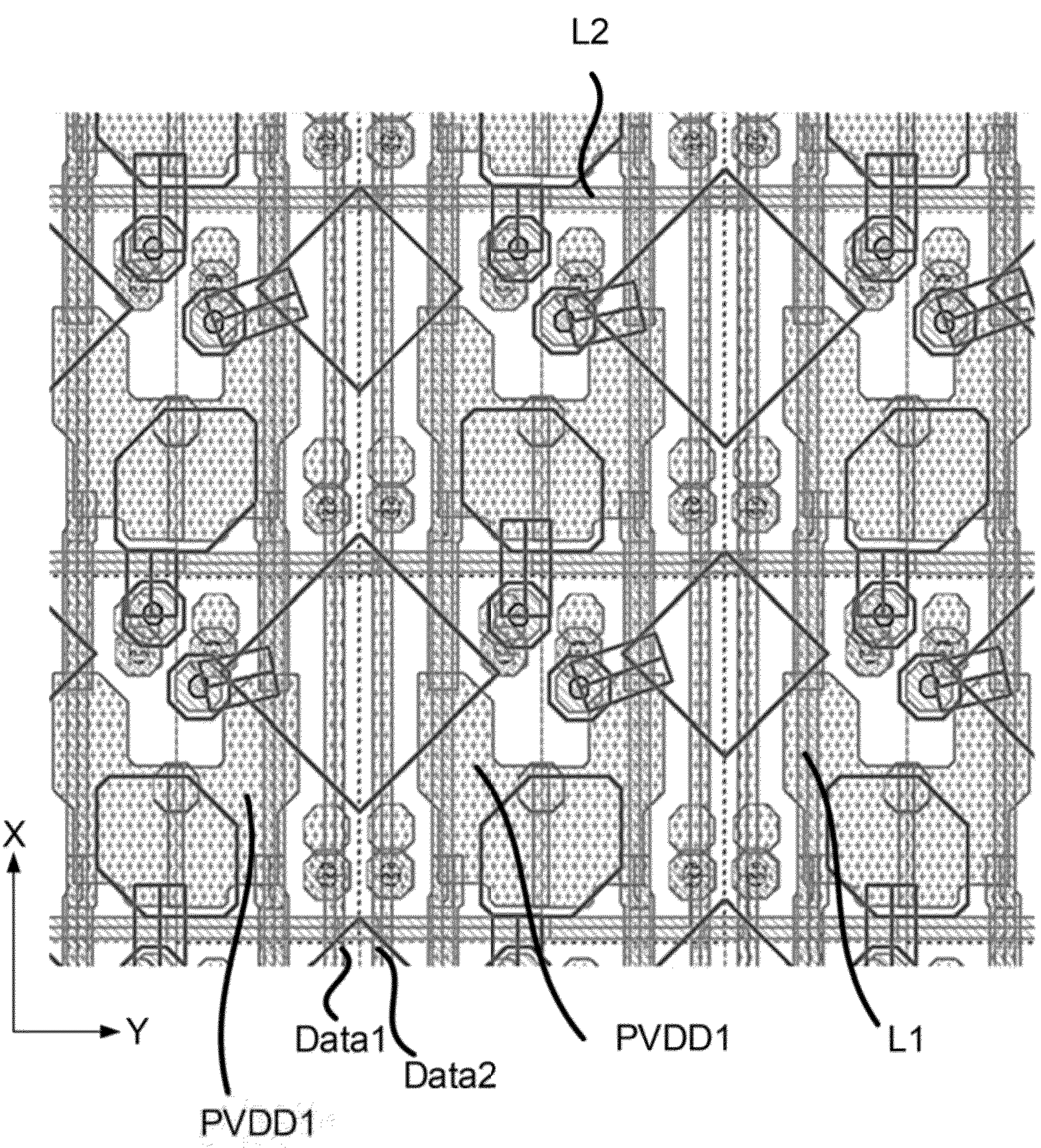
FIG. 29 is a diagram illustrating the structure of another display panel according to an embodiment of the present application.

FIG. 27 is a diagram illustrating the structure of another display panel according to an embodiment of the present application. FIG. 28 is a diagram illustrating the structure of another display panel according to an embodiment of the present application. FIG. 29 is a diagram illustrating the structure of another display panel according to an embodiment of the present application. With reference to FIG. 2, FIG. 13, FIG. 19, and FIG. 27 to FIG. 29, the first power signal line PVDD1 and the data signal line Data are disposed in the same layer; the pixel driving circuit 100 also includes a first light emission control transistor T1 coupled between the power signal line PVDD and a first electrode of the driving transistor T3; the pixel driving circuit 100 includes a first pixel driving circuit 100*a* arranged in the second direction Y and a second pixel driving circuit 100*b* arranged in the second direction Y, and a first light emission control transistor T1 of the first pixel driving circuit 100*a* and a first light emission control transistor T1 of the second pixel driving circuit 100*b* are electrically connected to the power signal line PVDD through the same via hole; the data signal line Data includes a first data signal line Data1 and a second data signal line Data2, the first data signal line Data1 is electrically connected to the data writing transistor T2 in the first pixel driving circuit 100*a*, and the second data signal line Data2 is electrically connected to the data writing transistor T2 in the second pixel driving circuit 100*b*; in the second direction Y, the first data signal line Data1 and the second data signal line Data2 are disposed between two adjacent first power signal lines PVDD1.

For example, as shown in FIG. 2, the pixel driving circuit 100 also includes a first light emission control transistor T1, and an input terminal of the first light emission control transistor T1 is electrically connected to the power signal line PVDD; when the first light emission control transistor T1 is turned on, the power signal transmitted by the power signal line PVDD may be transmitted to the driving transistor T3 through the first light emission control transistor T1.

In an embodiment, with reference to FIG. 27, the pixel driving circuit 100 includes a first pixel driving circuit 100*a* arranged in the second direction Y and a second pixel driving circuit 100*b* arranged in the second direction Y. It should be noted that FIG. 27 and FIG. 5 are the same drawing. To clearly see reference numerals, FIG. 27 shows the first pixel driving circuit 100*a* and the second pixel driving circuit 100*b*. FIG. 27 only shows the layers in the pixel driving circuit 100. The layers of the data signal line Data and at least part of the power signal line PVDD may be shown in FIGS. 28 and 29. Similarly, FIG. 28 and FIG. 6 are the same drawing; FIG. 29 and FIG. 16 are the same drawing, which are for the purpose of seeing the reference numerals more clearly.

For example, with reference to FIG. 27, FIG. 28, and FIG. 13, or with reference to FIG. 27, FIG. 29, and FIG. 19, the first power signal line PVDD1 and the first data signal line Data are disposed in the same layer. The first power signal line PVDD1 is configured to be electrically connected to the input terminal of the first light emission control transistor T1. The data signal line Data is configured to be electrically connected to the input terminal of the data writing transistor T2.

In an embodiment, with reference to FIG. 27, the first light emission control transistors T1 in the first pixel driving circuit 100*a* and the second pixel driving circuit 100*b* may be electrically connected to the power signal line PVDD through the same via.

Illustratively, as shown in FIG. 27 and FIG. 28, the two first light emission control transistors T1 in the first pixel driving transistor 100*a* and the second pixel driving transistor 100*b* may be electrically connected to the power signal line PVDD extending in the second direction Y at a region f1 in FIG. 28, that is, it is ensured that two first light emission control transistors T1 can be connected to an opposite power signal line PVDD through one via.

Illustratively, as shown in FIG. 27, FIG. 29, and FIG. 9, the power signal line PVDD extending in the first direction X in the display panel 10 is disposed in the fourth metal layer M3, and the power signal line PVDD extending in the second direction Y in the display panel 10 may be disposed in the second metal layer MC. The two first light emission control transistors T1 in the first pixel driving transistor 100*a* and the second pixel driving transistor 100*b* may be electrically connected to the power signal line PVDD extending in the second direction Y at a region f2 in FIG. 9, that is, it is ensured that two first light emission control transistors T1 can be connected to the opposite power signal line PVDD through one via.

In an embodiment, with reference to FIG. 27 and FIG. 28 or with reference to FIG. 27 and FIG. 29, the data signal line Data includes a first data signal line Data1 and a second data signal line Data2. For example, the first data signal line Data1 is electrically connected to the data writing transistor T2 in the first pixel driving circuit 100*a*, and the second data signal line Data2 is electrically connected to the data writing transistor T2 in the second pixel driving circuit 100*b*. With reference to FIG. 28 and FIG. 29, in the second direction Y, two data signal lines Data connected to the first pixel driving circuit 100*a* and the second pixel driving circuit 100*b* are disposed between two adjacent first power signal lines PVDD1. The relative positional relationship between the data signal line Data and the power signal line PVDD shown in FIG. 28 and FIG. 29 may be used as an example of the positional relationship between the data signal line Data and the power signal line PVDD in the display panel. The manner of arrangement can ensure that the data signal line Data and the power signal line PVDD are accommodated in the same layer and can also ensure that the connection between the data signal line Data and the power signal line PVDD and the pixel driving circuit is simple.

With continued reference to FIG. 6, FIG. 13, FIG. 14, and FIG. 15, the power signal line PVDD includes a second power signal line PVDD2 extending in the second direction Y, and multiple second power signal lines PVDD2 are arranged in the first direction X; the second power signal line PVDD2 includes a second body portion PVDD2a and a second connection portion PVDD2b that are arranged in the second direction Y, and the width of the second body portion PVDD2a in the first direction X is greater than the width of the second connection portion PVDD2b in the first direction X; in the direction perpendicular to the plane in which substrate 300 is located, the first anode 210*a* overlaps the second body portion PVDD2a.

For example, with reference to FIG. 6, FIG. 13, FIG. 14, and FIG. 15, the power signal line PVDD includes multiple second power signal lines PVDD2 extending in the second direction Y, and the multiple second power signal lines PVDD2 are arranged in the first direction X. It can be understood that in FIG. 6 and FIG. 14, the second power signal line PVDD2 is a longitudinal power signal line PVDD in the figures, and the second power signal line PVDD2 and the fifth metal layer M4 are disposed in the same layer.

In an embodiment, the power signal line PVDD includes a body portion PVDDa and a connection portion PVDDb. Correspondingly, the second power signal line PVDD2 includes a second body portion PVDD2a and a second connection portion PVDD2b. With continued reference to FIG. 14, in the first direction X, the width of the second body portion PVDD2a of the second power signal line PVDD2 is greater than the width of the second connection portion PVDD2b.

In an embodiment, with reference to FIG. 6 in contrast to FIG. 14, it can be learned that the first anode 210*a* overlaps the wider second body portion PVDD2a, which can ensure the overlapping area of the second power signal line PVDD2 and the first anode 210*a* in the direction of the thickness of the display panel 10. In this manner, a flat design of the first anode 210*a* is better ensured; it is better ensured that the light emitted from the first light-emitting element 210 has a balanced optical path, and then the display effect of the display panel 10 is ensured. In an embodiment, it is ensured that the capacitance formed by the first anode 210*a* and the second body portion PVDD2a is more stable, thereby stabilizing the signal of the first anode 210*a*. Moreover, the signal interference from the data signal line Data or another wire to the first anode 210*a* is reduced.

With continued reference to FIG. 6, FIG. 13, and FIG. 15, the second power signal line PVDD2 is disposed between a layer in which the data signal line Data is located and a layer in which the first anode 210*a* is located; in the direction perpendicular to the plane in which substrate 300 is located, the second body portion PVDD2a overlaps the data signal line Data.

For example, with reference to FIG. 12 and FIG. 14, the layer in which the second power signal line PVDD2 is located is disposed on a side of the layer in which the data signal line Data is located adjacent to the layer in which the first anode 210*a* is located. It can be understood that in the direction perpendicular to the plane in which substrate 300 is located, the second power signal line PVDD2 is disposed between a layer in which the first anode 210*a* is located and a layer in which the data signal line Data is located. In an embodiment, with reference to FIG. 6, the second body portion PVDD2a overlaps the data signal line Data, and the second power signal line PVDD2 may block the data signal line Data to a certain extent to avoid interference from the data signal line Data to the signal generated by the first anode 210*a*. Thus, the overall display effect of the display panel 10 is ensured.

With continued reference to FIG. 17, FIG. 25, and FIG. 26, the power signal lines PVDD also include a second power signal line PVDD2 extending in the second direction Y, and multiple second power signal lines PVDD2 are arranged in the first direction X; the second power signal line PVDD2 includes a second body portion PVDD2a and a second connection portion PVDD2b that are arranged in the second direction Y, and the width of the second body portion PVDD2a in the first direction X is greater than the width of the second connection portion PVDD2b in the first direction X; the light-emitting element 200 also includes a second light-emitting element 220, and the color of light emitted by the second light-emitting element 220 is different from the color of light emitted by the first light-emitting element 210; the second light-emitting element 220 includes a second anode 220*a*, and in the direction perpendicular to the plane in which substrate 300 is located, the second anode 220*a* overlaps the second body portion PVDD2a.

For example, with reference to FIG. 17, FIG. 25, and FIG. 26, the power signal line PVDD also includes multiple second power signal lines PVDD2 extending in the second direction Y, and the multiple second power signal lines PVDD2 are arranged in the first direction X. It can be understood that in FIG. 17 and FIG. 25, the second power signal line PVDD2 is a transverse power signal line PVDD in the figures, and the second power signal line PVDD2 and the fourth metal layer M3 are disposed in the same layer.

In an embodiment, the power signal line PVDD includes a body portion PVDDa and a connection portion PVDDb. Correspondingly, the second power signal line PVDD2 includes a second body portion PVDD2a and a second connection portion PVDD2b. With continued reference to FIG. 25, in the first direction X, the width of the second body portion PVDD2a of the second power signal line PVDD2 is greater than the width of the second connection portion PVDD2b.

For example, the light-emitting element 200 includes a first light-emitting element 210 and a second light-emitting element 220, and the color of light emitted by the second light-emitting element 220 is different from the color of light emitted by the first light-emitting element 210. Illustratively, the first light-emitting element 210 may emit red light and blue light, and the second light-emitting element 220 may emit green light. In an embodiment, the first light-emitting element 210 includes a first anode 210*a*, and the second light-emitting element 220 includes a second anode 210*b*. With reference to FIG. 7 and FIG. 25, in the direction perpendicular to the plane in which the substrate 300 is located, the second anode 220*a* overlaps the second body portion PVDD2a. In this manner, the overlapping area of the second power signal line PVDD2 and the second anode 220*a* in the direction of the thickness of the display panel 10 can be ensured so that a flat design of the second anode 220*a* can be ensured, which helps ensure that light emitted from the second light-emitting element 220 has a balanced optical path and ensure the display effect of the display panel 10. In an embodiment, it is ensured that the capacitance formed by the second anode 220*a* and the second body portion PVDD2a is more stable, thereby stabilizing the signal of the second anode 220*a*. Moreover, the signal interference from the data signal line Data or another wire to the second anode 220*a* is reduced.

In an embodiment, with reference to FIG. 16, FIG. 25, and FIG. 26, the second power signal line PVDD2 is disposed on a side of the data signal line Data close to the substrate 300.

For example, with reference to FIG. 16, FIG. 25, and FIG. 26, the first power signal line PVDD1 may be disposed in the same layer as the data signal line Data. Illustratively, the first power signal line PVDD1 and the data signal line Data may both be disposed in the fifth metal layer M4. In an embodiment, the second power signal line PVDD2 may be disposed on a side of the data signal line Data close to the substrate 300. Illustratively, the second power signal line PVDD2 is disposed in the fourth metal layer M3. In other words, the first power signal line PVDD1 and the second power signal line PVDD2 are disposed in different layers.

Figure 30:
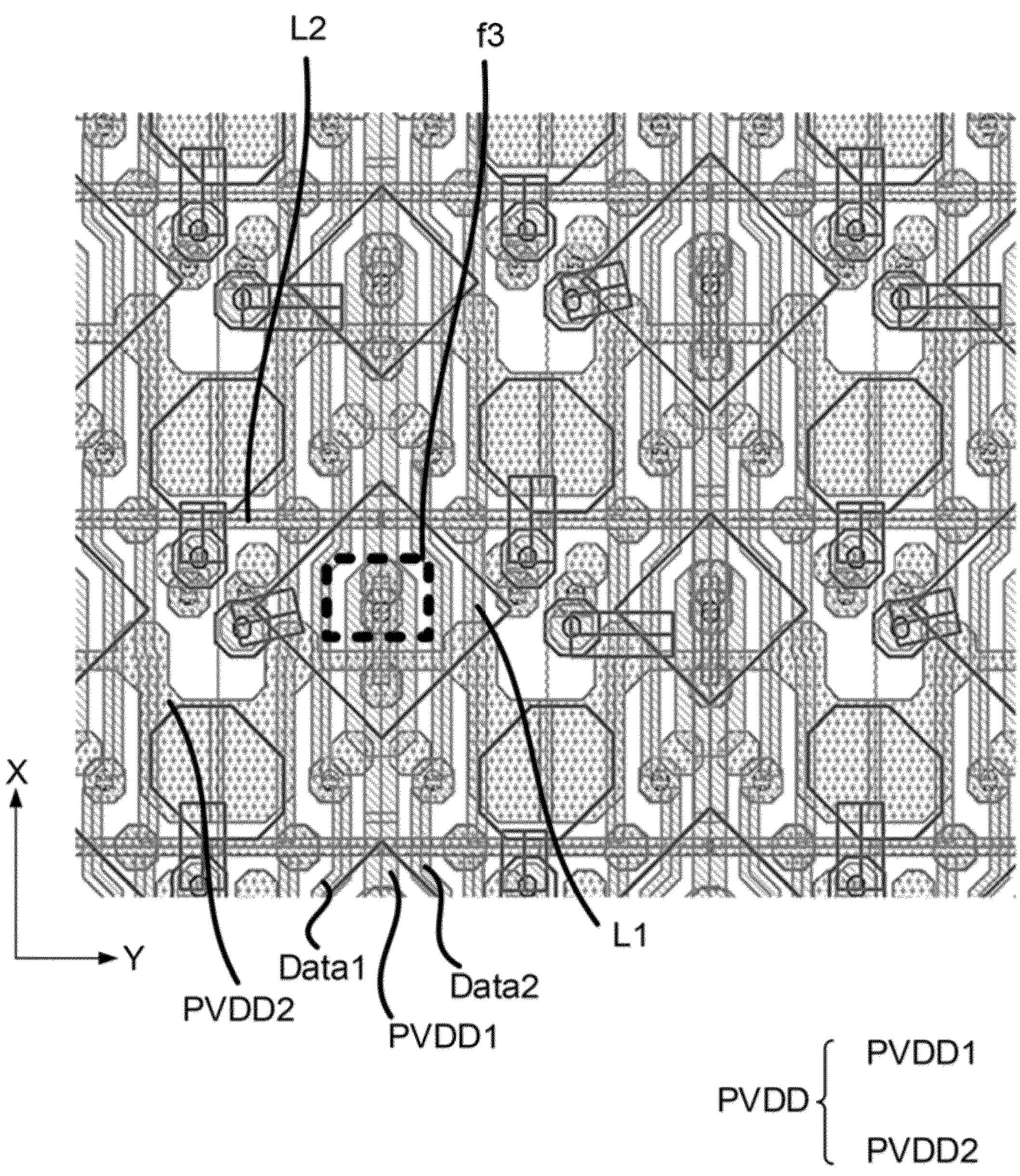
FIG. 30 is a diagram illustrating the structure of another display panel according to an embodiment of the present application.

FIG. 30 is a diagram illustrating the structure of another display panel according to an embodiment of the present application. With continued reference to FIG. 2, FIG. 26, FIG. 27, and FIG. 30, the first power signal line PVDD1 and the data signal line Data are disposed in the same layer; the pixel driving circuit 100 also includes a first light emission control transistor T1 coupled between the power signal line PVDD and a first electrode of the driving transistor T3; the pixel driving circuit 100 includes a first pixel driving circuit 100*a* arranged in the second direction Y and a second pixel driving circuit 100*b* arranged in the second direction Y, and a first light emission control transistor T1 of the first pixel driving circuit 100*a* and a first light emission control transistor T1 of the second pixel driving circuit 100*b* are electrically connected to the power signal line PVDD through the same via hole; the data signal line Data includes a first data signal line Data1 and a second data signal line Data2, the first data signal line Data1 is electrically connected to the data writing transistor T2 in the first pixel driving circuit 100*a*, and the second data signal line Data2 is electrically connected to the data writing transistor T2 in the second pixel driving circuit 100*b*; in the second direction Y, the first power signal line PVDD1 is disposed between the first data signal line Data1 and the second data signal line Data2.

For example, as shown in FIG. 2, the pixel driving circuit 100 also includes a first light emission control transistor T1, and an input terminal of the first light emission control transistor T1 is electrically connected to the power signal line PVDD; when the first light emission control transistor T1 is turned on, the power signal transmitted by the power signal line PVDD may be transmitted to the driving transistor T3 through the first light emission control transistor T1.

In an embodiment, with reference to FIG. 27, the pixel driving circuit 100 includes a first pixel driving circuit 100*a* arranged in the second direction Y and a second pixel driving circuit 100*b* arranged in the second direction Y. It should be noted that FIG. 27 and FIG. 5 are the same drawing. To clearly see reference numerals, FIG. 27 shows the first pixel driving circuit 100*a* and the second pixel driving circuit 100*b*. FIG. 27 only shows the layers in the pixel driving circuit 100. The layers of the data signal line Data and at least part of the power signal line PVDD may be shown in FIG. 30. Similarly, FIG. 30 and FIG. 17 are the same drawing, which is also for the purpose of seeing the reference numerals more clearly.

For example, with reference to FIG. 27, FIG. 26, and FIG. 30, the first power signal line PVDD1 and the first data signal line Data are disposed in the same layer. The first power signal line PVDD1 is configured to be electrically connected to the input terminal of the first light emission control transistor T1. The data signal line Data is configured to be electrically connected to the input terminal of the data writing transistor T2.

Illustratively, as shown in FIG. 27, FIG. 26, and FIG. 30, the power signal line PVDD extending in the first direction X in the display panel 10 is disposed in the fifth metal layer M4, and the power signal line PVDD extending in the second direction Y in the display panel 10 may be disposed in the fourth metal layer M3. The two first light emission control transistors T1 in the first pixel driving transistor 100*a* and the second pixel driving transistor 100*b* may be electrically connected to the power signal line PVDD extending in the first direction X at a region f3 in FIG. 30, that is, it is ensured that two first light emission control transistors T1 can be connected to the opposite power signal line PVDD through one via.

In an embodiment, with reference to FIG. 27 and FIG. 30, the data signal line Data includes a first data signal line Data1 and a second data signal line Data2. For example, the first data signal line Data1 is electrically connected to the data writing transistor T2 in the first pixel driving circuit 100*a*, and the second data signal line Data2 is electrically connected to the data writing transistor T2 in the second pixel driving circuit 100*b*. With reference to FIG. 30, in the second direction Y, a first power supply signal line PVDD1 is disposed between the two data signal lines Data connected to the first pixel driving circuit 100*a* and the second pixel driving circuit 100*b*. It can be understood that by the configuration position of the first power signal line PVDD1, the facing area between the first anode 210*a* and the data signal line Data can be reduced, and then the signal interference of the data signal line Data to the first anode 210*a* is weakened. Thus, the display effect of the display panel 10 is ensured. Moreover, the relative positional relationship between the data signal line Data and the power signal line PVDD shown in FIG. 30 may be used as an example of the positional relationship between the data signal line Data and the power signal line PVDD in the display panel. The manner of arrangement can ensure that the data signal line Data and the power signal line PVDD are accommodated in the same layer and can also ensure that the connection between the data signal line Data and the power signal line PVDD and the pixel driving circuit is simple.

With continued reference to FIG. 2, FIG. 9, and FIG. 12, the pixel driving circuit 100 also includes an initialization transistor T5; the signal line 101 also includes an initialization signal line VREF1; the initialization transistor T5 is coupled between the initialization signal line VREF1 and the gate of the driving transistor T3; the initialization signal line VREF1 includes a first initialization signal line VREF1a extending in the second direction Y and arranged in the first direction X and a second initialization signal line VREF1b extending in the first direction X and arranged in the second direction Y, and the first initialization signal line VREF1a and the second initialization signal line VREF1b are disposed in different layers and electrically connected.

For example, with reference to FIG. 2, the pixel driving circuit 100 includes an initialization transistor T5, and an input terminal of the initialization transistor T5 is connected to the initialization signal line VREF1. When the initialization transistor T5 is turned on, the initialization signal provided by the initialization signal line VREF1 is transmitted to the driving transistor T3 to initialize the gate of the driving transistor T3.

For example, with reference to FIG. 9 and FIG. 12, the initialization signal line VREF1 includes a first initialization signal line VREF1a and a second initialization signal line VREF1b, and the first initialization signal line VREF1a and the second initialization signal line VREF1b are disposed in different layers to form an initialization signal line VREF1 of a double-layer mesh structure. In this manner, the voltage drop in the initialization signal line VREF1 is effectively alleviated, and the transmission effect of the initialization signal is ensured. Illustratively, the first initialization signal line VREF1a may be disposed in the second metal layer MC, and the second initialization signal line VREF1b may be disposed in the third metal layer M2. The specific configuration locations of layers are not specifically limited in this embodiment of the present application.

With continued reference to FIG. 2, FIG. 4, FIG. 8, FIG. 9, and FIG. 12, the display panel 10 includes a first metal layer M1, a second metal layer MC, and a third metal layer M2 that are disposed on a side of the substrate 300; the second metal layer MC is disposed on a side of the first metal layer M1 away from the substrate 300, the third metal layer M2 is disposed on a side of the second metal layer MC away from the substrate 300, and the data signal line Data is disposed on a side of the third metal layer M2 away from the substrate 300; the gate of the driving transistor T3 is disposed in the first metal layer M1; the first initialization signal line VREF1a is disposed in the second metal layer MC; the second initialization signal line VREF1b is disposed in the third metal layer M2.

For example, as shown in FIG. 4, the display panel 10 includes multiple metal layers on a side of the substrate 300, for example, the first metal layer M1, the second metal layer MC, and the third metal layer M2. The data signal line Data is disposed on a side of the third metal layer M2 away from the substrate 300. The data signal line Data may be disposed in a fourth metal layer M3 (referring to FIG. 6 and FIG. 16) or may be disposed in the fifth metal layer M4 (referring to FIG. 17). In an embodiment, with reference to FIG. 8, the gate of the driving transistor T3 is disposed in the first metal layer M1, that is, a signal for controlling the driving transistor T3 to be turned on and off may be transmitted to the driving transistor T3 through the first metal layer M1. For the initialization signal line VREF1, with reference to FIG. 9, the first initialization signal line VREF1a is disposed in the second metal layer MC; with reference to FIG. 12, the second initialization signal line VREF1b is disposed in the third metal layer M2. The first initialization signal line VREF1a and the second initialization signal line VREF1b whose extension directions intersect are disposed in different layers, which reflects a double-layer mesh structure of the initialization signal line VREF1, effectively alleviates a voltage drop in the initialization signal line VREF1, and ensures the transmission effect of the initialization signal.

With continued reference to FIG. 2, FIG. 9, and FIG. 12, the pixel driving circuit 100 also includes a reset transistor T7; the signal line 101 also includes a reset signal line VREF2; the reset transistor T7 is coupled between the reset signal line VREF2 and the light-emitting element 200; the reset signal line VREF2 includes a first reset signal line VREF2a extending in the second direction Y and arranged in the first direction X and a second reset signal line segment VREF2b extending in the first direction X and arranged in the second direction Y, and the first reset signal line VREF2a and the second reset signal line segment VREF2b are disposed in different layers and are electrically connected.

For example, with reference to FIG. 2, the pixel driving circuit 100 includes a reset transistor T7, and an input terminal of the reset transistor T7 is connected to the reset signal line VREF2. When the reset transistor T7 is turned on, the reset signal provided by the reset signal line VREF2 is transmitted to the light-emitting element 200 to reset the anode of the light-emitting element 200.

For example, with reference to FIG. 9 and FIG. 12, the reset signal line VREF2 includes a first reset signal line VREF2a and a second reset signal line segment VREF2b, and the first reset signal line VREF2a and the second reset signal line segment VREF2b are disposed in different layers to form a reset signal line VREF2 of a double-layer mesh structure. In this manner, the voltage drop in the reset signal line VREF2 is effectively alleviated, and the transmission effect of the reset signal is ensured. Illustratively, the first reset signal line VREF2a is disposed in the second metal layer MC, and the second reset signal line segment VREF2b is disposed in the third metal layer M2. The specific configuration locations of layers are not specifically limited in this embodiment of the present application.

With continued reference to FIG. 2, FIG. 9, and FIG. 12, the pixel driving circuit 100 also includes an initialization transistor T5 and a reset transistor T7; the signal line 101 also includes an initialization signal line VREF1 and a reset signal line VREF2; the initialization transistor T5 is coupled between the initialization signal line VREF1 and the gate of the driving transistor T3; the reset transistor T7 is coupled between the reset signal line VREF2 and the light-emitting element 200; the initialization signal line VREF1 includes a first initialization signal line VREF1a extending in the second direction Y and arranged in the first direction X, and the reset signal line VREF2 includes a first reset signal line VREF2a extending in the second direction Y and arranged in the first direction X; in the first direction X, the first initialization signal line VREF1a and the first reset signal line VREF2a are arranged alternately in sequence.

For example, the pixel driving circuit 100 includes an initialization transistor T5 and a reset transistor T7, and an input terminal of the initialization transistor T5 is connected to the initialization signal line VREF1. When the initialization transistor T5 is turned on, the initialization signal provided by the initialization signal line VREF1 is transmitted to the driving transistor T3 to initialize the gate of the driving transistor T3; the input terminal of the reset transistor T7 is connected to the reset signal line VREF2. When the reset transistor T7 is turned on, the reset signal provided by the reset signal line VREF2 is transmitted to the light-emitting element 200 to reset the light-emitting element 200.

For example, with reference to FIG. 9, the initialization signal line VREF1 includes a first initialization signal line VREF1a, and the reset signal line VREF2 includes a first reset signal line VREF2a. The first initialization signal line VREF1a and the first reset signal line VREF2a extend in the second direction Y and are arranged in the first direction X. In an embodiment, with reference to FIG. 9, the first initialization signal line VREF1 and the first reset signal line VREF2 are arranged alternately, and the first initialization signal line VREF1 and the first reset signal line VREF2 may also be disposed in the same metal layer, ensuring that layers in the display panel 10 are arranged simply.

With continued reference to FIG. 2, FIG. 11, and FIG. 12, the pixel driving circuit 100 also includes a bias transistor T8; the signal line 101 also includes a bias voltage signal line DVH; the bias transistor T8 is coupled between the bias voltage signal line DVH and the driving transistor T3; the bias voltage signal line DVH includes a first bias signal line DVH1 extending in the second direction Y and arranged in the first direction X and a second bias voltage signal line segment DVH2 extending in the first direction X and arranged in the second direction Y, and the first bias voltage signal line DVH1 and the second bias voltage signal line segment DVH2 are arranged in different layers and electrically connected.

For example, the pixel driving circuit 100 also includes one bias transistor T8. The scan signal line SP controls the turn-on or turn-off of the bias transistor T8, and when the bias transistor T8 is turned on, bias adjustment is performed on the driving transistor T3, that is, the bias signal of a bias voltage signal line DVH is transmitted to the bias transistor T8, and bias adjustment is performed on the connection node (second node N2) of the driving transistor T3, the first light emission control transistor T1, and the data writing transistor T2 to ensure the working stability of the driving transistor T3.

Before the gate of the driving transistor T3 is reset, the bias voltage provided by the bias voltage signal line DVH may be written to the first electrode of the driving transistor T3, and the potential of the first electrode of the driving transistor T3 is refreshed so that the component characteristic of the driving transistor T3 is set to a determined initial state, and the influence of the data signal written in the previous frame on the component characteristics of the driving transistor T3 is eliminated. For example, after the data signal is written to the driving transistor T3, electricity leakage may occur to the voltage of the first electrode of the driving transistor T3, which causes a large deviation in the potential of the first electrode of the driving transistor T3. In this case, the bias transistor T8 is controlled to be turned on and is used for writing the bias voltage to the first electrode of the driving transistor T3 so that the bias state of the driving transistor T3 can be maintained consistent with the bias state at the time of writing the data signal. In this manner, the stability of the working state of the driving transistor T3 is improved.

For example, the bias voltage signal line DVH includes a first bias voltage signal line DVH1 and a second bias voltage signal line segment DVH2, and the first bias voltage signal line DVH1 and the second bias voltage signal line segment DVH2 are disposed in different layers and are electrically connected. By the configuration of two layers of bias voltage signal lines DVH, the voltage drop in the bias voltage signal line DVH is effectively alleviated, and the transmission effect of the bias voltage is ensured. Illustratively, with reference to FIG. 11, the first bias voltage signal line DVH1 may be disposed in the same layer as the first gate layer MG. With reference to FIG. 12, the second bias voltage signal line segment DVH2 may be disposed in the same layer as the third metal layer M2.

With continued reference to FIG. 2 and FIG. 12, the pixel driving circuit 100 also includes an initialization transistor T5, a reset transistor T7, and a bias transistor T8; the signal line 101 also includes an initialization signal line VREF1, a reset signal line VREF2, and a bias voltage signal line DVH; the initialization transistor T5 is coupled between the initialization signal line VREF1 and the gate of the driving transistor T3; the reset transistor T7 is coupled between the reset signal line VREF2 and the light-emitting element 200; the bias transistor T8 is coupled between the bias voltage signal line DVH and the driving transistor T3; the initialization signal line VREF1 includes a second initialization signal line VREF1b extending in the first direction X and arranged in the second direction Y, the reset signal line VREF2 includes a second reset signal line segment VREF2b extending in the first direction X and arranged in the second direction Y, and the bias voltage signal line DVH includes a second bias voltage signal line segment DVH2 extending in the first direction X and arranged in the second direction Y; the second initialization signal line VREF1b, the second reset signal line segment VREF2b, and the second bias voltage signal line segment DVH2 are disposed in the same layer; in the first direction X, the second reset signal line segment VREF2b and the second bias voltage signal line segment DVH2 are arranged alternately in sequence; in the second direction Y, the second reset signal line segment VREF2b and the second bias voltage signal line segment DVH2 are arranged alternately in sequence, and the second initialization signal line VREF1b is disposed between the second reset signal line segment VREF2b and the second bias voltage signal line segment DVH2.

For example, the pixel driving circuit 100 also includes an initialization transistor T5, a reset transistor T7, and a bias transistor T8 besides a driving transistor T3. The initialization transistor T5 is configured to initialize the gate of the driving transistor T3. The reset transistor T7 is configured to reset the anode of the light-emitting element 200. The bias transistor T8 is configured to perform bias adjustment on the driving transistor T3. Thus, the stable operation of the driving transistor T3 is ensured.

In an embodiment, the initialization signal line VREF1 electrically connected to the initialization transistor T5 includes a second initialization signal line VREF1b; the reset signal line VREF2 electrically connected to the reset transistor T7 includes the second reset signal line segment VREF2b; the bias voltage signal line DVH electrically connected to the bias transistor T8 includes a second bias voltage signal line segment DVH2. Illustratively, with reference to FIG. 12, the second initialization signal line VREF1b, the second reset signal line segment VREF2b, and the second bias voltage signal line segment DVH2 all extend in the first direction X, and multiple wires are arranged in the second direction Y. In an embodiment, the second initialization signal line VREF1b, the second reset signal line segment VREF2b, and the second bias voltage signal line segment DVH2 may be disposed in the same layer and may be disposed in the third metal layer M2, as shown in FIG. 12.

In an embodiment, with continued reference to FIG. 12, the second initialization signal line VREF1b, the second reset signal line segment VREF2b, and the second bias voltage signal line segment DVH2 all extend in the first direction X, and the second reset signal line segment VREF2b and the second bias voltage signal line segment DVH2 are arranged alternately in sequence. In an embodiment, in the second direction Y, the second reset signal line segment VREF2b and the second bias voltage signal line segment DVH2 are arranged in sequence. It can be understood that in the second direction Y, wires may sequentially be a second initialization signal line VREF1b, a second reset signal line segment VREF2b, a second bias voltage signal line segment DVH2, a second initialization signal line VREF1b, a second bias voltage signal line segment DVH2, and a second reset signal line segment VREF2b. Generally, the partially staggered arrangement of the reset signal line VREF2, the initialization signal line VREF1, and the bias voltage signal line DVH is reflected, and then the flexible configuration of the wires in the display panel 10 is reflected.

Figure 31:
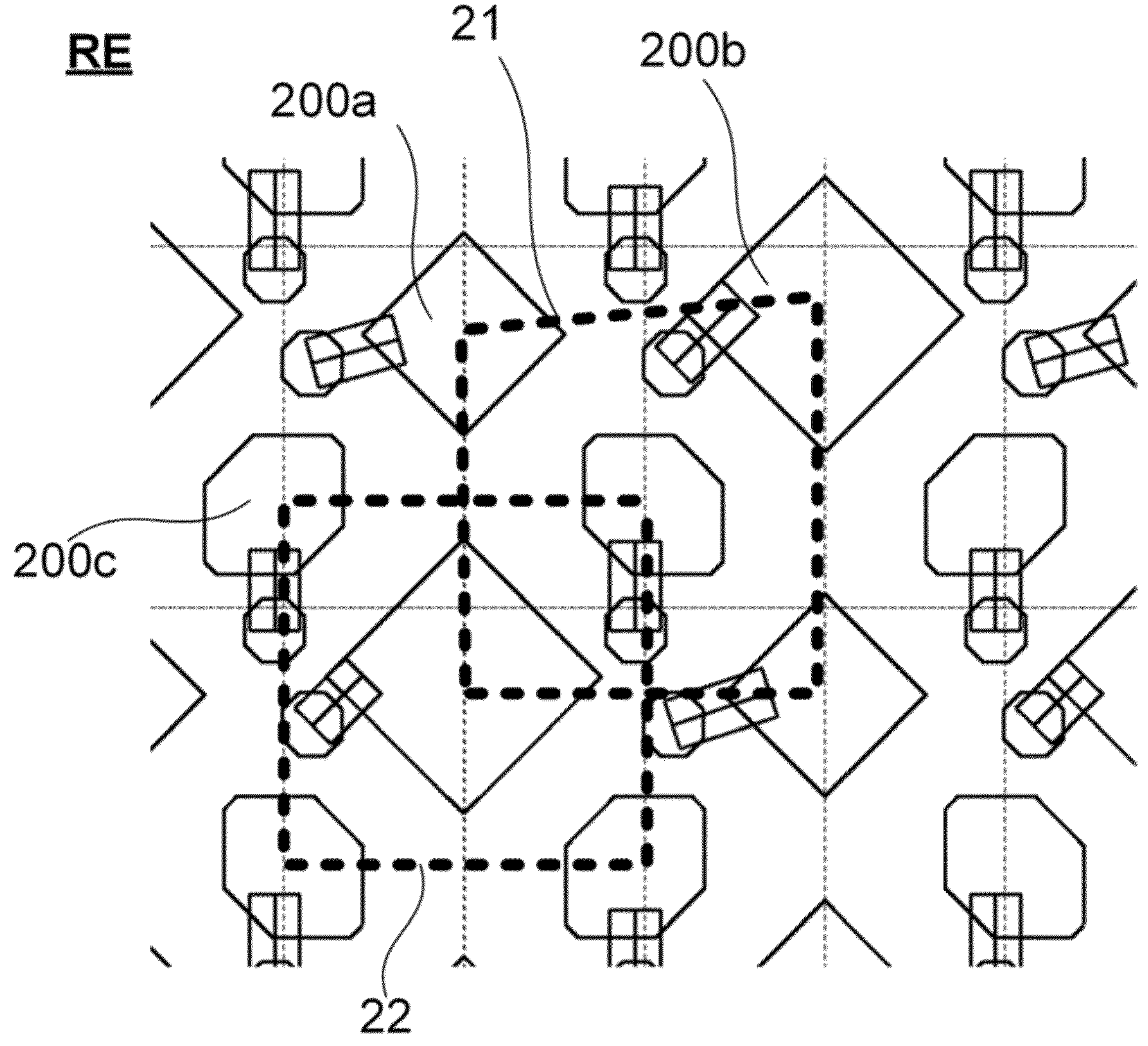
FIG. 31 is a schematic diagram illustrating the arrangement of light-emitting elements of a display panel according to an embodiment of the present application.

FIG. 31 is a schematic diagram illustrating the arrangement of light-emitting elements of a display panel according to an embodiment of the present application. With reference to FIG. 31, the first light-emitting element 210 includes a first color light-emitting element 200*a* and a second color light-emitting element 200*b*; the light-emitting element 200 also includes a second light-emitting element 220, and the second light-emitting element 220 includes a third color light-emitting element 200*c*; the first color light-emitting element 200*a*, the second color light-emitting element 200*b*, and the third color light-emitting element 200*c* are one of a red light-emitting element, a blue light-emitting element, or a green light-emitting element and are different in colors; multiple first color light-emitting elements 200*a* and multiple second color light-emitting elements 200*b* constitute a first virtual quadrangle 21, the first color light-emitting element 200*a* is disposed at a first vertex of the first virtual quadrangle 21, the center of the second color light-emitting element 200*b* is disposed at a second vertex of the first virtual quadrangle 21, the first vertex and the second vertex are alternately arranged and spaced apart, and the third color light-emitting element 200*c* is disposed inside the first virtual quadrangle 21; multiple third color light-emitting elements 200*c* constitute a second virtual quadrangle 22, centers of the multiple third color light-emitting elements 200*c* are disposed at vertices of the second virtual quadrangle 22, and the first color light-emitting element 200*a* or the second color light-emitting element 200*b* is disposed inside the second virtual quadrangle 22.

For example, with reference to FIG. 29, multiple first color light-emitting elements 200*a* and multiple second color light-emitting elements 200*b* constitute a first virtual quadrangle 21, two first color light-emitting elements 200*a* are disposed at opposite corners of the first virtual quadrangle 21, and two second color light-emitting elements 200*b* are disposed at the other two opposite corners of the first virtual quadrangle 21. Additionally, the third color light-emitting element 200*c* is disposed in the center of the first virtual quadrangle 21.

In an embodiment, the multiple third color light-emitting elements 200*c* may form a second virtual quadrangle 22. In the second virtual quadrangle 22, the first color light-emitting element 200*a* is disposed in the center, or the second color light-emitting element 200*b* is disposed in the center. The overall arrangement is similar to the "diamond" pixel arrangement.

In an embodiment, the first color, the second color, and the third color each correspond to one of red, blue, and green. The preceding arrangement of the light-emitting element 200 can ensure a better rendering effect of the light-emitting element 200. Thus, the color display effect of the display panel 10 is ensured.

With continued reference to FIG. 2 to FIG. 12, the pixel driving circuit 100 includes a first type transistor and a second type transistor; the first type transistor includes a first active layer POLY, the second type transistor includes a second active layer IGZO, the first active layer POLY includes a silicon semiconductor, and the second active layer IGZO includes an oxide semiconductor; the first type transistor includes the driving transistor T3 and the data writing transistor T2; the pixel driving circuit 100 also includes an initialization transistor T5 and a threshold compensation transistor T4, and the second type transistor includes the initialization transistor T5 and/or the threshold compensation transistor T4.

For example, with reference to FIG. 2, the pixel driving circuit 10 at least includes a driving transistor T3, a data writing transistor T2, an initialization transistor T5, and a threshold compensation transistor T4. The active layers of the driving transistor T3 and the data writing transistor T2 may be the first active layer POLY. The active layers of the initialization transistor T5 and the threshold compensation transistor T4 may be the second active layer IGZO. In an embodiment, with reference to FIG. 2, the initialization transistor T5 and the threshold compensation transistor T4 may be (top and bottom) double-gate transistors. With reference to FIG. 9, the scan signal line S1 (that is, the scan signal line S11 in the figure) connected to the bottom gate of the initialization transistor T5 may be disposed in the second metal layer MC; the scan signal line S2 (that is, the scan signal line S21 in the figure) connected to the bottom gate of the threshold compensation transistor T4 may be disposed in the second metal layer MC. With reference to FIG. 11, the scan signal line S1 (that is, the scan signal line S12 in the figure) connected to the top and bottom gates of the initialization transistor T5 may be disposed in the first gate layer MG; the scan signal line S2 (that is, the scan signal line S22 in the figure) connected to the top gate of the threshold compensation transistor T4 may be disposed in the first gate layer MG. In an embodiment, the scan signal line S11 and the scan signal line S12 disposed in the second metal layer MC and the first gate layer MG are electrically connected to ensure that the control effect of the turn-on and turn-off of the initialization transistor T5 is more stable; the scan signal line S21 and the scan signal line S22 disposed in the second metal layer MC and the first gate layer MG are electrically connected to ensure that the control effect of the turn-on and turn-off of the threshold compensation transistor T4 is more stable.

It should be noted that another transistor also exists in the pixel driving circuit 100. The specific number and type of transistors in the pixel driving circuit 100 are not limited by embodiments of the present application.

Figure 32:
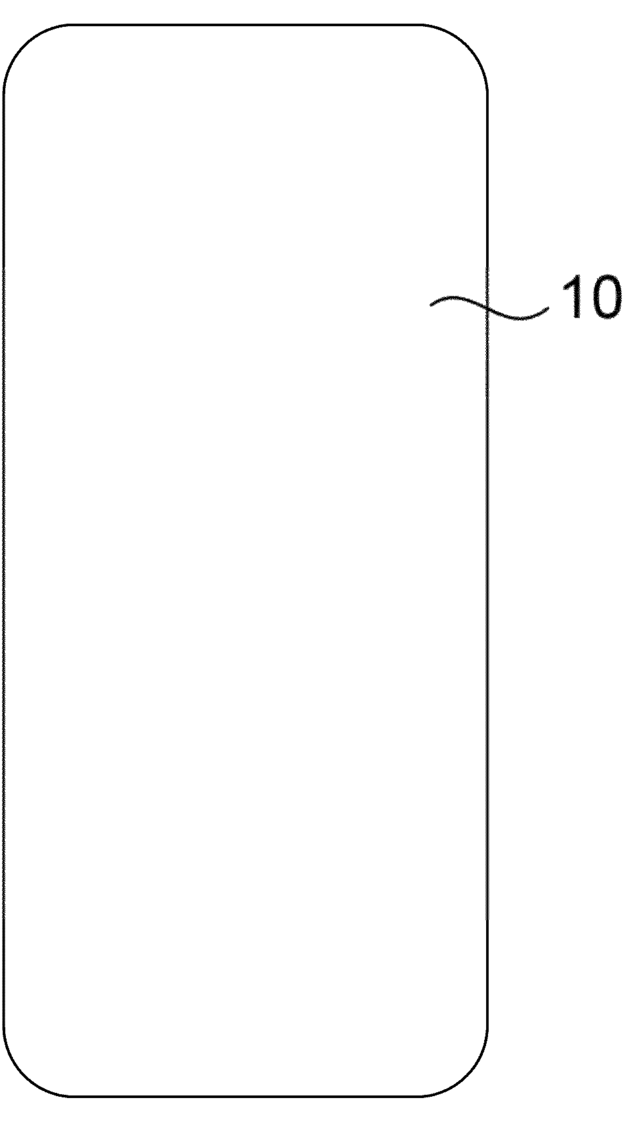
FIG. 32 is a diagram illustrating the structure of a display panel according to an embodiment of the present application.

Based on the same inventive concept, the embodiments of the present application also provide a display device. The display device includes any display panel provided in the preceding embodiments. FIG. 32 is a diagram illustrating the structure of a display panel according to an embodiment of the present application. As shown in FIG. 32, the display device 1 includes a display panel 10. Therefore, the display device also has the beneficial effects of the display panel described in the preceding embodiments, and for the same details, reference may be made to the description of the preceding display panel, and repetition will not be made herein.

The display device 1 provided in the embodiments of the present application may be the phone shown in FIG. 32 or may be any electronic product with a display function, including and not limited to televisions, laptops, desktop displays, tablet computers, digital cameras, smart bracelets, smart glasses, in-vehicle displays, industry-controlling equipment, medical displays, and touch interactive terminals, which are not specifically limited in embodiments of the present application.

It is to be noted that the above are only preferred embodiments of the present application and the principles used therein. It will be understood by those skilled in the art that the present application is not limited to the specific embodiments described herein. Those skilled in the art can make various apparent variations, adaptions, and substitutions without departing from the scope of the present application. Therefore, while the present application has been described in detail via the preceding embodiments, the present application is not limited to the preceding embodiments and may include more other equivalent embodiments without departing from the concept of the present application. The scope of the present application is determined by the scope of the appended claims.

What is claimed is:

1. A display panel, comprising a plurality of pixel driving circuits and a plurality of signal lines, wherein a pixel driving circuit of the plurality of pixel driving circuits comprises a driving transistor and a data writing transistor, the plurality of signal lines comprise a plurality of data signal lines extending in a first direction and arranged in a second direction, the data writing transistor is coupled between a data signal line of the plurality of data signal lines and a gate of the driving transistor, and the first direction and the second direction intersect; the plurality of signal lines further comprise a plurality of power signal lines, a power signal line of the plurality of power signal lines comprises a body portion and a connection portion, the connection portion connects two adjacent body portions, and in an arrangement direction of the plurality of power signal lines, a width of the body portion is greater than a width of the connection portion; and the display panel further comprises a substrate and a plurality of light-emitting elements, a light-emitting element of the plurality of light-emitting elements comprises a first light-emitting element, the first light-emitting element comprises a first anode, and in a direction perpendicular to a plane in which the substrate is located, the first anode at least partially overlaps the data signal line, and the first anode at least partially overlaps the body portion.

2. The display panel of claim 1, wherein a width of the data signal line is W1 in the second direction; and in the arrangement direction of the plurality of power signal lines, the width of the body portion is W2;

wherein W2≥1.5*W1.

3. The display panel of claim 1, comprising a display region and a non-display region at least partially surrounding the display region; wherein the non-display region comprises a fan-out region on a side of the display region in the first direction, the display region comprises a first display region and a second display region, and the second display region is disposed on at least one side of the first display region in the second direction;

the fan-out region comprises a plurality of fan-out wires, and each of the first display region and the second display region comprises the plurality of data signal lines;

the data signal line is connected to a fan-out wire of the plurality of fan-out wires, wherein a data signal line of the second display region is connected to the fan-out wire by a connection wire;

the connection wire is disposed in the display region and comprises a first connection line segment extending in the first direction and a second connection line segment extending in the second direction; and in the direction perpendicular to the plane in which substrate is located, at least one first anode overlaps at least one connection wire.

4. The display panel of claim 3, wherein in the direction perpendicular to the plane in which substrate is located, the at least one first anode overlaps a first connection line segment and a second connection line segment of a same connection wire.

5. The display panel of claim 3, wherein in the direction perpendicular to the plane in which substrate is located, the at least one first anode overlaps two first connection line segments.

6. The display panel of claim 3, wherein the display panel further comprises an auxiliary connection wire;

the auxiliary connection wire comprises at least one of a first auxiliary connection wire extending in the first direction or a second auxiliary connection wire extending in the second direction; and the first auxiliary connection wire is disposed in a same layer as the first connection line segment and is insulated from the first connection line segment and the second connection line segment; and the second auxiliary connection wire is disposed in a same layer as the second connection line segment and is insulated from the first connection line segment and the second connection line segment.

7. The display panel of claim 6, wherein a gap exists between the first auxiliary connection wire and the first connection line segment, and a gap exists between the second auxiliary connection wire and the second connection line segment; and in the direction perpendicular to the plane in which substrate is located, at least one first anode overlaps the gap.

8. The display panel of claim 7, wherein a first gap exists between the first auxiliary connection wire and the first connection line segment, and a second gap exists between the second auxiliary connection wire and the second connection line segment; and in the direction perpendicular to the plane in which substrate is located, at least one first anode overlaps the first gap.

9. The display panel of claim 7, wherein a first gap exists between the first auxiliary connection wire and the first connection line segment, and a second gap exists between the second auxiliary connection wire and the second connection line segment;

the display panel further comprises a second light-emitting element, a color of light emitted by the second light-emitting element is different from a color of light emitted by the first light-emitting element, and the second light-emitting element comprises a second anode; and in the direction perpendicular to the plane in which substrate is located, at least one of the following is satisfied: at least one first anode overlaps the second gap, or at least one second anode overlaps the second gap.

10. The display panel of claim 6, wherein the non-display region further comprises a power bus; and the auxiliary connection wire is electrically connected to the power bus.

11. The display panel of claim 3, wherein in the direction perpendicular to the plane in which substrate is located, the first connection line segment and the data signal line are disposed in a same layer, or the first connection line segment is disposed on a side of the data signal line away from the substrate; and the second connection line segment and the first connection line segment are disposed in a same layer or in two adjacent metal layers.

12. The display panel of claim 1, wherein the plurality of power signal lines comprise a plurality of first power signal lines extending in the first direction arranged in the second direction;

a first power signal line of the plurality of first power signal lines comprises a first body portion and a first connection portion which are arranged in the first direction, and a width of the first body portion in the second direction is greater than a width of the first connection portion in the second direction; and in the direction perpendicular to the plane in which substrate is located, the first anode at least partially overlaps the first body portion.

13. The display panel of claim 12, wherein in the direction perpendicular to the plane in which substrate is located, the first anode at least partially overlaps the first connection portion.

14. The display panel of claim 12, wherein the first body portion comprises a main body portion and a body transition portion, the body transition portion connects the main body portion and the first connection portion, and in the second direction, a width of the body transition portion is less than a width of the main body portion and greater than a width of the first connection portion; and in the direction perpendicular to the plane in which substrate is located, the first anode overlaps the body transition portion.

15. The display panel of claim 14, wherein in the second direction, a width of the data signal line is W1, the width of the main body portion is W21, the width of the body transition portion is W22, and the width of the first connection portion is W3;

wherein $W21 \geq 4*W1$, $W22 \geq 1.5*W1$, and $W3 < 1.5W1$.

16. The display panel of claim 14, wherein the light-emitting element further comprises a second light-emitting element, a color of light emitted by the second light-emitting element is different from a color of light emitted by the first light-emitting element; and the second light-emitting element comprises a second anode; and in the direction perpendicular to the plane in which the substrate is located, the second anode overlaps the main body portion.

17. The display panel of claim 14, wherein the first power signal line and the data signal line are disposed in a same layer;

the pixel driving circuit further comprises a first light emission control transistor coupled between the power signal line and a first electrode of the driving transistor;

the plurality of pixel driving circuits comprise a first pixel driving circuit and a second pixel driving circuit which are arranged in the second direction, and a first light emission control transistor of the first pixel driving circuit and a first light emission control transistor of the second pixel driving circuit are electrically connected to the power signal line through a same via hole;

the plurality of data signal lines comprise a first data signal line and a second data signal line, the first data signal line is electrically connected to a data writing transistor in the first pixel driving circuit, and the second data signal line is electrically connected to a data writing transistor in the second pixel driving circuit; and in the second direction, the first data signal line and the second data signal line are disposed between two adjacent first power signal lines.

18. The display panel of claim 14, wherein the plurality of power signal lines comprise a plurality of second power signal lines extending in the second direction and arranged in the first direction;

a second power signal line of the plurality of second power signal lines comprises a second body portion and a second connection portion which are arranged in the second direction, and a width of the second body portion in the first direction is greater than a width of the second connection portion in the first direction; and in the direction perpendicular to the plane in which substrate is located, the first anode overlaps the second body portion.

19. The display panel of claim 18, wherein the second power signal line is disposed between a layer in which the data signal line is located and a layer in which the first anode is located; and in the direction perpendicular to the plane in which substrate is located, the second body portion overlaps the data signal line.

20. The display panel of claim 12, wherein the plurality of power signal lines further comprise a plurality of second power signal lines extending in the second direction and arranged in the first direction;

a second power signal line of the plurality of second power signal lines comprises a second body portion and a second connection portion which are arranged in the second direction, and a width of the second body portion in the first direction is greater than a width of the second connection portion in the first direction;

the light-emitting element further comprises a second light-emitting element, a color of light emitted by the second light-emitting element is different from a color of light emitted by the first light-emitting element; and the second light-emitting element comprises a second anode; and in the direction perpendicular to the plane in which substrate is located, the second anode overlaps the second body portion.

21. The display panel of claim 20, wherein the second power signal line is disposed on a side of the data signal line close to the substrate.

22. The display panel of claim 12, wherein the first power signal line and the data signal line are disposed in a same layer;

the pixel driving circuit further comprises a first light emission control transistor coupled between the power signal line and a first electrode of the driving transistor;

the pixel driving circuit comprises a first pixel driving circuit and a second pixel driving circuit which are arranged in the second direction, and a first light emission control transistor of the first pixel driving circuit and a first light emission control transistor of the second pixel driving circuit are electrically connected to the power signal line through a same via hole;

the data signal line comprises a first data signal line and a second data signal line, the first data signal line is electrically connected to a data writing transistor in the first pixel driving circuit, and the second data signal line is electrically connected to a data writing transistor in the second pixel driving circuit; and in the second direction, the first power signal line is disposed between the first data signal line and the second data signal line.

23. The display panel of claim 1, further comprising an organic insulation layer, a fourth metal layer, and a fifth metal layer that are disposed between a layer in which the pixel driving circuit is located and a layer in which the light-emitting element is located, wherein the fourth metal layer is disposed on a side of the organic insulation layer away from the pixel driving circuit, and the fifth metal layer is disposed on a side of the fourth metal layer away from the pixel driving circuit;

the data signal line is disposed in the fourth metal layer or the fifth metal layer; and the power signal line is disposed in the fourth metal layer or the fifth metal layer.

24. The display panel of claim 1, wherein the pixel driving circuit further comprises an initialization transistor, the plurality of signal lines further comprise an initialization signal line, and the initialization transistor is coupled between the initialization signal line and the gate of the driving transistor; and the initialization signal line comprises a first initialization signal line extending in the second direction and arranged in the first direction and a second initialization signal line extending in the first direction and arranged in the second direction, and the first initialization signal line and the second initialization signal line are disposed in different layers and electrically connected.

25. The display panel of claim 24, comprising a first metal layer, a second metal layer, and a third metal layer that are disposed on a side of the substrate, wherein the second metal layer is disposed on a side of the first metal layer away from the substrate, the third metal layer is disposed on a side of the second metal layer away from the substrate, and the data signal line is disposed on a side of the third metal layer away from the substrate;

the gate of the driving transistor is disposed in the first metal layer;

the first initialization signal line is disposed in the second metal layer; and the second initialization signal line is disposed in the third metal layer.

26. The display panel of claim 1, wherein the pixel driving circuit further comprises a reset transistor, the plurality of signal lines further comprise a reset signal line, and the reset transistor is coupled between the reset signal line and the light-emitting element; and the reset signal line comprises a first reset signal line extending in the second direction and arranged in the first direction and a second reset signal line segment extending in the first direction and arranged in the second direction, and the first reset signal line and the second reset signal line segment are disposed in different layers and electrically connected.

27. The display panel of claim 1, wherein the pixel driving circuit further comprises an initialization transistor and a reset transistor, the plurality of signal lines further comprise an initialization signal line and a reset signal line, the initialization transistor is coupled between the initialization signal line and the gate of the driving transistor, and the reset transistor is coupled between the reset signal line and the light-emitting element; and the initialization signal line comprises a first initialization signal line extending in the second direction and arranged in the first direction, the reset signal line comprises a first reset signal line extending in the second direction and arranged in the first direction, and in the first direction, the first initialization signal line and the first reset signal lines are arranged alternately.

28. The display panel of claim 1, wherein the pixel driving circuit further comprises a bias transistor, the plurality of signal lines further comprise a bias voltage signal line, and the bias transistor is coupled between the bias voltage signal line and the driving transistor; and the bias voltage signal line comprises a first bias signal line extending in the second direction and arranged in the first direction and a second bias voltage signal line segment extending in the first direction and arranged in the second direction, and the first bias voltage signal line and the second bias voltage signal line segment are disposed in different layers and electrically connected.

29. The display panel of claim 1, wherein the pixel driving circuit further comprises an initialization transistor, a reset transistor, and a bias transistor, and the plurality of signal lines further comprise an initialization signal line, a reset signal line, and a bias voltage signal line; the initialization transistor is coupled between the initialization signal line and the gate of the driving transistor; the reset transistor is coupled between the reset signal line and the light-emitting element; and the bias transistor is coupled between the bias voltage signal line and the driving transistor;

the initialization signal line comprises a second initialization signal line extending in the first direction and arranged in the second direction, the reset signal line comprises a second reset signal line segment extending in the first direction and arranged in the second direction, and the bias voltage signal line comprises a second bias voltage signal line segment extending in the first direction and arranged in the second direction;

the second initialization signal line, the second reset signal line segment, and the second bias voltage signal line segment are disposed in a same layer; and in the first direction, the second reset signal line segment and the second bias voltage signal line segment are arranged alternately in sequence; and in the second direction, the second reset signal line segment and the second bias voltage signal line segment are arranged alternately in sequence, and the second initialization signal line is disposed between the second reset signal line segment and the second bias voltage signal line segment.

30. The display panel of claim 1, wherein the first light-emitting element comprises a first color light-emitting element and a second color light-emitting element;

the light-emitting element further comprises a second light-emitting element, the second light-emitting element comprises a third color light-emitting element, and each of the first color light-emitting element, the second color light-emitting element, and the third color light-emitting element are one of a red light-emitting element, a blue light-emitting element, or a green light-emitting element and the first color light-emitting element, the second color light-emitting element, and the third color light-emitting element are different in colors;

a plurality of first color light-emitting elements and a plurality of second color light-emitting elements constitute a first virtual quadrangle, the first color light-emitting element is disposed at a first vertex of the first virtual quadrangle, a center of the second color light-emitting element is disposed at a second vertex of the first virtual quadrangle, the first vertex and the second vertex are alternately arranged and spaced apart, and the third color light-emitting element is disposed inside the first virtual quadrangle; and a plurality of third color light-emitting elements constitute a second virtual quadrangle, centers of the plurality of third color light-emitting elements are disposed at vertices of the second virtual quadrangle respectively, and the first color light-emitting element or the second color light-emitting element is disposed inside the second virtual quadrangle.

31. The display panel of claim 1, wherein the pixel driving circuit comprises a first type transistor and a second type transistor, the first type transistor comprises a first active layer, the second type transistor comprises a second active layer, the first active layer comprises a silicon semiconductor, and the second active layer comprises an oxide semiconductor;

the first type transistor comprises the driving transistor and the data writing transistor; and the pixel driving circuit further comprises an initialization transistor and a threshold compensation transistor, and the second type transistor comprises at least one of the initialization transistor or the threshold compensation transistor.

32. A display device, comprising a display panel, wherein the display panel comprises a plurality of pixel driving circuits and a plurality of signal lines, wherein a pixel driving circuit of the plurality of pixel driving circuits comprises a driving transistor and a data writing transistor, the plurality of signal lines comprise a plurality of data signal lines extending in a first direction and arranged in a second direction, the data writing transistor is coupled between a data signal line of the plurality of data signal lines and a gate of the driving transistor, and the first direction and the second direction intersect; the plurality of signal lines further comprise a plurality of power signal lines, a power signal line of the plurality of power signal lines comprises a body portion and a connection portion, the connection portion connects two adjacent body portions, and in an arrangement direction of the plurality of power signal lines, a width of the body portion is greater than a width of the connection portion; and the display panel further comprises a substrate and a plurality of light-emitting elements, a light-emitting element of the plurality of light-emitting elements comprises a first light-emitting element, the first light-emitting element comprises a first anode, and in a direction perpendicular to a plane in which the substrate is located, the first anode at least partially overlaps the data signal line, and the first anode at least partially overlaps the body portion.

* * * * *